(12) United States Patent
Takahashi et al.

(10) Patent No.: US 6,492,677 B2
(45) Date of Patent: Dec. 10, 2002

(54) NON-VOLATILE SEMICONDUCTOR MEMORY DEVICE AND FABRICATION PROCESS THEREOF

(75) Inventors: Koji Takahashi, Kawasaki (JP); Hiroshi Hashimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/963,632

(22) Filed: Sep. 27, 2001

(65) Prior Publication Data

US 2002/0060365 A1 May 23, 2002

(30) Foreign Application Priority Data

Nov. 17, 2000 (JP) .......................................... 2000-351444

(51) Int. Cl.$^7$ ............................................ H01L 29/788
(52) U.S. Cl. ........................ 257/316; 438/258; 257/321
(58) Field of Search ................................ 257/316–323; 438/257–267

(56) References Cited

U.S. PATENT DOCUMENTS

| | | | | |
|---|---|---|---|---|
| 5,994,733 A | * | 11/1999 | Nishioka et al. | 257/315 |
| 6,248,628 B1 | * | 6/2001 | Halliyal et al. | 257/314 |
| 6,281,544 B1 | * | 8/2001 | Hong | 257/314 |
| 6,351,008 B1 | * | 2/2002 | Patelmo et al. | 257/315 |
| 6,392,270 B1 | * | 5/2002 | Tanimoto et al. | 257/316 |

\* cited by examiner

Primary Examiner—Richard Booth
(74) Attorney, Agent, or Firm—Armstrong, Westerman & Hattori LLP

(57) ABSTRACT

A fabrication process of a non-volatile semiconductor memory device includes the step of forming a plurality of openings in a device isolation structure defining an active region in a memory cell region such that each opening exposes the substrate surface extends from the active region to the outside thereof. Further, silicide regions are formed in the openings by a self-aligned process such that the silicide regions are mutually separated. Further a contact hole is formed in an interlayer insulation film in correspondence to the silicide regions.

11 Claims, 48 Drawing Sheets

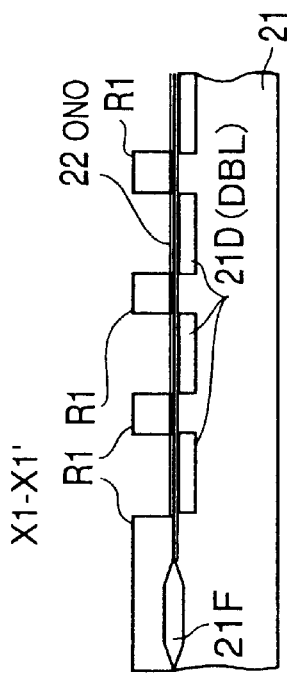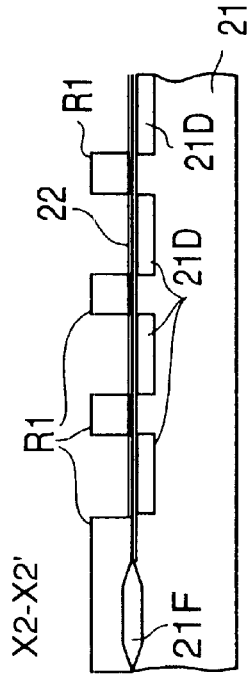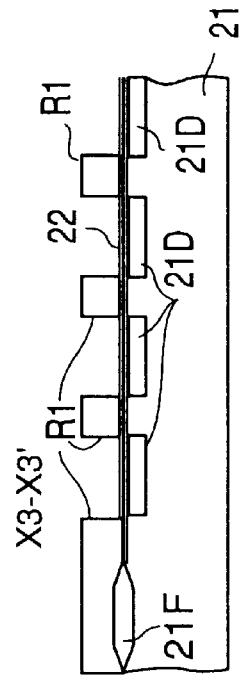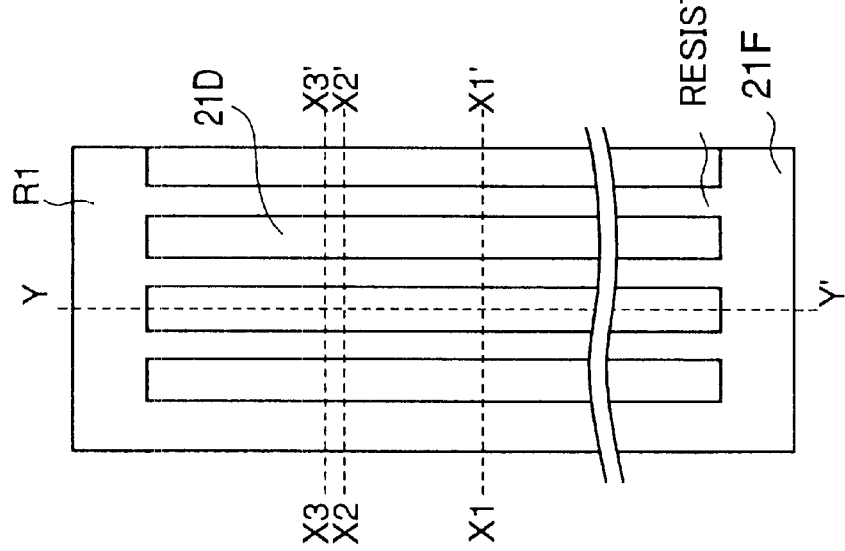
FIG.5A RELATED ART
FIG.5B RELATED ART
FIG.5C RELATED ART
FIG.5D RELATED ART PERIPHERAL Pch Tr PERIPHERAL Nch Tr PERIPHERAL Pch Tr PERIPHERAL Nch Tr

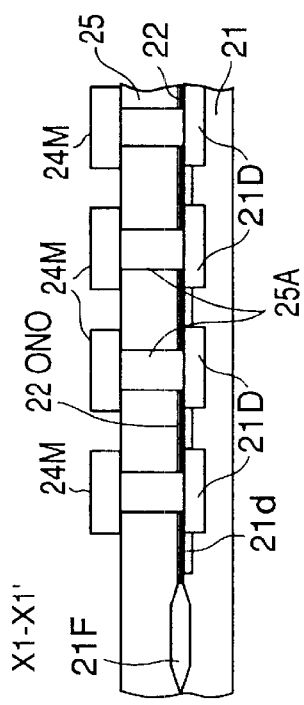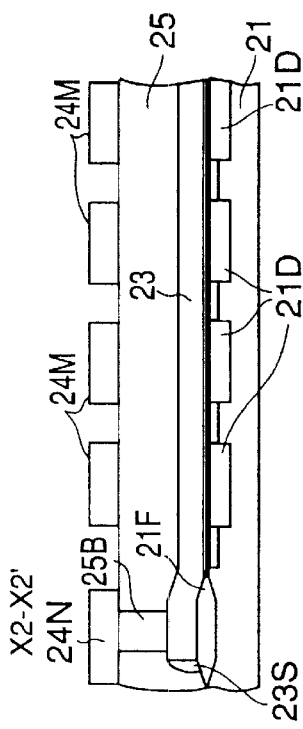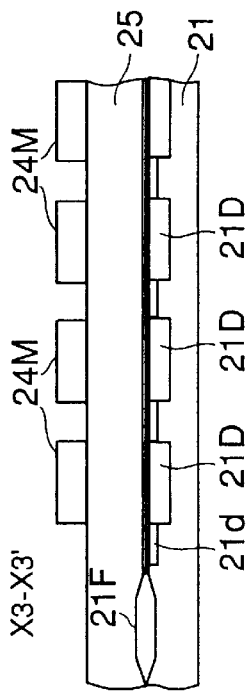
FIG.9B RELATED ART
FIG.9C RELATED ART
FIG.9D RELATED ART
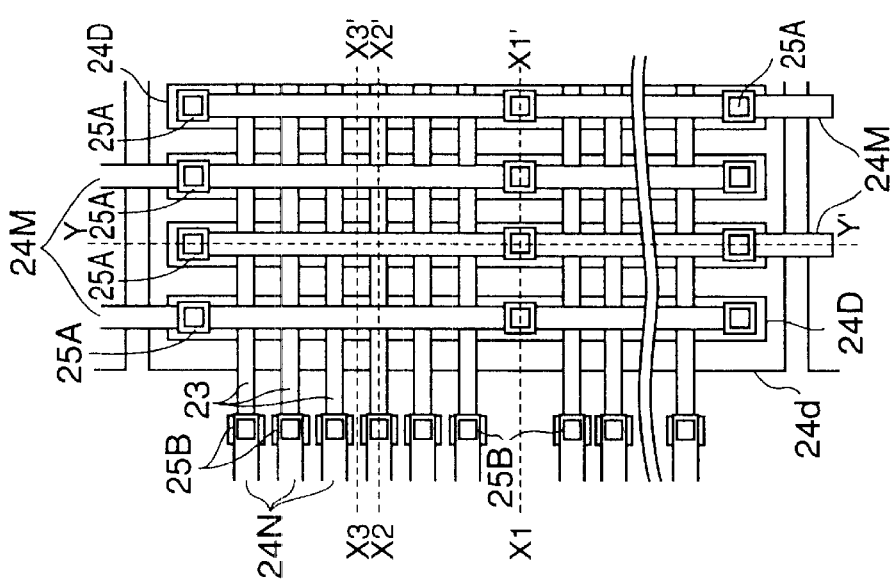
FIG.9A RELATED ART PERIPHERAL Pch Tr PERIPHERAL Nch Tr

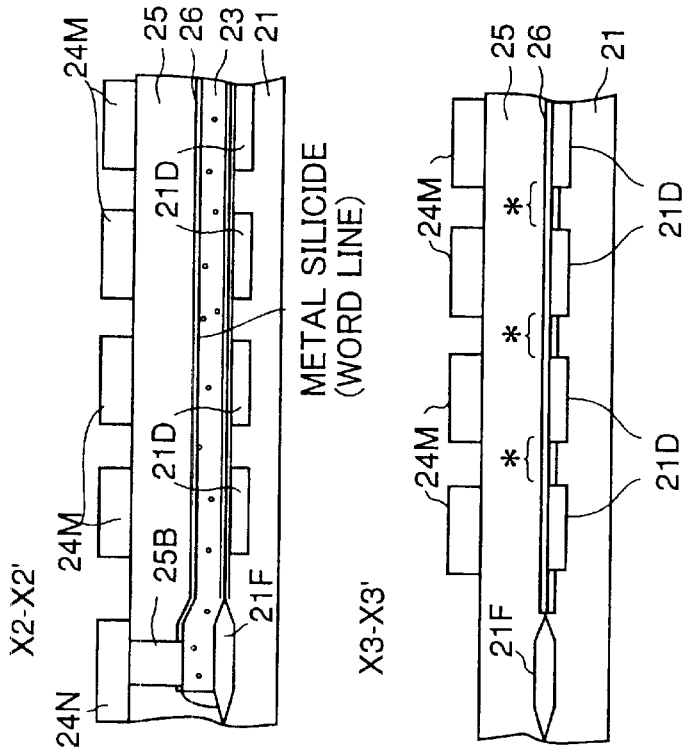
FIG.11B
FIG.11C
FIG.11D
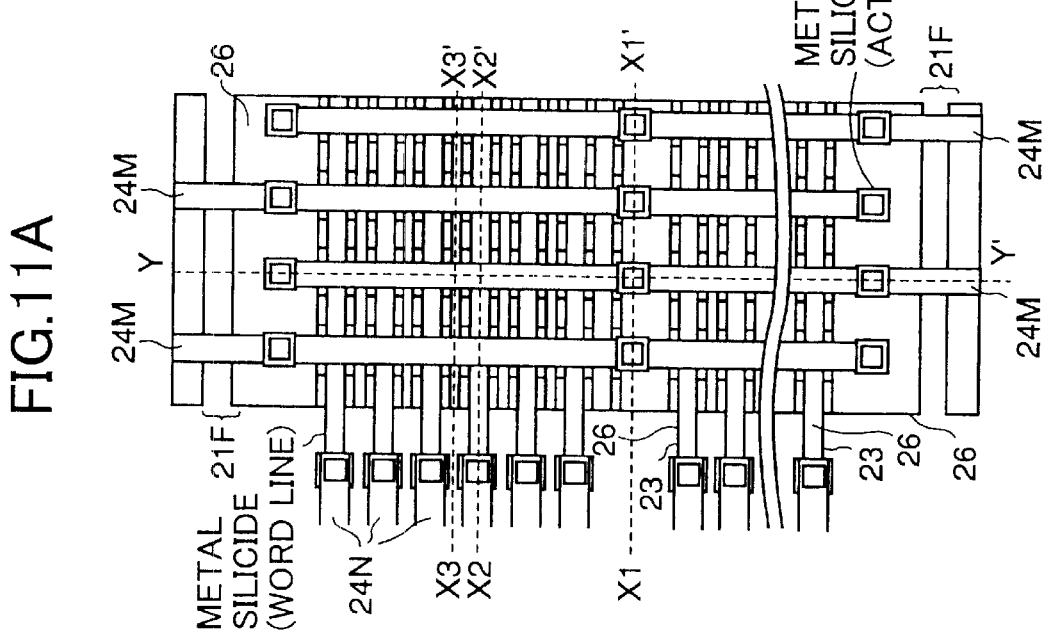
FIG.11A

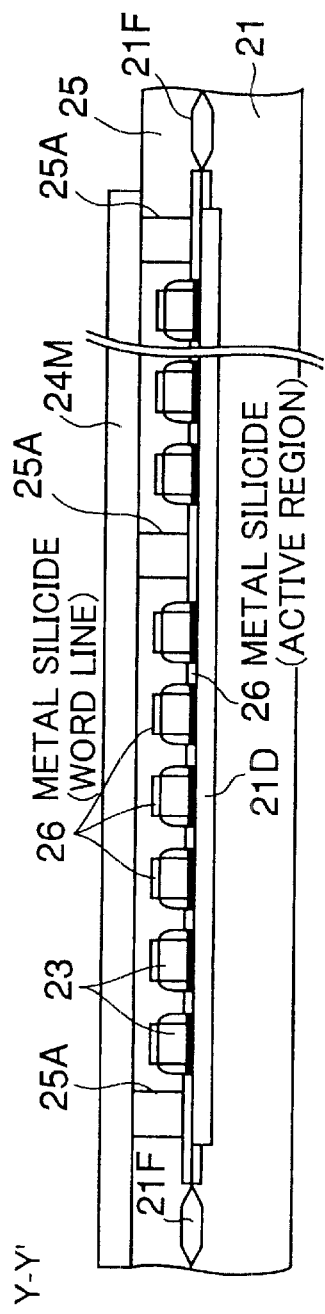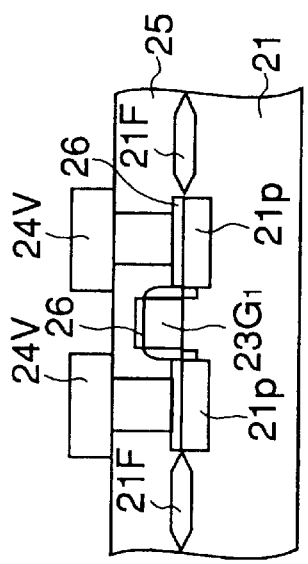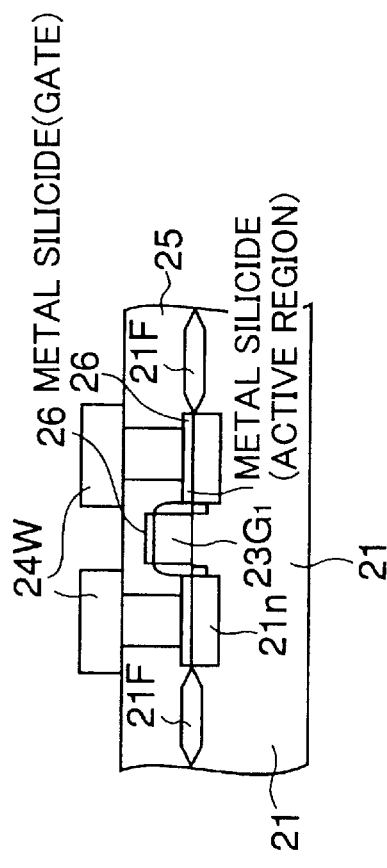

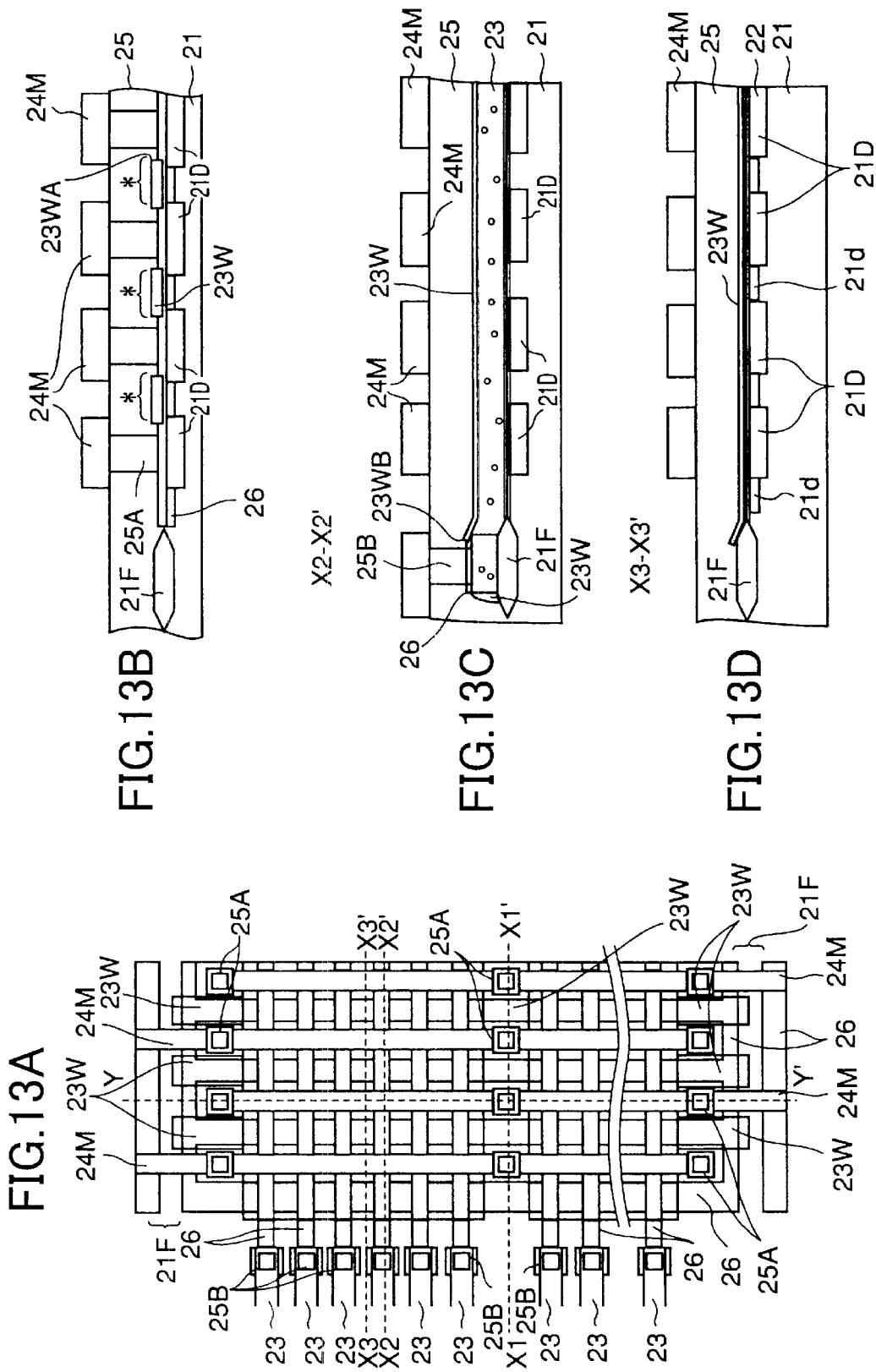

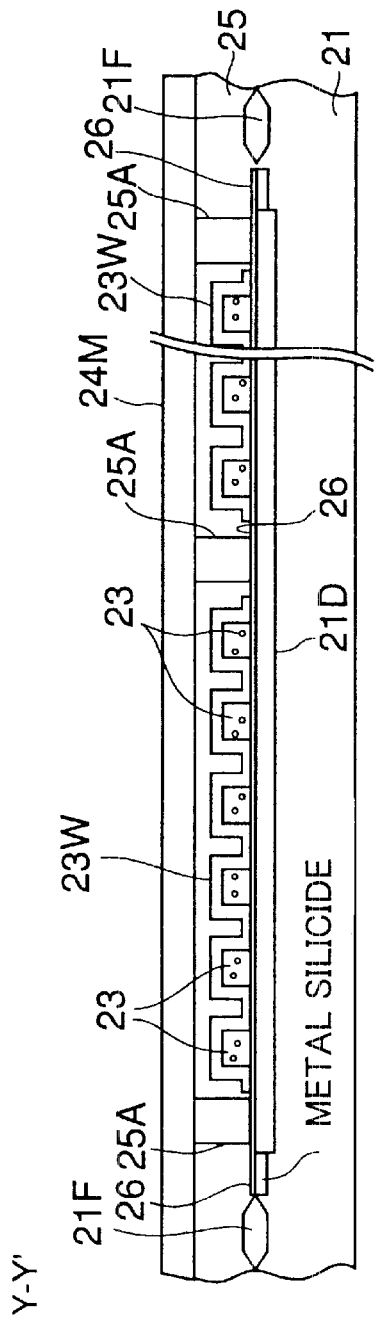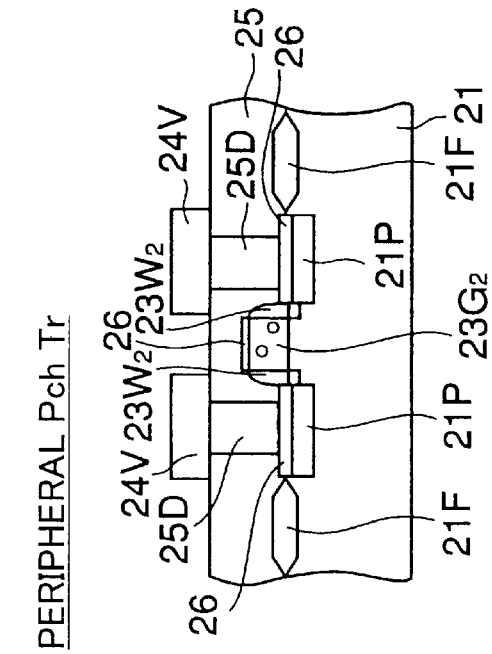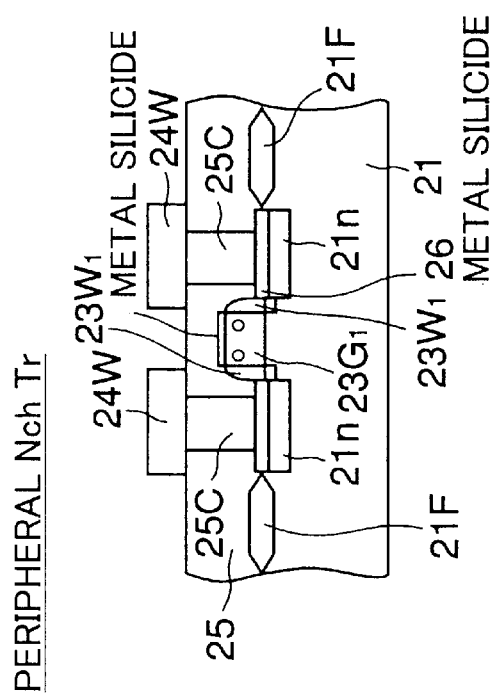

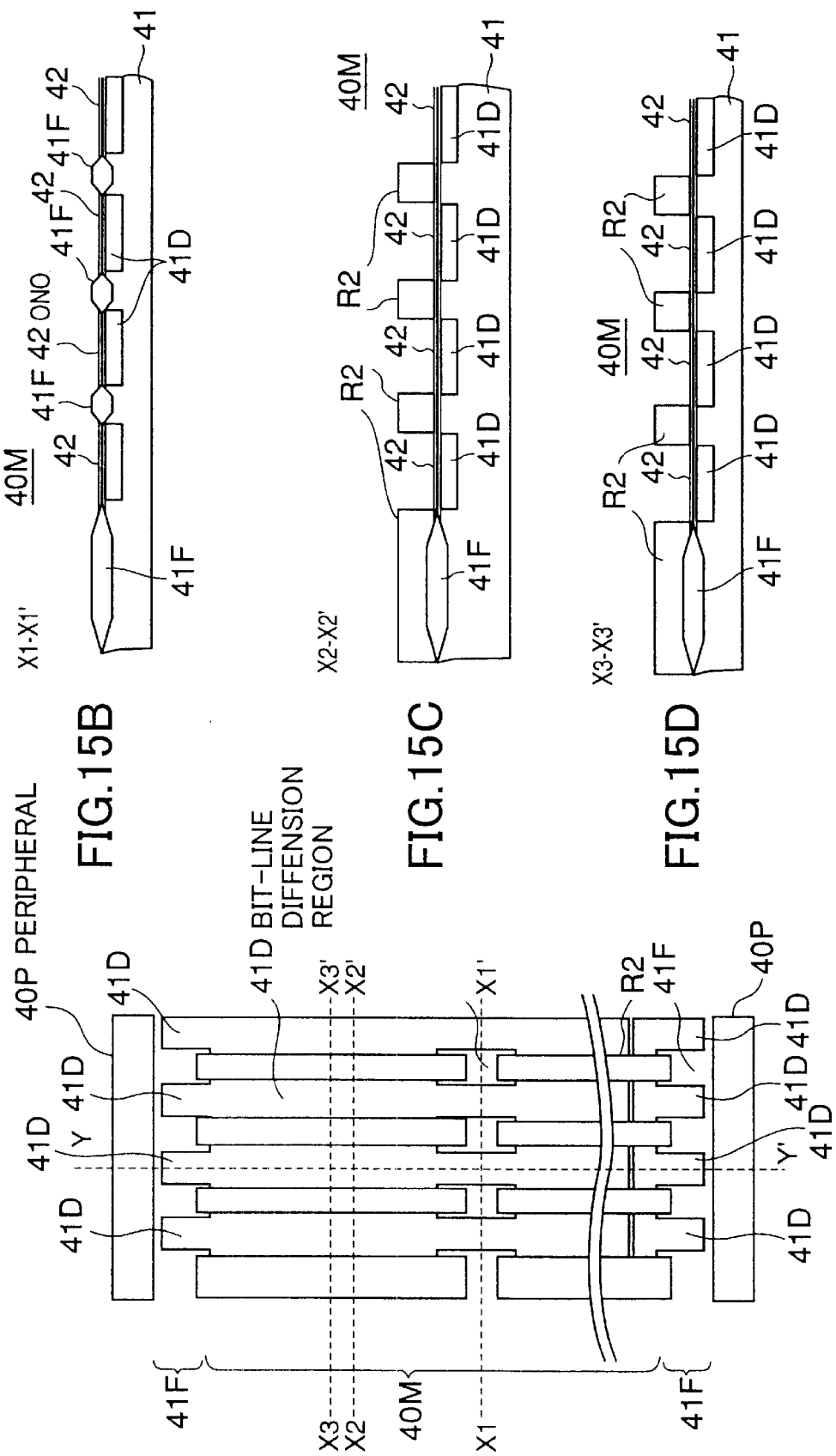

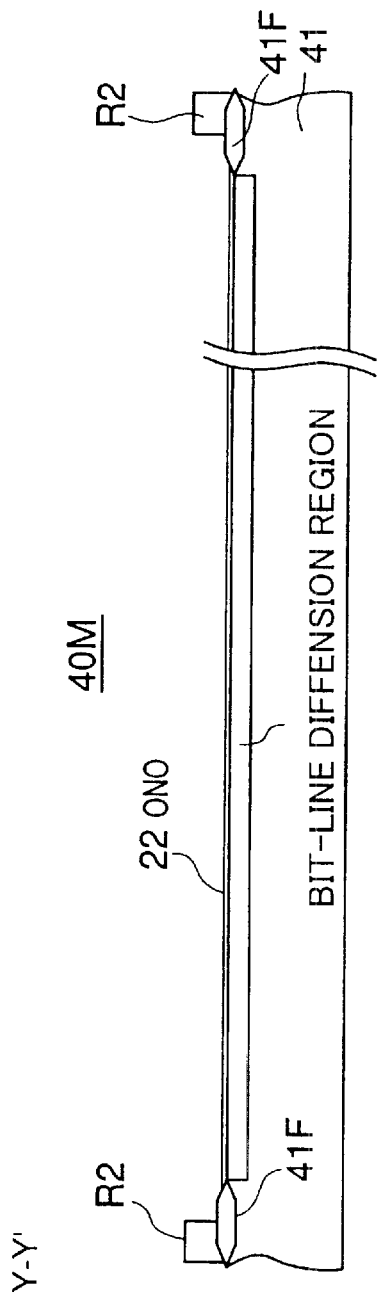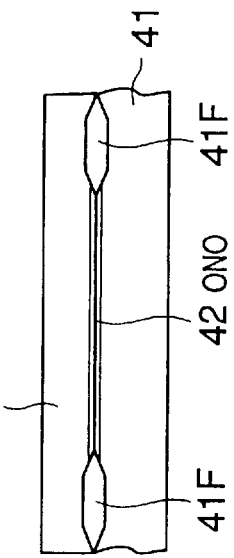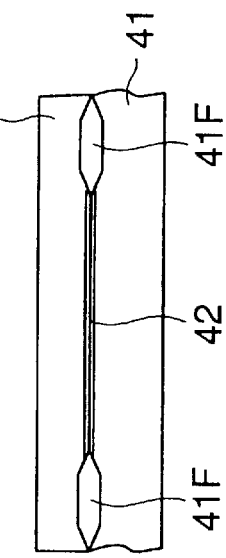

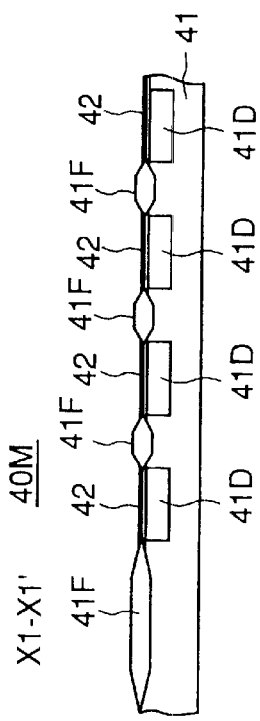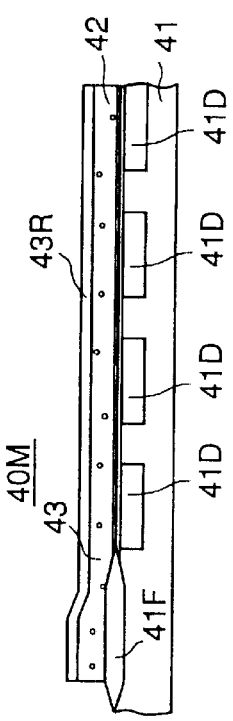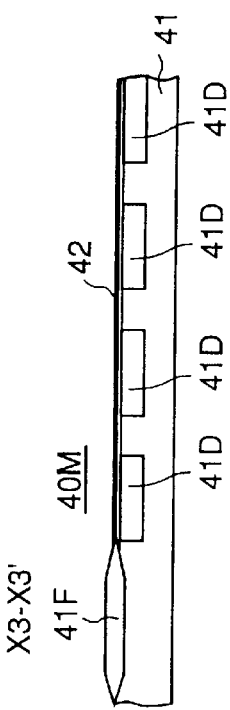
FIG.17B
FIG.17C
FIG.17D
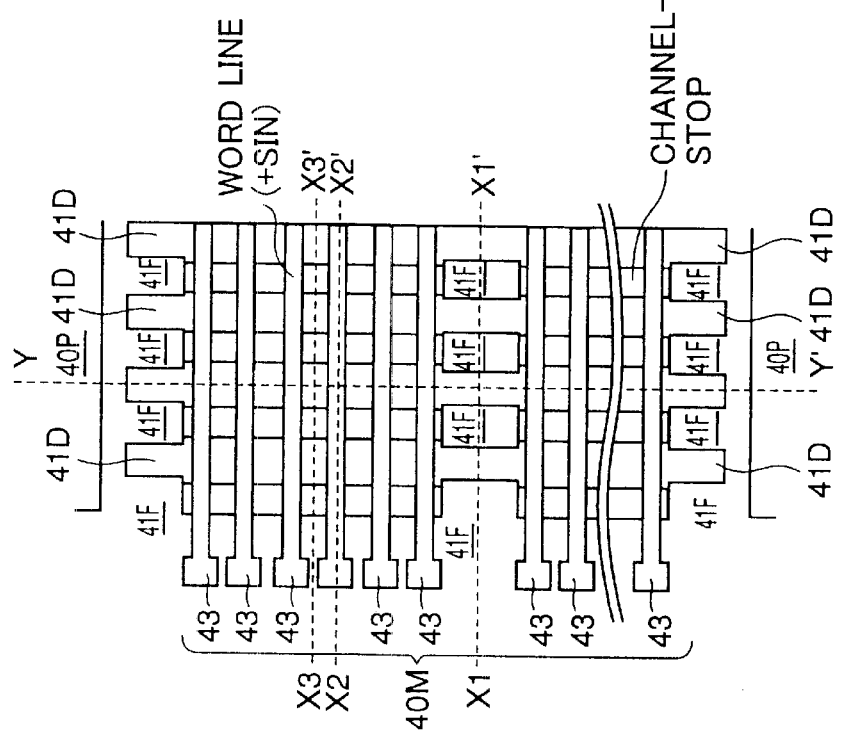
FIG.17A

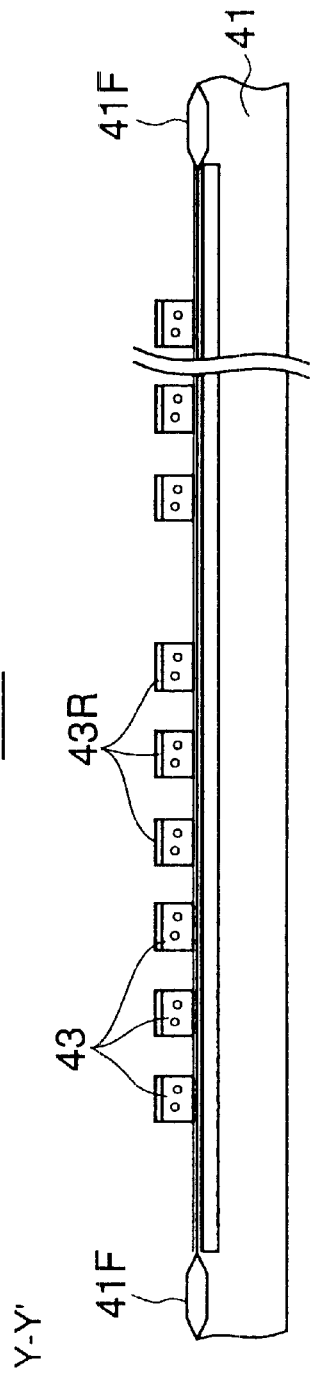
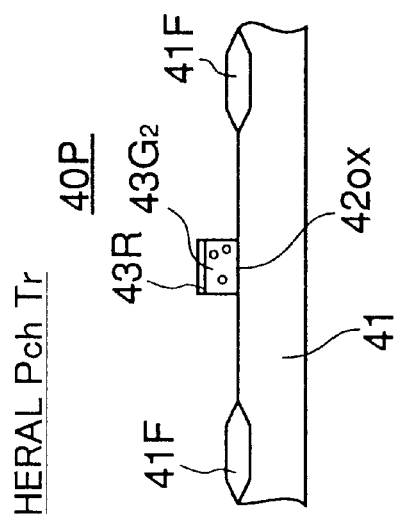
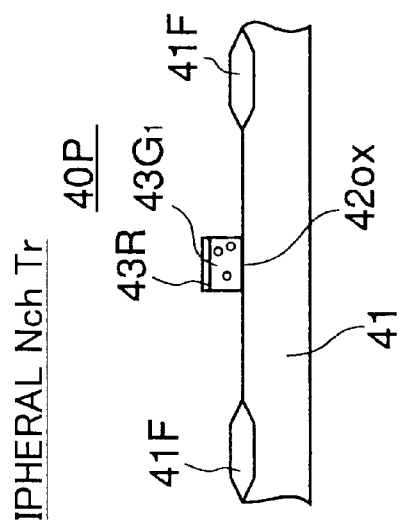

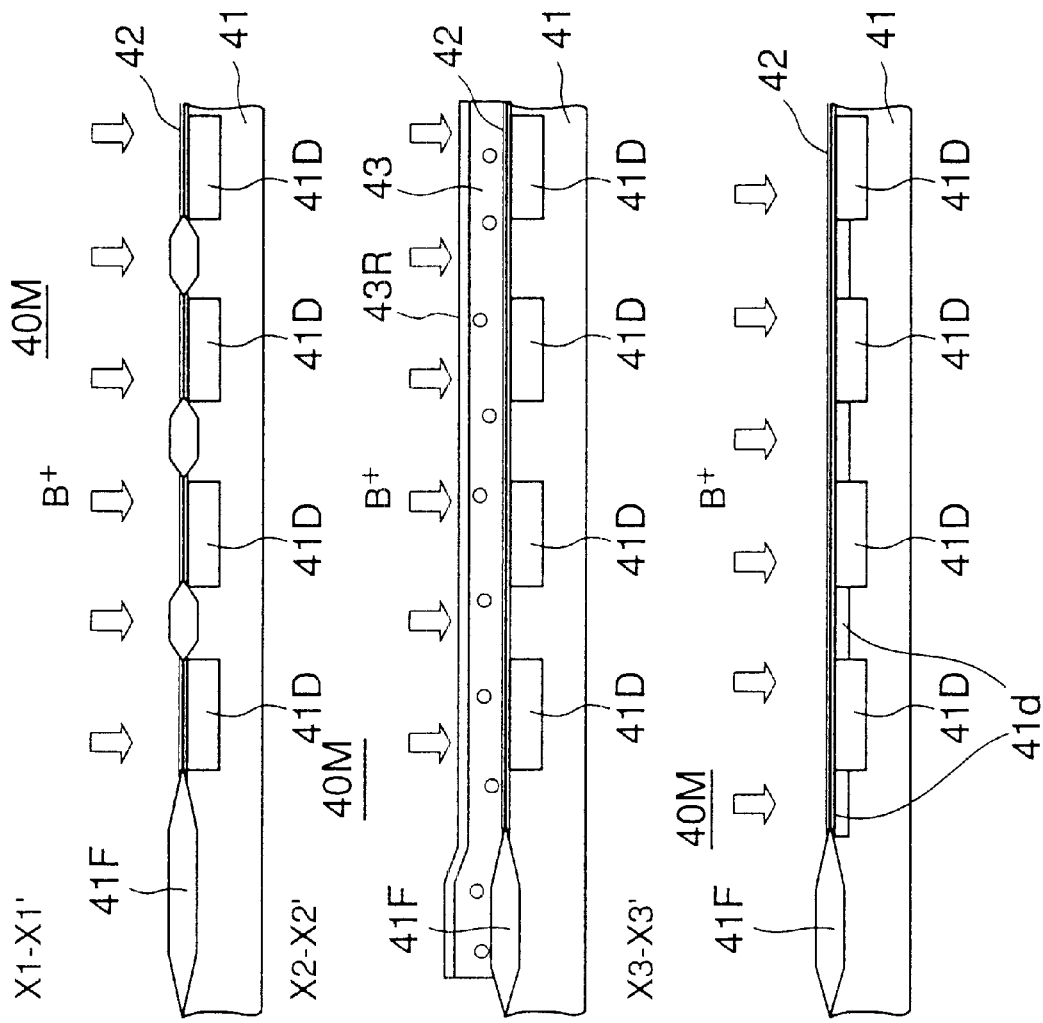

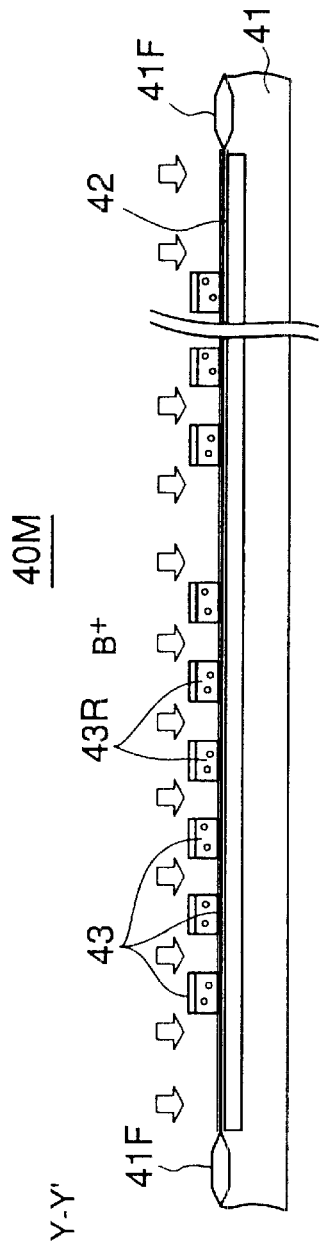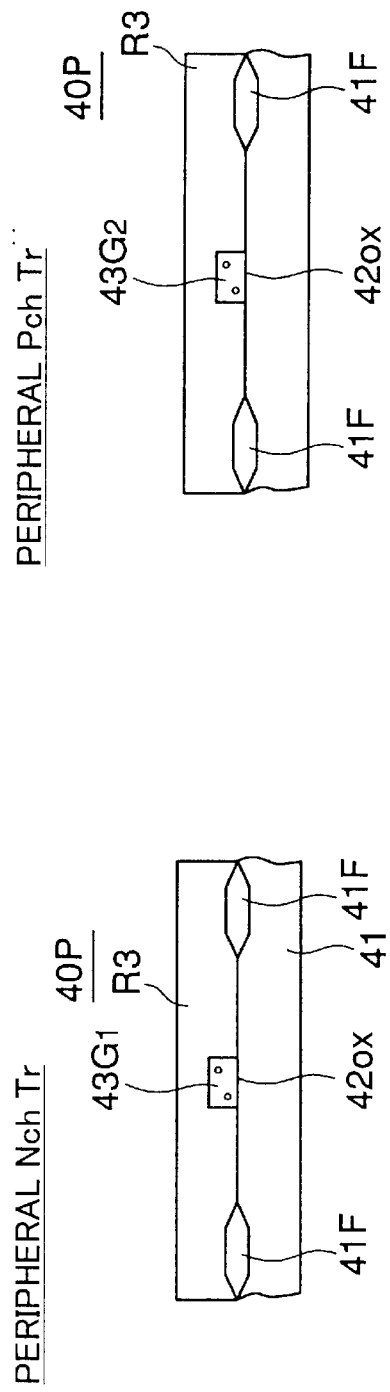

PERIPHERAL Pch Tr

PERIPHERAL Nch Tr

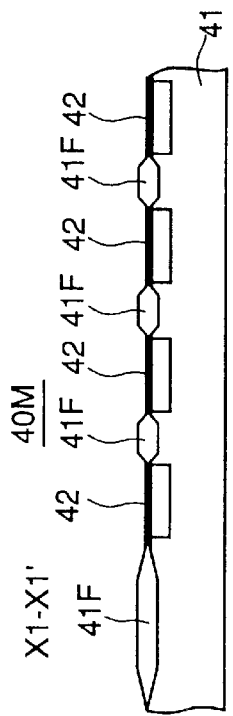
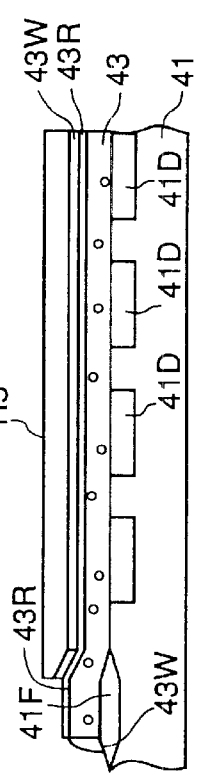
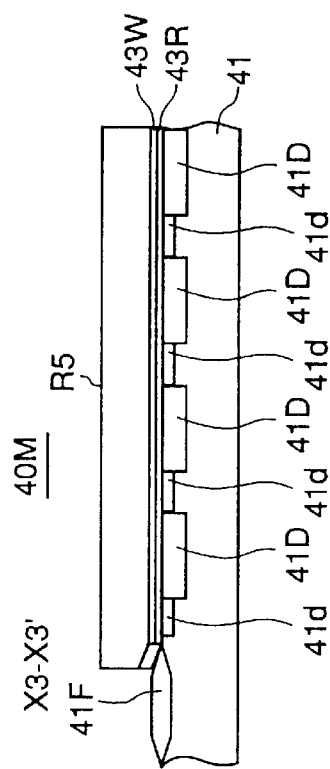
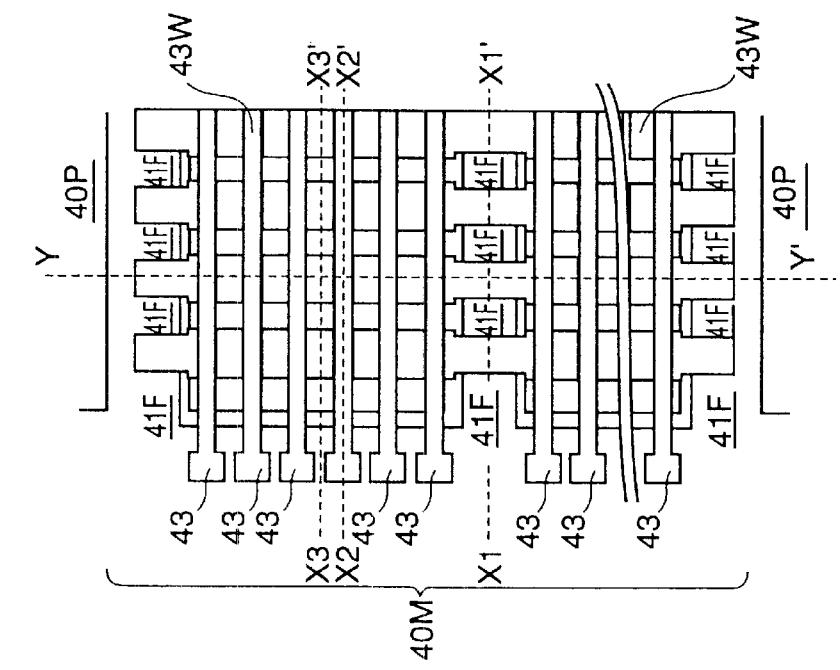
FIG.23B
FIG.23C
FIG.23D
FIG.23A

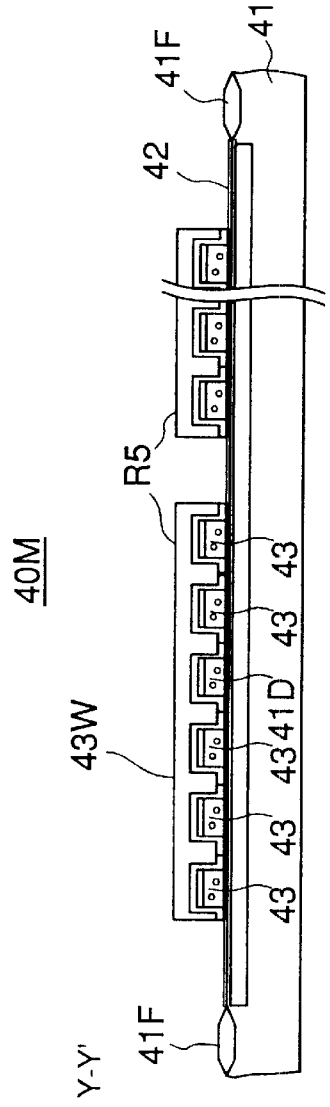

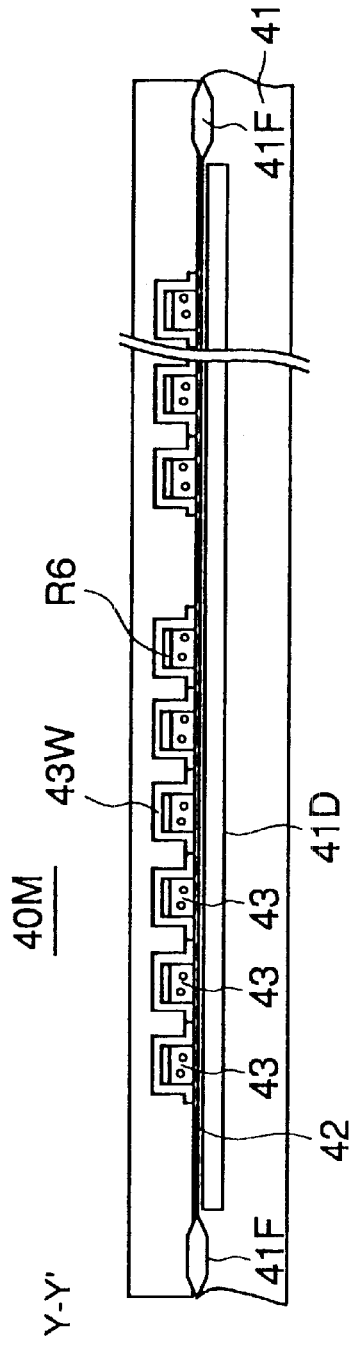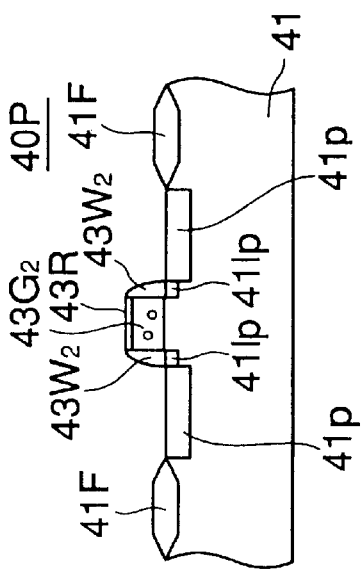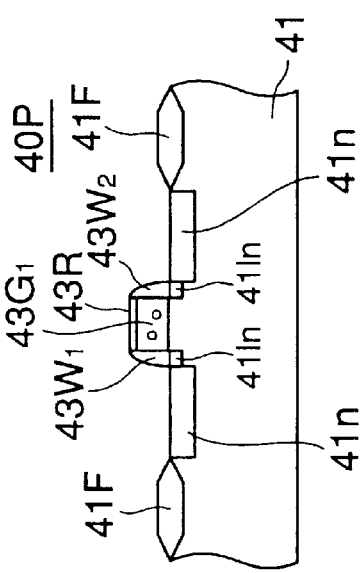

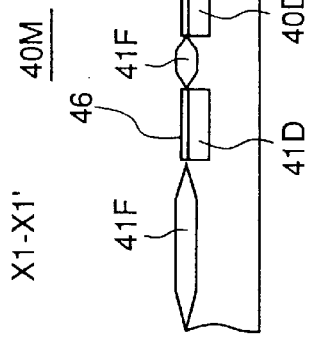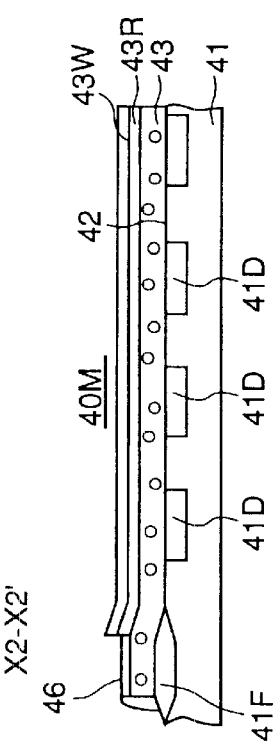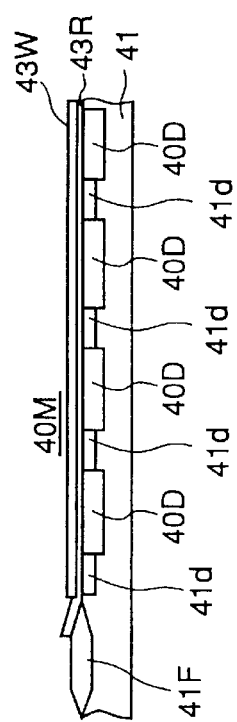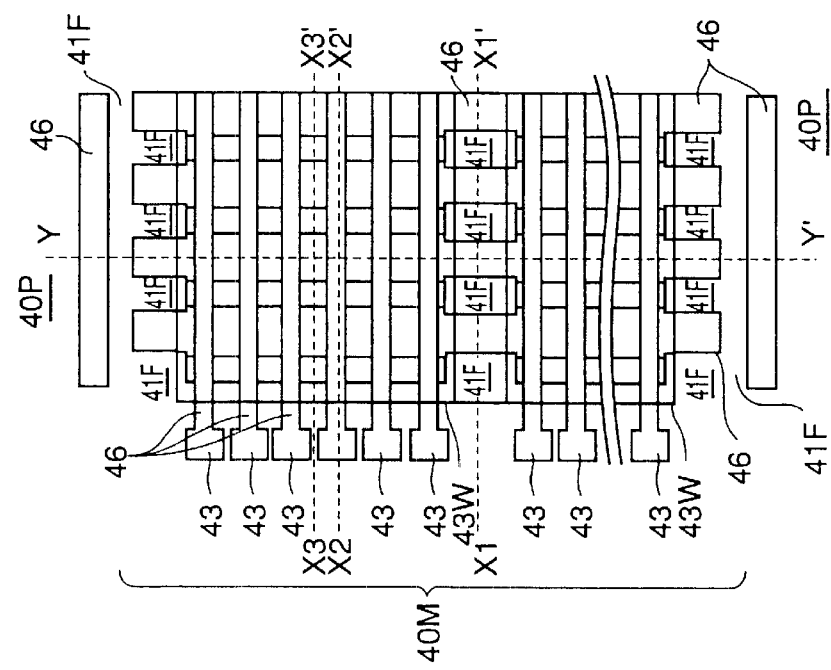
FIG.27A
FIG.27B
FIG.27C
FIG.27D

PERIPHERAL Pch Tr

PERIPHERAL Nch Tr

40M

PERIPHERAL Pch Tr  40P

PERIPHERAL Nch Tr  40P

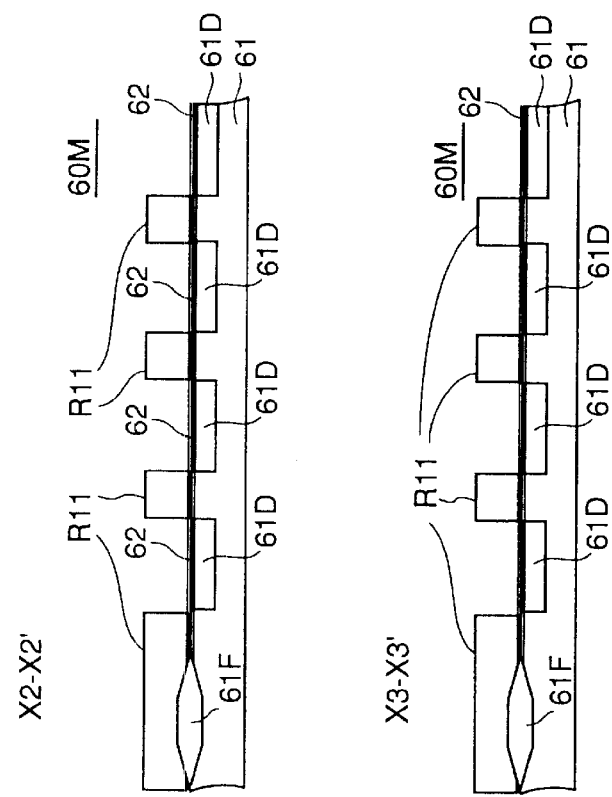
FIG.31B
FIG.31C
FIG.31D
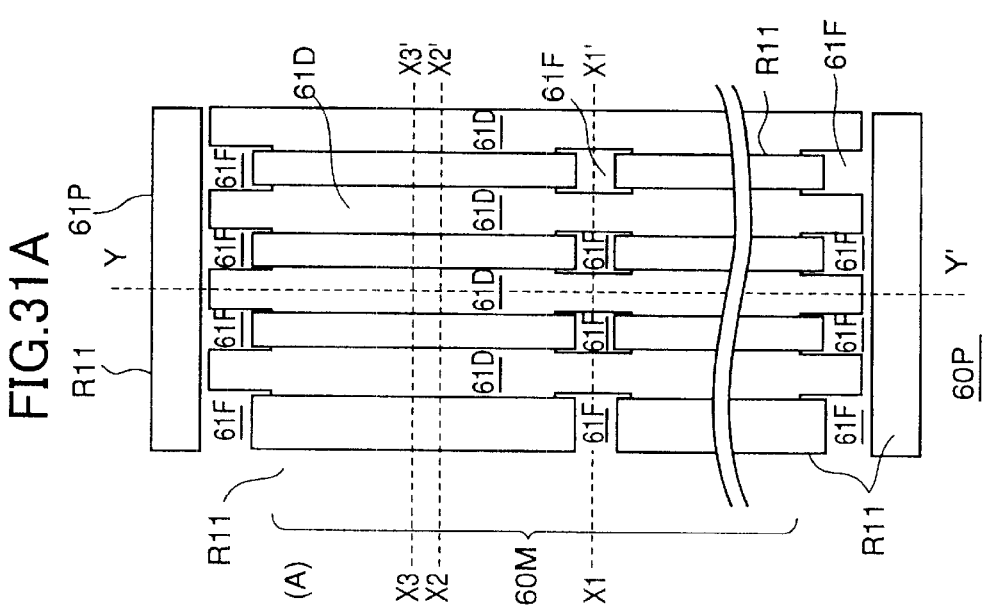
FIG.31A

60M

PERIPHERAL Pch Tr
60P

PERIPHERAL Nch Tr
60P

60M

PERIPHERAL Pch Tr
60P

PERIPHERAL Nch Tr
60P

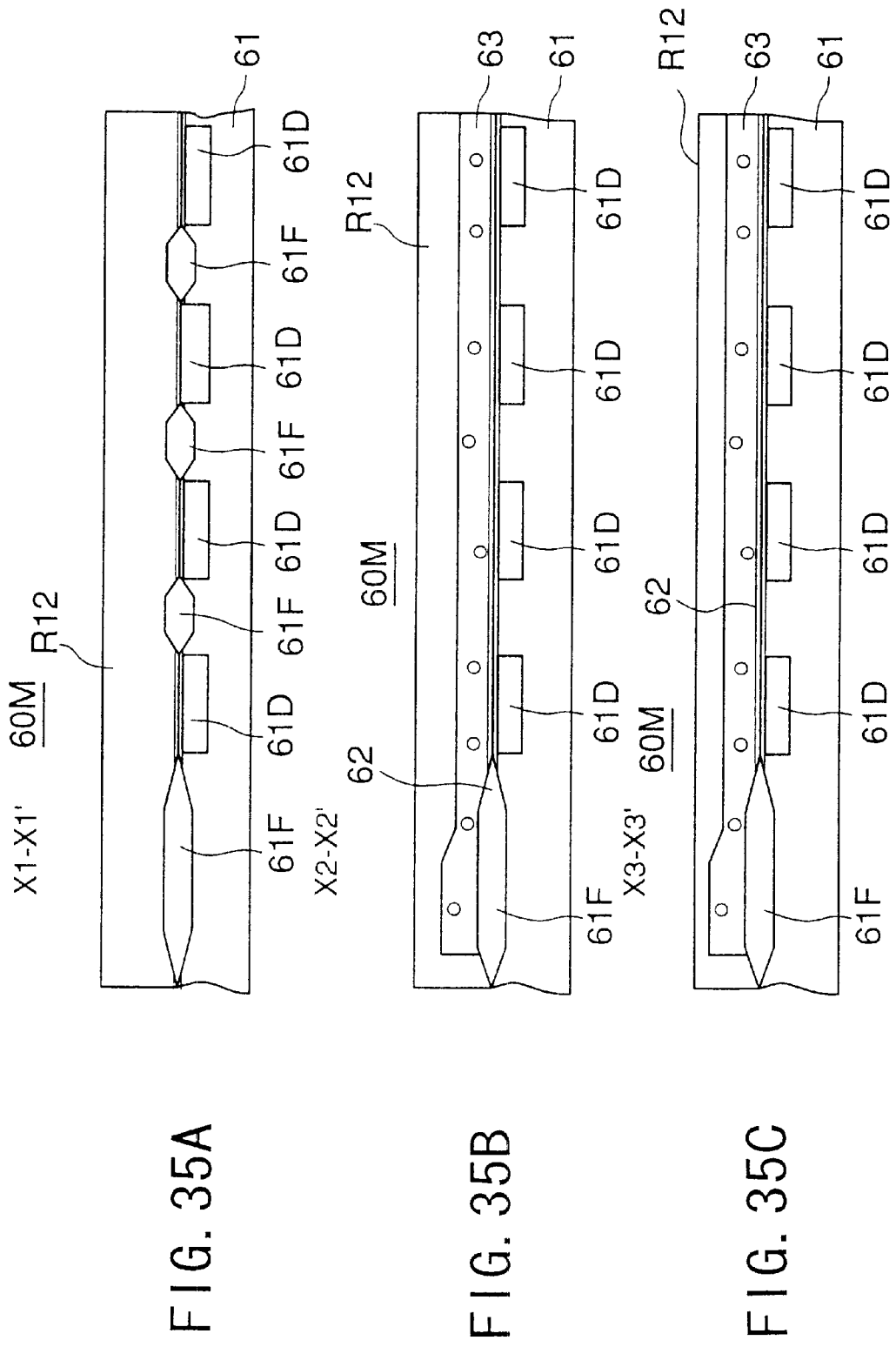

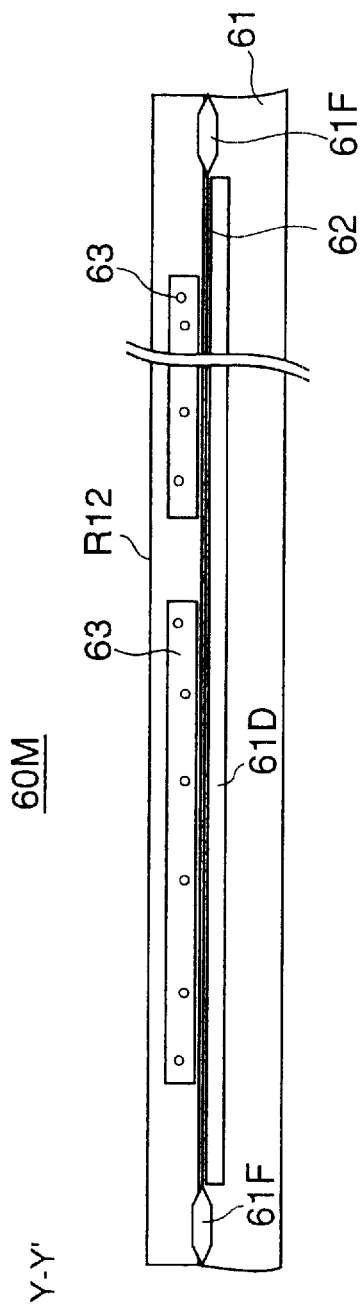
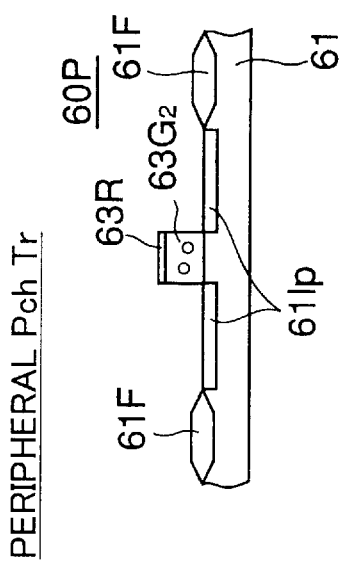
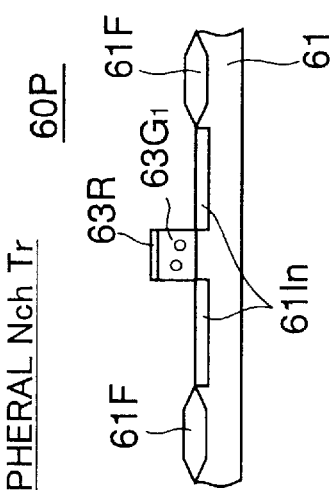

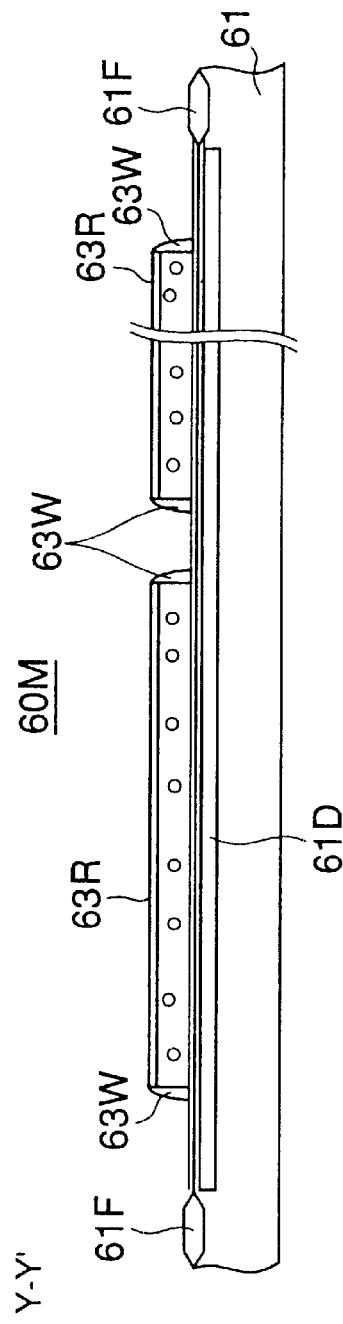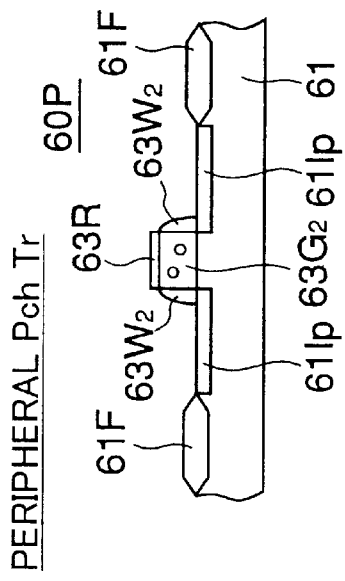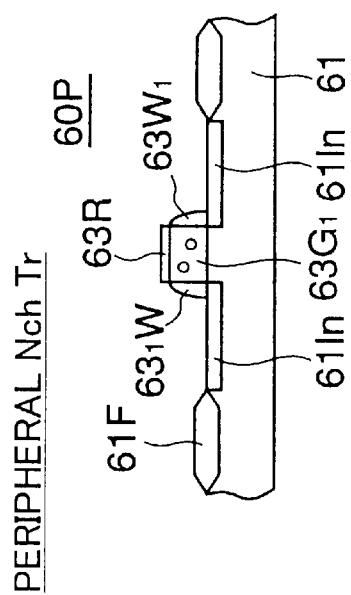

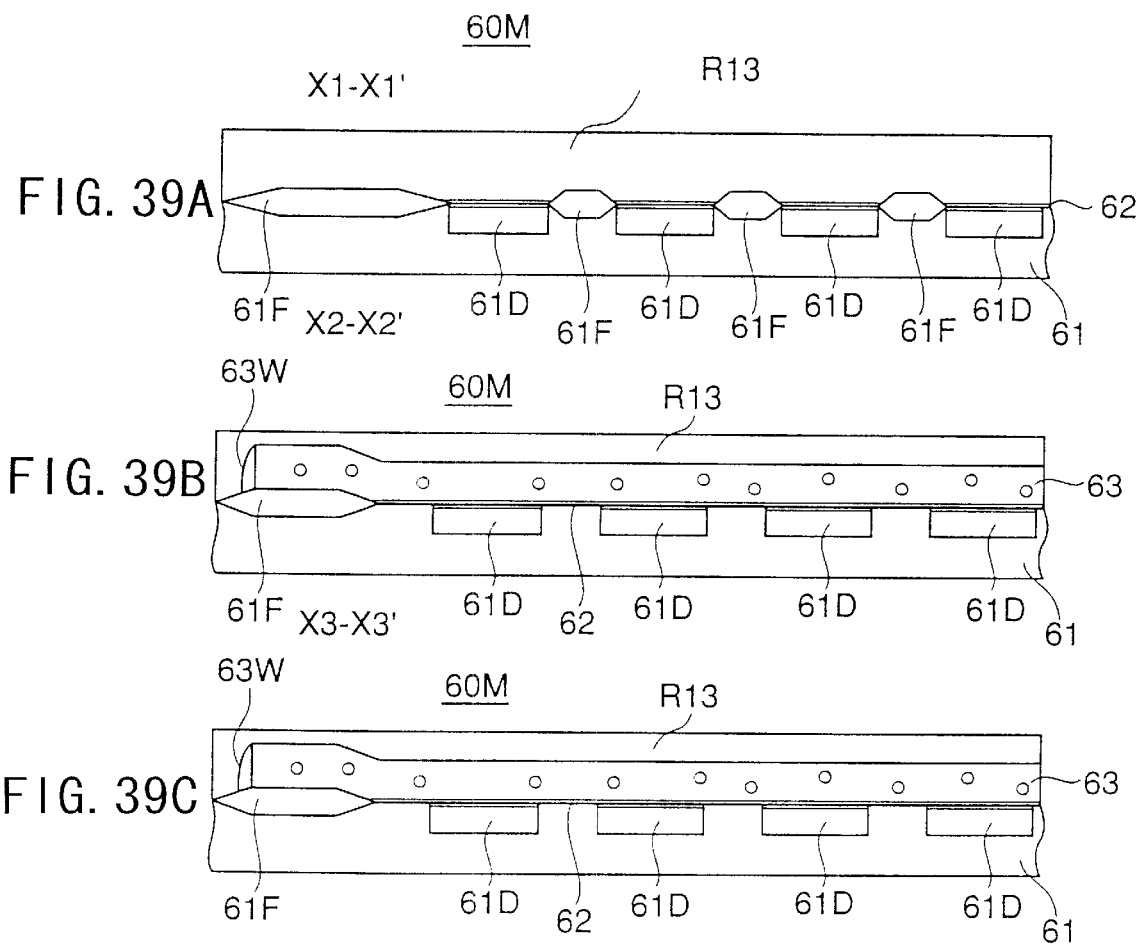

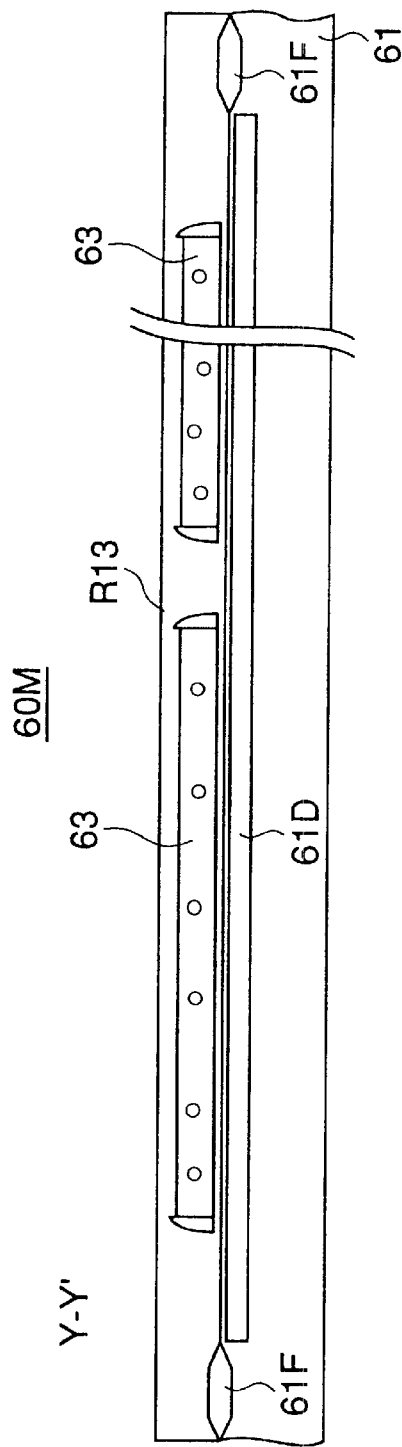
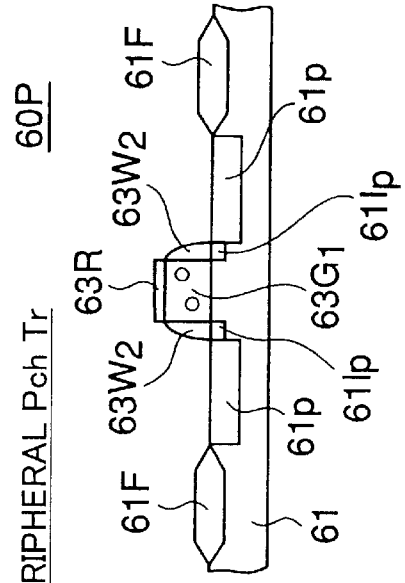
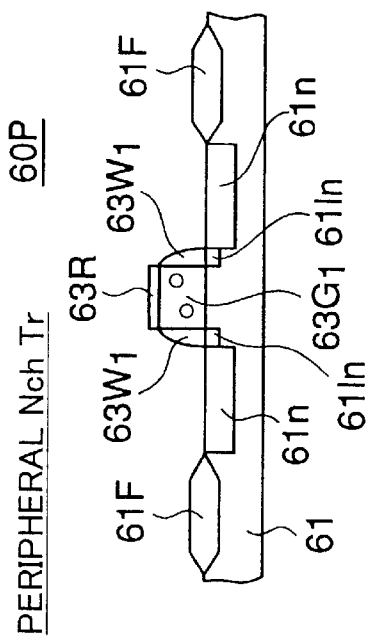

60M

Y-Y'
61F
METAL SILICIDE
61F
61

PERIPHERAL Nch Tr
60P

PERIPHERAL Pch Tr
60P

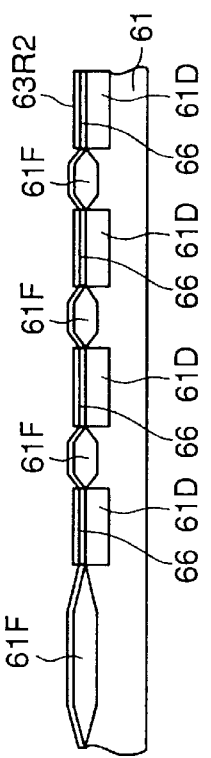
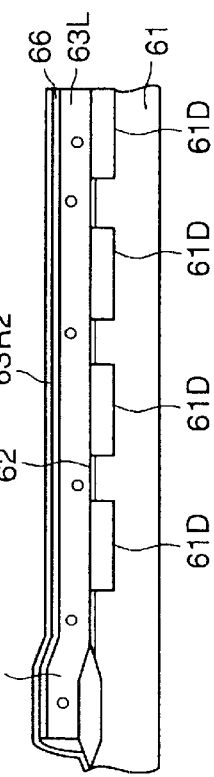
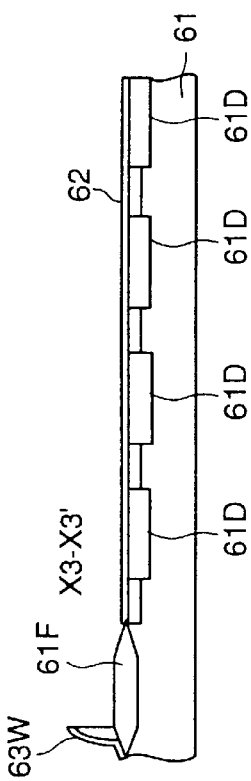
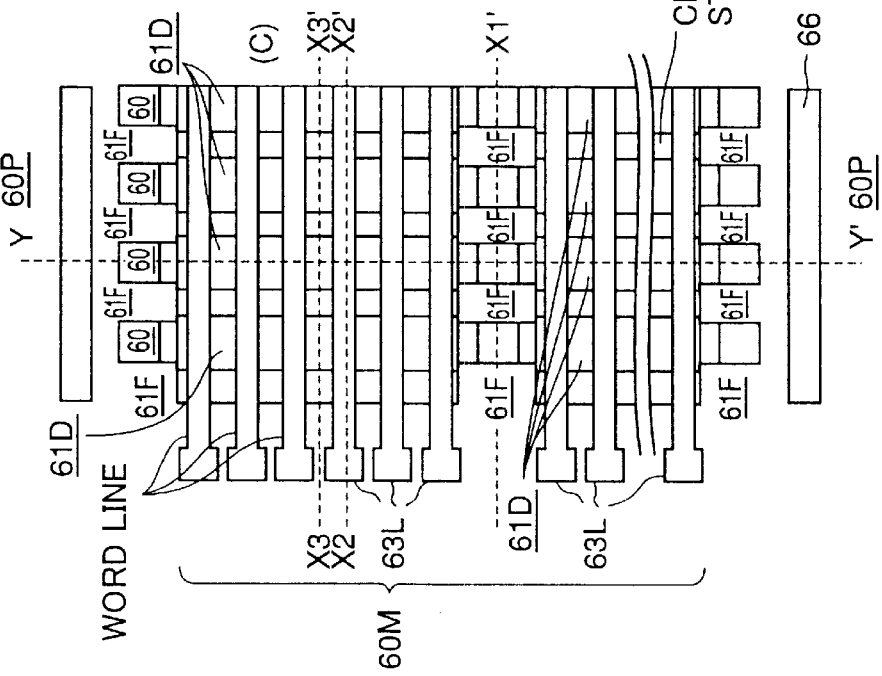

PERIPHERAL Pch Tr

PERIPHERAL Nch Tr

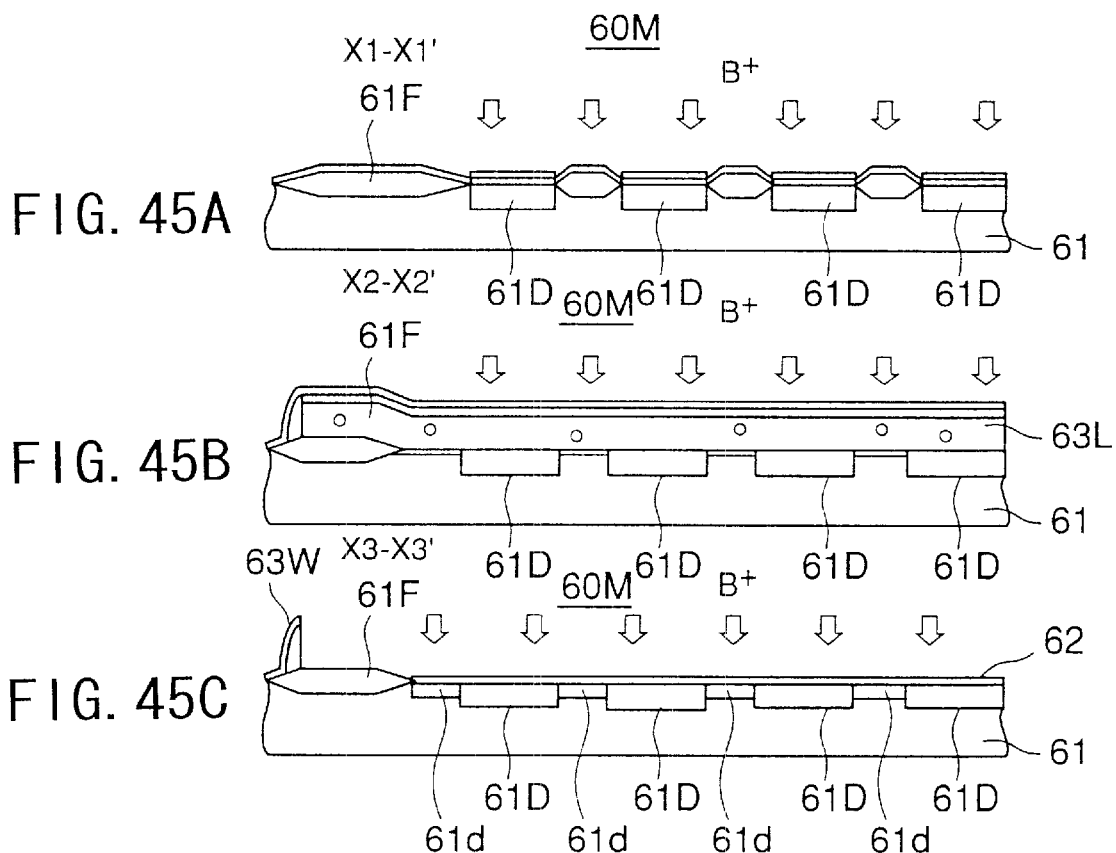

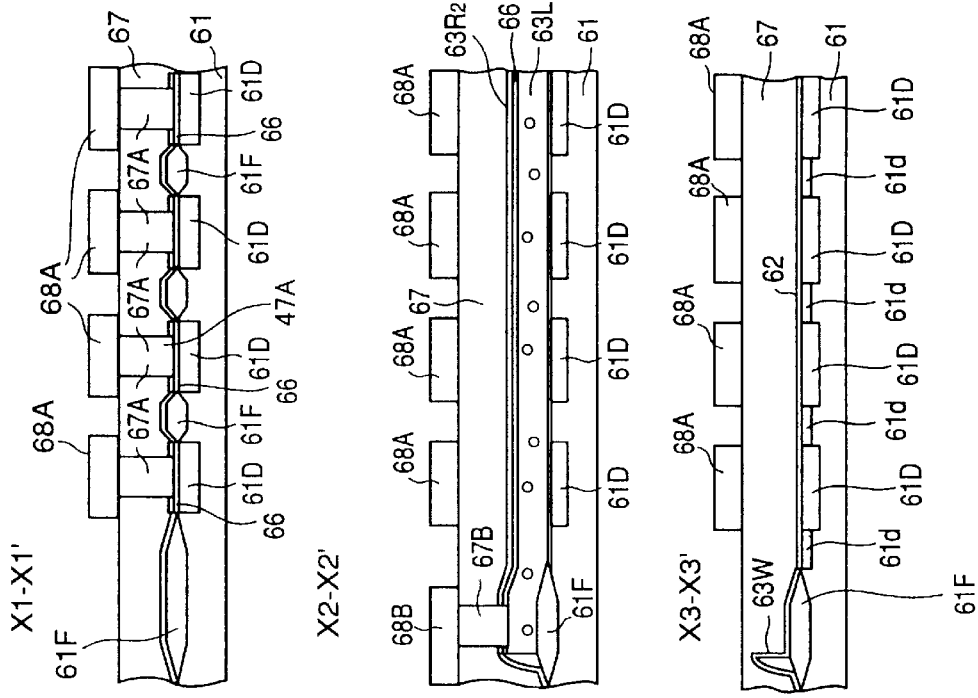
FIG.47B
FIG.47C
FIG.47D
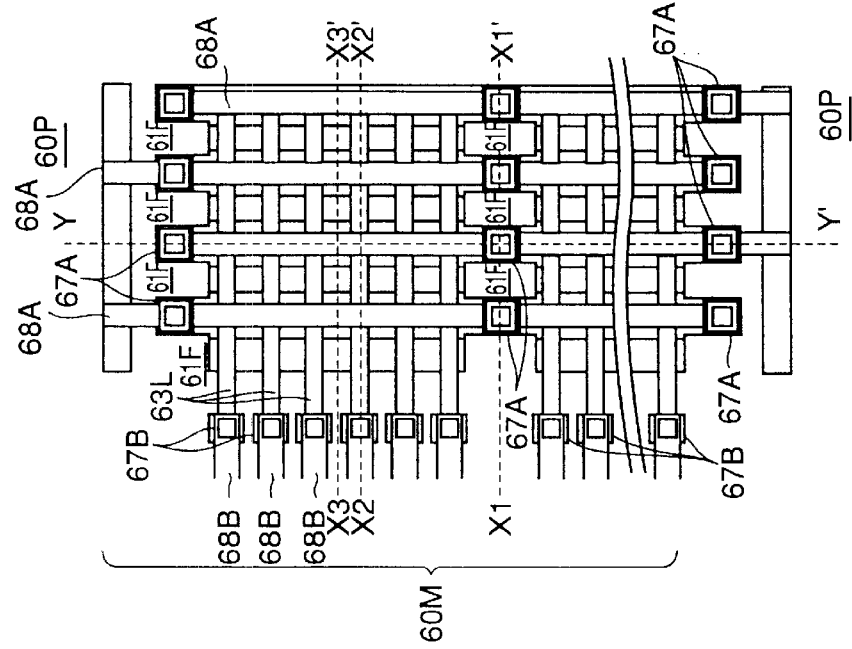
FIG.47A

NON-VOLATILE SEMICONDUCTOR MEMORY DEVICE AND FABRICATION PROCESS THEREOF

CROSS-REFERENCE TO RELATED APPLICATION

The present application is based on Japanese priority application No. 2000-351444 filed on Nov. 17, 2000, the entire contents of which are hereby incorporated by reference.

BACKGROUND OF THE INVENTION

This invention relates to semiconductor devices generally. Especially it is related to a non-volatile semiconductor memory and fabrication process thereof.

A flash memory is a non-volatile semiconductor memory that has a simple device structure suitable for high-density integration similar to DRAMs. Thus, it is used in the various information processing apparatuses including computers and cellular phones widely. Generally, a flash memory stores information in a floating gate electrode in the form of electric charges.

Recently, a non-volatile semiconductor memory having a MONOS (metal-oxide-nitride-oxide-semiconductor) structure or SONOS (semiconductor-oxide-nitride-oxide-semiconductor) structure has been proposed. These non-volatile semiconductor memory devices use an insulation film having an ONO structure for the gate insulation film of the MOS transistor and stores information in the ONO gate insulation film in the form of electric charges.

In the non-volatile semiconductor memory of such a MONOS structure or SONOS structure, injection of electric charges into gate insulation film is conducted from a drain side or a source side. As a result, storage of multivalent information becomes possible.

FIG. 1 is a diagram that shows the circuit construction of a NOR/AND type non-volatile semiconductor memory 10 that has a conventional SONOS structure.

FIG. 1 is referred to.

The non-volatile semiconductor memory 10 has a memory cell array M that includes plural memory cell transistors $M_{11}-M_{mm}$, each having a gate insulation film of the ONO structure. In the memory cell array M, the memory cell transistors are arranged in a matrix formation. A group of memory cell transistors aligned in a row direction in the memory cell array M are connected commonly to any of the word lines $WL_n$, $WL_{n+1}$, $WL_{n+2}$, $WL_{n+3}$ . . . extending in a row direction at the respective gate electrodes. Furthermore, a group of memory cell transistors that are aligned in a column direction are connected in memory cell array M commonly to any of the data bit lines $DBL_{n+1}$, $DBL_{n+2}$, $DBL_{n+3}$, $DBL_{n+4}$ that extend in the column direction at the source diffusion region and the drain diffusion region.

Furthermore the non-volatile semiconductor memory 10 has select gate lines $SG_{1,2,3,4}$, . . . The data bit lines $DBL_n$ and $DBL_{n+2}$ are connected to the corresponding main bit lines $MBL_n$ by select transistors $T_1$ and $T_2$ connected to the select gate lines $SG_1$ and $SG_2$. Also, the data bit lines $DBL_{n+1}$ and $DBL_{n+3}$ are connected to the corresponding main bit line $MBL_{n+1}$ by select transistors $T_3$ and $T_4$ connected to select gate lines $SG_3$ and $SG_4$.

In, such a construction, information is written into the gate insulation film of the memory cell transistors $M_{11}$, $M_{12}$, . . . that has the ONO structure in the form of channel hot-electrons injected from the source region or drain region. The electric charges thus injected are held stably in the ONO film.

FIG. 2 shows the construction of a transistor 20 that constitutes the memory cell transistor $M_{11}$, $M_{12}$, . . . in the memory cell array M.

FIG. 2 is referred to.

The transistor 20 is formed of on a Si substrate 21. In the Si substrate 21, there are formed buried diffusion regions 21A and 21B respectively as the source region and drain region. Furthermore the surface of substrate 21 is covered with an ONO film 22 of the structure in which an oxide film 22a, a nitride film 22b and an oxide film 22c are stacked. Further, a polysilicon gate electrode 23 is formed on the ONO film 22.

FIGS. 3A and 3B are diagrams that show the writing operation and the erasing operation carried out in the memory cell transistor of FIG. 2, respectively.

FIG. 3A is referred to.

A source region 21A is grounded at the time of the writing of information and a large positive voltage $+V_w$ is applied to the drain region 21B. Further, a large positive voltage $+VG_1$ is applied to the gate electrode 23. As a result, hot-electrons are formed in the channel as a result of acceleration of electrons at the drain edge of the channel region. The hot-electrons thus formed are then injected into the ONO film 22. The hot electrons thus injected are held in the ONO film 22 in the vicinity of the drain edge. By exchanging the drive voltage that is applied to the drain region 21B and the source region 21A, it is also possible to carry out the injection of the hot electrons similarly in the vicinity of the source edge of the ONO film 22. As represented in FIG. 1, it becomes possible to write 2 bits of information for every one cell in the memory cell transistor 20 of FIG. 2.

When deleting information that is already written, a large positive voltage +Ve is applied to drain region 21B as represented in FIG. 3B. Furthermore a large negative voltage $-VG_2$ is applied to the gate electrode 23. With this, holes are injected from drain region 21B into the ONO film 22. As a result, the electric charges that are accumulated in the vicinity of the drain edge in ONO film 22 are annihilated. In the case the electrons are accumulated in the vicinity of the source edge in ONO film 22, it is sufficient to carry out the hole-injection from source region 21A.

When reading out information written in the vicinity of the drain edge of the ONO film 22, a specified gate voltage Vg is applied to gate electrode 23 as represented in FIG. 4A. Further, the drain region 21B is grounded and the source region 21A is applied with a reading voltage Vr. As a result, it becomes possible for the careers to flow to the source region 21A from the drain region 21B through the channel formed in the Si substrate 21 right underneath the gate electrode 23, provided that electron are not accumulated in the vicinity of the drain edge of the ONO film 22. As a result, the memory cell transistor 20 conducts.

In the case the electrons are accumulated in the vicinity of the drain edge of ONO film 22 on the other hand, the channel right underneath the gate electrode 23 is blocked at the drain edge. Thus, the transistor 20 does not conduct. In the case of reading out the information written in the vicinity of the source edge of the ONO film 22, on the other hand, the source region 21A is grounded as represented in FIGS. 4A and 4B. Further, a read voltage Vr is applied to the drain region 21B.

FIGS. 5A–5D, FIGS. 6A–6C, FIGS. 7A–7D, FIGS. 8A–8C, FIGS. 9A–9D and FIGS. 10A–10C show the fabrication process of a non-volatile semiconductor memory 10 that uses the memory cell transistor 20.

FIGS. 5A–5D are referred to.

FIG. 5A is a plan view of the non-volatile semiconductor memory 10 while FIG. 5B shows the non-volatile semiconductor memory 10 in a cross-sectional view taken along a line $X_1$–$X_1'$ of FIG. 5A. FIG. 5C shows the non-volatile semiconductor memory 10 in a cross-sectional view taken along a line $X_2$–$X_2'$ of FIG. 5A. Further, FIG. 5D shows the non-volatile semiconductor memory 10 in a cross-sectional view of taken along a line $X_3$–$X_3'$ of FIG. 5A.

FIGS. 5A–5D are referred to.

An active region is defined on the Si substrate 21 by a field oxide film 21F having a thickness of 200–500 nm formed by a thermal oxidation processes at 900–1000° C. Further, an ONO film 22 is formed on the active region. More specifically, the surface of the Si substrate 21 exposed at the active region is thermally oxidized at 800–1100° C. As a result, an oxide film 22a is formed with a thickness of 5–10 nm. Furthermore, a CVD process is conducted at 600–800° C. on the oxide film 22a. Thereby, a nitride film 22b is deposited with a thickness of 12–16 nm. Furthermore an oxide film 22c is formed on the nitride film 22b by a wet oxidation processes at 1000–1100° C. with a thickness of 5–10 nm.

In the process of FIG. 5A, a resist pattern $R_1$ is formed on the ONO film 22 thus formed such that the resist pattern $R_1$ has an opening corresponding to each of data bit lines DBL to be formed, and As$^+$ ions are introduced into the Si substrate 21 through the resist opening by an ion implantation process with a dose of $2\times10^{15}$–$5\times10^{15}$ cm$^{-2}$ under an accelerating voltage of 50–90 keV. As a result, a number of n-type diffusion regions 21D corresponding to the data bit lines DBL are formed in the Si substrate 21 in parallel with each other. In the following, the n-type diffusion region 21D will be designated as bit-line diffusion region.

In the state of FIG. 5A–5D, the same cross-sectional structure appears in the cross-sectional view of FIGS. 5B–5D.

FIG. 6A shows the cross-sectional diagram taken along a line Y–Y' of FIG. 5A, while FIG. 6B shows the cross-sectional diagram of the n-channel peripheral transistor used in the non-volatile semiconductor memory 10. Further, FIG. 6 C shows the cross-sectional diagram of the p-channel peripheral transistor that is used in the non-volatile semiconductor memory 10.

FIG. 6A is referred to.

It can be seen that the bit-line diffusion region 21D extends in the active region defined by the field oxide film 21F in the extending direction of the data bit line DBL continuously. As can be seen in FIGS. 6B and 6C, the p-channel peripheral transistor region and the n-channel peripheral transistor region are covered by a resist pattern $R_1$ in the state of FIG. 5(A). Thus, no ion implantation is caused into the substrate in the state of FIG. 6A into the peripheral transistor region.

Next, the resist pattern $R_1$ is removed in the step of FIGS. 7A–7D, and plural polysilicon gate electrode patterns 23 (referred to hereinafter as word line electrode) are formed on the Si substrate 21 in correspondence to the word line WL of FIG. 1, such that each polysilicon gate electrode patterns 23 extends in a direction generally perpendicular to the extending direction of the diffusion regions 21D.

Furthermore, a channel-stop diffusion region 21d is formed between the bit-line diffusion regions 21D by an ion implantation process of B that introduces B ions into the Si substrate 21. During the ion implantation process, the word line electrode 23 is used as a mask. The ion implantation process may be conducted with a dose of $3\times10^{12}$–$1\times10^{13}$ cm$^{-2}$ under acceleration voltage of 50–80 eV as shown in FIG. 7B or FIG. 7D. It should be noted that FIG. 7A shows the non-volatile semiconductor memory 10 in a plan view.

Further, it should be noted that FIGS. 7B–7D show the cross-sectional views respectively taken along a line $X_1$–$X_1'$, a line $X_2$–$X_2'$ and a line $X_3$–$X_3'$ of FIG. 7A. As shown in FIG. 7C, the channel-stop diffusion region 21d is not formed right underneath the word line electrode 23. In FIGS. 7B and 7C, the channel-stop diffusion region 21d is formed also in the bit-line diffusion region 21D. In FIGS. 7(B) and 7C, the illustration of the channel-stop diffusion region 21d is omitted because very small impurity concentration level there in.

FIG. 8A shows the cross-sectional diagram of FIG. 7A taken along the line Y–Y'.

FIG. 8A is referred to.

It can be seen that plural word line electrodes 23 are formed repeatedly with a regular interval on the ONO film 22. Also, the channel-stop diffusion region 21d is formed at the edge part of diffusion region 21D as a result of the ion implantation of B.

The ONO film 22 is removed in the step of FIG. 7A by a mask process from the region of the peripheral transistor, after the step of removal of resist pattern $R_1$ but before the step of formation of the word line electrode 23. Furthermore, thermal oxidation processes is conducted at 800–1100° C. Thus, a thermal oxide film 22ox is formed typically with a thickness of 5–15 nm as shown in FIGS. 8B and 8C. As the ONO film 22 is already formed in the memory cell region M, formation of new oxide film does not occur even when such a thermal oxidation process is conducted. Furthermore, gate electrodes $23G_1$ and $23G_2$ are formed on the thermal oxide film 22ox thus formed simultaneously to the formation of the word line electrode 23, as shown in FIGS. 8B and 8C.

Because the data bit line DBL is provided by the diffusion region 21D in the non-volatile semiconductor memory 10, it is necessary and desirable to decrease the resistance of the bit line. Thus, as shown in FIGS. 9A–9D, an interconnection pattern 24M is provided on the diffusion region 21D in correspondence to the data bit line DBL such that the interconnection pattern 24M extends parallel with the diffusion region 21D. It should be noted that FIG. 9A shows the plan view of the non-volatile semiconductor memory 10. Also, FIGS. 9B–9D show the cross-sectional diagram of FIG. 9A taken along the lines $X_1$–$X_1'$, $X_2$–$X_2'$, and $X_3$–$X_3'$.

FIGS. 9B–9D are referred to.

An interlayer insulation film 25 is formed so as to cover the word line electrode 23 on the Si substrate 21. A contact hole 25A is formed in the interlayer insulation film 25 by a dry etching process so as to expose the diffusion region 21D. Thereby, the metal interconnection pattern on the interlayer insulation film 25 makes a contact with the diffusion region 21D at the contact hole 25A.

As shown in FIGS. 9A and 9C, a contact hole 25B is formed also on the interlayer insulation film 25 so as to expose the word-line electrode 23. Further, an interconnection pattern 24N is formed on the interlayer insulation film 25 in electric connection with the corresponding the word line electrode 23 at the contact hole 25B.

FIG. 10 shows the cross-sectional diagram of FIG. 9A taken along the line Y–Y'.

FIG. 10A is referred to.

Each of the word line electrodes 23 has a sidewall insulation film 23S thereon. The word line electrode 23 makes a contact with the diffusion region 21D through the contact hole 25A at plural locations in the extending direction thereof. When forming such a sidewall insulation film 23S, an insulation film is deposited on the Si substrate 23 so as to cover the word line electrode 23. Next, the insulation film is etched back by an anisotropic etching process that acts perpendicularly to the substrate principal surface. In the n-channel or p-channel peripheral transistor region, on the other hand, the structure of FIGS. 8B and 8C is covered, after formation thereof, by a resist film (not illustrated). Furthermore, a resist opening is formed in the resist film in the process of Figure 1OB. By introducing an n-type dopant through such a resist opening by an ion implantation process, an n$^-$-type LDD region 21 is formed in the Si substrate 2 at both lateral sides of the gate electrode 23G$_1$.

Next, the resist film is removed. Furthermore, another resist film (not shown) is formed in the process of FIG. 10C and a p-type dopant is introduced through a resist opening therein by an ion implantation process. Thereby, a p$^-$-type LDD region 21$_{lp}$ is formed at both lateral sides of the gate electrode 23G$_2$.

Furthermore, a sidewall insulation film is formed to the sidewall of the gate electrodes 23G$_1$ and 23G$_2$ simultaneously to the sidewall insulation film 23S formed on the word line electrode 23 after removal of the resist film. Furthermore, a diffusion region 21n of n$^+$-type is formed outside the sidewall insulation film provided on the gate electrode 23G1 in the n-channel peripheral transistor of FIG. 10B, by conducting an ion implantation process.

Further, a diffusion region 21p of p$^+$-type is formed outside the sidewall insulation film of the gate electrode 23G$_2$ in the p-channel peripheral transistor of FIG. 10C.

In the step of FIGS. 10(B) and 10(C), the contact holes 25C and 25D thus formed in the interlayer insulation film 25, which covers the gate electrode 23G$_1$ and 23G$_2$ on the Si substrate 21, expose the diffusion regions 21n and 21p. Thereby, the metal interconnection pattern 24W formed on the interlayer insulation film 25 makes a contact with the diffusion region 21n in such a contact hole. Further, the metal interconnection pattern 24V makes a contact with the diffusion region 21p.

Meanwhile, there exists stringent demand of high speed operation similar to the one imposed to other high-speed semiconductor devices, also in the conventional non-volatile semiconductor memory 10. Because of this, there is a need of reducing the surface contact resistance as much as possible in the word line electrode 23, in the gate electrodes 23G$_1$ and 23G$_2$, and in the surface of the diffusion region 21D or the diffusion regions 21n and 21p.

In the example of FIGS. 11A–11D, the silicide layer 26 is formed on the surface of the Si substrate 21 as shown in FIGS. 11A, 11B and 11D. The contact hole 25A of the interlayer insulation film 25 is formed such that the silicide layer 26 is exposed. Also, the silicide layer 26 is formed on the word line electrode 23. Furthermore, the silicide layer 26 is formed on the surface of substrate 21 along the bitline diffusion region 21D as shown in FIG. 12A, except for the part where the word line electrode 23 is formed. Furthermore, the silicide layer 26 is formed on the surface of the n$^+$-type diffusion region 21n and on the surface of the p$^+$-type diffusion region 21p, as can be seen in FIGS. 12B and 12C.

Such a silicide layer 26 can be formed by using the word line electrode 23 and also the gate electrodes 23G$_1$ and 23G$_2$ as a self-aligned mask in the process of FIGS. 7A–7D or in the process of FIGS. 8A–8C. After removing the ONO film 22 by a pyro-phosphoric acid treatment and a HF treatment, a refractory metal layer of W is deposited. The W layer thus deposited is caused to react with Si of the underlying layer. Especially, as shown in FIGS. 12B and 12C, the contact resistance of the semiconductor device, which is demanded to provide especially high-speed operation, is reduced, by forming the silicide layer 26 on the surface of the diffusion region 26 of the peripheral transistor. Thereby, the problem of signal delay that originates from the contact resistance is effectively reduced.

In the structure of FIGS. 11A–11D or FIGS. 12A–12C, it is very important that the silicide layer 26 is formed in correspondence to the contact hole 25A that is formed in the interlayer insulation film 25 as shown in FIG. 11B or in FIG. 12A. As explained before, the dry etching process that removes the oxide film is performed so as to reduce the contact resistance in the contact holes 25 C and 25D and in the contact hole 25A as represented in FIGS. 12B and 12C. Thus, the dry etching process has to be carried out such that the silicide layer 26 is not etched. In the event the silicide layer 26 is not formed in these regions, the dry etching would invade into the diffusion region 21D and reach the Si substrate 21. When this occurs, the desired device characteristic is no longer obtained.

However, the constitution of FIGS. 11A–11D has a fatal problem in that adjacent diffusion regions 21D easily cause short-circuit via the silicide layer 26 as represented in the cross-sectional diagram of FIG. 11B by *. In the cross-section of FIGS. 11B–11D, the conduction between the adjacent diffusion region 21D has to be caused as a result of the device operation. When this part causes short-circuit, the flash memory does not operate. On the other hand, the silicide layer 26 is indispensable at the contact hole 25A, as explained previously.

FIGS. 13A–13D and FIGS. 14A–14C show an example that is conceivable for overcoming the foregoing problem.

First FIG. 14A is referred to.

In the illustrated structure, the process of forming the sidewall insulation films 23W$_1$ and 23W$_2$ on the gate electrodes 23G$_1$ and 23G$_2$ in the peripheral transistor of FIGS. 14B and 14C is conducted by a deposition and etch back process of the insulation film 23W, wherein the deposition and etch back process is conducted while leaving the insulation film 23W deposited on word line electrode 23 selectively in the memory cell region M. For this purpose, a resist pattern is used.

Furthermore, an opening 23WA is formed in the insulation film 23W in correspondence to the contact hole 25A as represented in FIGS. 13B and 13C, and an opening 23WB is formed in correspondence to the contact hole 25B. Further, the silicide layer 26 is formed on bit-line diffusion region 21D in correspondence to such an opening 23A. Further, the silicide layer 26 is formed on the word line electrode 23 in correspondence to the opening 23B.

According to such constitution, the insulation film 23W exists between a pair of adjacent bit-line diffusion regions 24D. Therefore, no silicide layer 26 that may cause short-circuit is formed between the bit-line diffusion regions 24D.

However, there exists a limit in the patterning precision, and there inevitably appears a limit in the integration density when the non-volatile semiconductor device 10 is to be formed according to such a process in which the silicide layer 26 is formed in the memory cell array M selectively in the openings 23WA and 23WB of the insulation film 23. As explained before, the silicide layer 26 has to be formed positively right underneath the contact holes 25A and 25B in relation to the process of removing the native oxide film by the dry etching process.

SUMMARY OF THE INVENTION

Accordingly, it is a general object of the present invention to provide a novel and useful non-volatile semiconductor memory device and the fabrication process wherein the foregoing problems are eliminated.

Another and more specific object of the present invention is to provide a non-volatile semiconductor memory device of SONOS type or MONOS type having a self-aligned silicide layer on a contact region and is capable of eliminating short circuit between diffusion regions positively.

Another object of the present invention is to provide a non-volatile semiconductor device, comprising:

a semiconductor substrate carrying an active region defined by a device isolation structure thereon;

a plurality of diffusion regions formed in said active region with a separation from each other, each of said plurality of diffusion regions extending in a first direction;

a word line electrode extending over said active region in a second direction crossing said first direction; and a charge storable insulation film formed on said active region in correspondence to said word line electrode between a surface of said active region and said word line electrode, said charge storable insulation film having a stacked structure in which a nitride film and an oxide film are stacked consecutively on an oxide film, said device isolation structure having a plurality of openings each exposing said surface of said substrate in correspondence to an extension part of said plurality of diffusion regions, each of said plurality of diffusion regions having said extension part extending into corresponding one of said plurality of openings;

each of said plurality of diffusion regions carrying a silicide film on a surface thereof.

Another object of the present invention is to provide a method of fabricating a non-volatile semiconductor memory device on a semiconductor substrate having a memory cell region and a peripheral circuit region, comprising the steps of:

defining an active region on said memory cell region of said semiconductor substrate by forming a device isolation film;

forming a charge storable insulating film on said active layer;

forming a plurality of bit-line diffusion regions in said active region such that each of said bit-line diffusion region extend parallel with each other in a first direction;

forming a word line electrode on said active region so as to extend in a second direction crossing said first direction and forming simultaneously a gate electrode on said peripheral circuit region of said semiconductor substrate;

forming a sidewall insulation film on both sidewall surfaces of said gate electrode in said peripheral circuit region;

forming first and second diffusion regions in said peripheral circuit region at both sides of said gate electrode while using said gate electrode and said sidewall insulation film as a mask; and forming a silicide layer on a top surface of said gate electrode and a surface of said first and second diffusion regions, said step of defining said active region comprising the step of forming a plurality of openings exposing a surface of said semiconductor substrate in said device isolation film along an edge part of said active region, such that said surface of said semiconductor substrate is exposed continuously from said active region to an outside of said active region, said step of forming said plurality of bitline diffusion regions being conducted such that each of said plurality of bit-line diffusion regions extends continuously from said active region to a corresponding one of said plurality of openings, said step of forming said sidewall insulation film on said gate electrode comprising the steps of covering said gate electrode and said word line electrode by a common insulation film, and forming said sidewall insulation film by applying an etch back process to said common insulation film selectively in said peripheral circuit region while leaving said common insulation film on said active region, said method of fabricating said non-volatile semiconductor memory device further comprising the step of forming a silicide layer on a surface of said bit-line diffusion regions extending into respective, corresponding openings, said step of forming said silicide layer on said bit-line diffusion region conducted simultaneously to said step of forming a silicide layer on a surface of said first and second diffusion regions.

Another object of the present invention is to provide a method of fabricating a non-volatile semiconductor memory device on a semiconductor substrate having a memory cell region and a peripheral circuit region, comprising the steps of:

defining an active region on said memory cell region of said semiconductor substrate by forming a device isolation structure;

forming a charge storable insulation film on said active region;

forming a plurality of bit line diffusion regions in said active region such that each bit line diffusion region extends in a first direction with a separation from each other;

forming a conductor layer on said active region such that said conductor layer covers said active region entirely and simultaneously forming a gate electrode in said peripheral circuit region of said semiconductor substrate;

forming first and second diffusion regions in said peripheral circuit region at both lateral sides of said gate electrode while using said gate electrode and said sidewall insulation film as a mask;

forming a silicide layer on a top surface of said conductor layer and on a top surface of said gate electrode and on a surface of said first and second diffusion regions in said active region and in said peripheral circuit region; and patterning said conductor layer in said active region to form a word line electrode extending in a second direction crossing said first direction, said step of defining said active region including the step of forming a plurality of openings in said device isolation structure along an edge of said active region so as to expose a surface of said semiconductor substrate respectively in correspondence to said plurality of bit-line diffusion regions, such that said surface of said semiconductor substrate is exposed continuously form said active region to an outside of said active region, said step of forming said plurality of bit line diffusion regions comprising the step of forming said bit-line diffusion regions such that each of said bit-line diffusion regions extend continuously from said active region to a corresponding one of said plurality of openings, said method further comprising the step of forming a silicide layer on a surface of said plurality of bit-line diffusion regions each extending into corresponding one of said openings while using said common insulation film left on said active region as a mask, said step of forming said silicide layer on said surface of said bit-line diffusion region being simultaneously to said step of forming said silicide layer on said word line electrode and on said first and second diffusion regions.

According to this invention, following advantageous features are obtained when forming a low-resistance silicide layer on the gate electrode or on the surface of the source/drain diffusion regions of the MOS transistor constituting a peripheral circuit of a non-volatile semiconductor memory, in that a silicide layer is positively formed by a self-alignment process in the memory cell region in correspondence to the part extending out from a memory cell region defined by a device isolation structure to the outside of the memory cell transistor. The extending part may be the one used for interconnection with a bit-line electrode pattern provided on an interlayer insulation film via a contact hole. As a result of the present invention, the active region of the memory cell region is positively prevented from being etched even when a dry etching process is applied in the peripheral circuit region as a pre-processing process for removal of native oxide film prior to the step of providing an interconnection pattern to the MOS transistor. As the present invention provides interconnection to the bit-line electrode pattern at a contact hole formed in the interlayer insulation film in correspondence to a device isolation region, the problem of short-circuit does not occur between the silicide layers that are formed in correspondence to respective bit-line diffusion regions.

In the non-volatile semiconductor memory device of this invention, it is desirable to form a silicide film on the surface of the diffusion region and further on gate electrode constituting the peripheral circuit region. Further, it is desirable to form the charge-accumulating insulation film so as to cover the entire surface of the active region continuously. Furthermore, there may be an insulation film formed so as to cover the surface and the sidewall surface of the word line electrode and the exposed substrate surface continuously. In this case, it is preferable that the insulation film covers the word line electrode in conformity with a shape thereof with a uniform thickness. Further, the insulation film covers the entire surface of the active region continuously. It is desirable that the interlayer insulation film covers the insulation film. Also, it is desirable that a silicide film is formed in the extending part of the word line electrode that extends outside the active region. It is desirable to form, in the interlayer insulation film, another contact hole outside the active region so as to expose the outside part. The silicide film may be formed on the word line electrode over the entire length thereof. In doing so, it is possible to form a sidewall insulation film on the extending part of the word line electrode extending the to the outside of the active region so that the sidewall insulation film encloses the active region. Such a sidewall insulation film composes a part of the insulating wall that towers from the substrate in a direction generally perpendicular to the substrate principal surface. In this invention the word line electrode can be formed of a conductive semiconductor material.

According to this invention, it becomes possible to form a silicide layer in a Si surface by a self aligned process in any of a memory cell region and a peripheral circuit region of a non-volatile semiconductor device having a charge storable insulation film. Thus, the problem of etching or attacking of the Si surface does not occur even when removal of natural oxide film is conducted by a dry etching at the time of forming a contact is formed on the Si surface, and deterioration of the device performance is successfully avoided. As a result of formation of the silicide layer, the non-volatile semiconductor memory of this invention has a preferable feature of reduced contact resistance. Thus, the non-volatile semiconductor device operates at high speed.

Other objects and further features of the present invention will become apparent from the following detailed description when read in conjunction with the attached drawings.

BRIEF DESCRIPTION OF THE DRAWINGS

FIGS. 5A–5D are diagrams showing a first fabrication step of a conventional non-volatile semiconductor memory;

FIGS. 9A–9D are diagrams showing a fifth fabrication step of the conventional non-volatile semiconductor memory;

FIGS. 11A–11D are diagrams showing a possible improvement of the conventional non-volatile semiconductor memory and the problems thereof;

FIGS. 12A–12C are diagrams showing a possible improvement of the conventional non-volatile semiconductor memory and the problems thereof;

FIGS. 13A–13D are diagrams showing a possible improvement of the conventional non-volatile semiconductor memory and the problems thereof;

FIGS. 14A–14C are diagrams showing a possible improvement of the conventional non-volatile semiconductor memory and the problems thereof;

FIGS. 15A–15D are diagrams showing a first fabrication step of a non-volatile semiconductor memory according to a first embodiment of this invention;

FIGS. 16A–16C are diagrams showing a second fabrication step of the non-volatile semiconductor memory of the first embodiment of this invention;

FIGS. 17A–17D are diagrams showing a third fabrication step of the non-volatile semiconductor memory of the first embodiment of this invention;

FIGS. 18A–18C are diagrams showing a fourth fabrication step of the non-volatile semiconductor memory of the first embodiment of this invention;

FIGS. 19A–19C are diagrams showing a fifth fabrication step of the non-volatile semiconductor memory of the first embodiment of this invention;

FIGS. 20A–20C are diagrams showing a sixth fabrication step of the non-volatile semiconductor memory of the first embodiment of this invention;

FIGS. 23A–23D are diagrams showing a ninth fabrication step of the non-volatile semiconductor memory of the first embodiment of this invention;

FIGS. 24A–24C are diagrams showing a tenth fabrication step of the non-volatile semiconductor memory of the first embodiment of this invention;

FIGS. 26A–26C are diagrams showing a twelfth fabrication step of the non-volatile semiconductor memory of the first embodiment of this invention;

FIGS. 27A–27D are diagrams showing a thirteenth fabrication step of the non-volatile semiconductor memory of the first embodiment of this invention;

FIGS. 31A–31D are diagrams showing a first fabrication step of a non-volatile semiconductor memory according to a second embodiment of this invention;

FIGS. 35A–35C are diagrams showing a fifth fabrication process of the non-volatile semiconductor memory of the second embodiment of this invention;

FIGS. 36A–36C are diagrams showing a sixth fabrication step of the non-volatile semiconductor memory of the second embodiment of this invention;

FIGS. 38A–38C are diagrams showing an eighth fabrication step of the non-volatile semiconductor memory of the second embodiment of this invention;

FIGS. 39A–39C are diagrams showing a ninth fabrication step of the non-volatile semiconductor memory of the second embodiment of this invention;

FIGS. 40A–40C are diagrams showing a tenth fabrication step of the non-volatile semiconductor memory of the second embodiment of this invention;

FIGS. 43A–43D are diagrams showing a thirteenth fabrication step of the non-volatile semiconductor memory of the second embodiment of this invention;

FIGS. 45A–45C are diagrams showing a fifteenth fabrication step of the non-volatile semiconductor memory of the second embodiment of this invention;

FIGS. 47A–47D are diagrams showing a seventeenth fabrication step of the non-volatile semiconductor memory of the second embodiment of this invention.

DETAILED DESCRIPTION OF PREFERRED EMBODIMENTS

[First Embodiment]

Figure 1:
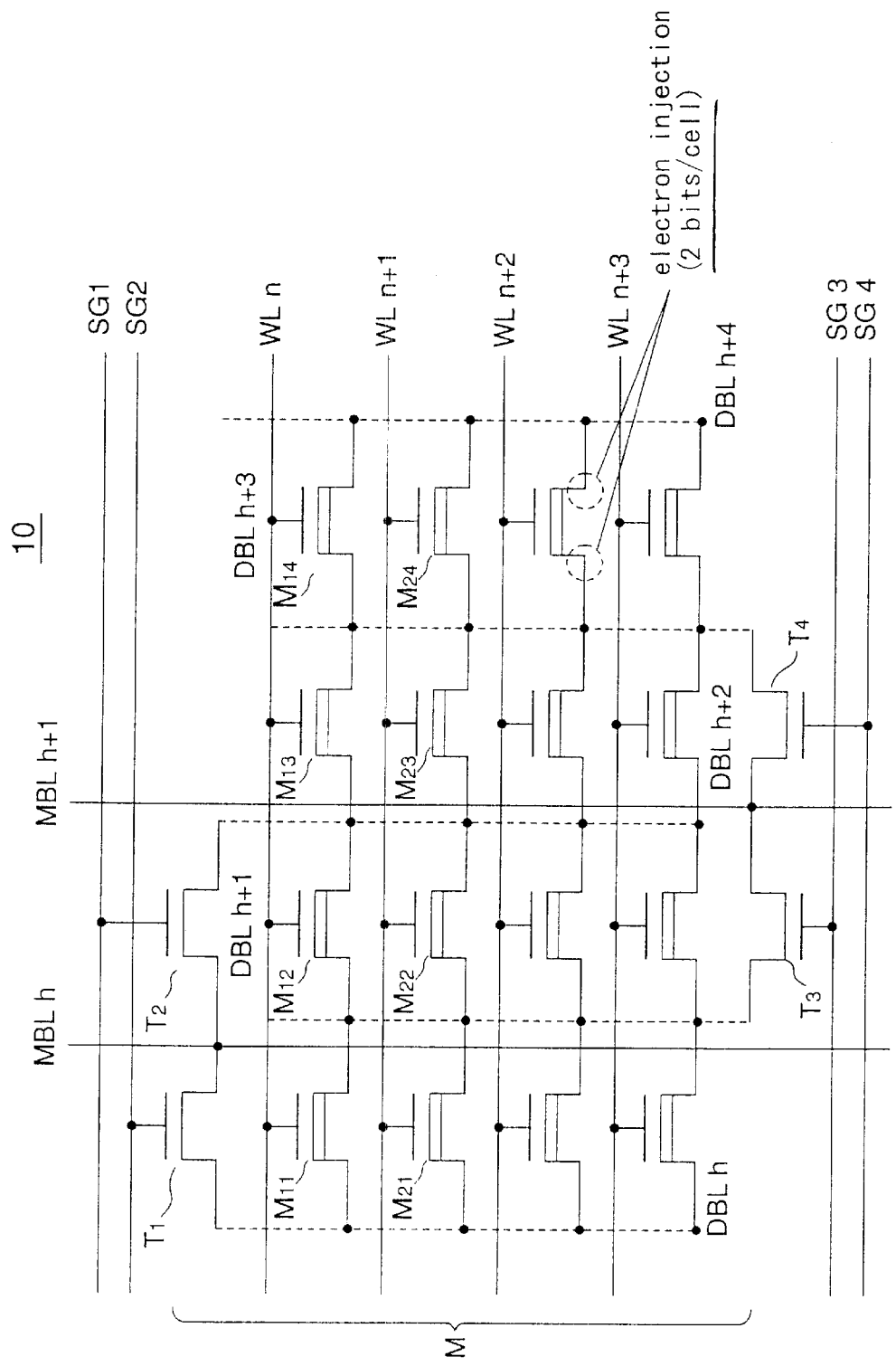
FIG. 1 is a diagram showing the circuit construction of the non-volatile semiconductor memory that has a charge-accumulating insulation film.
Figure 2:
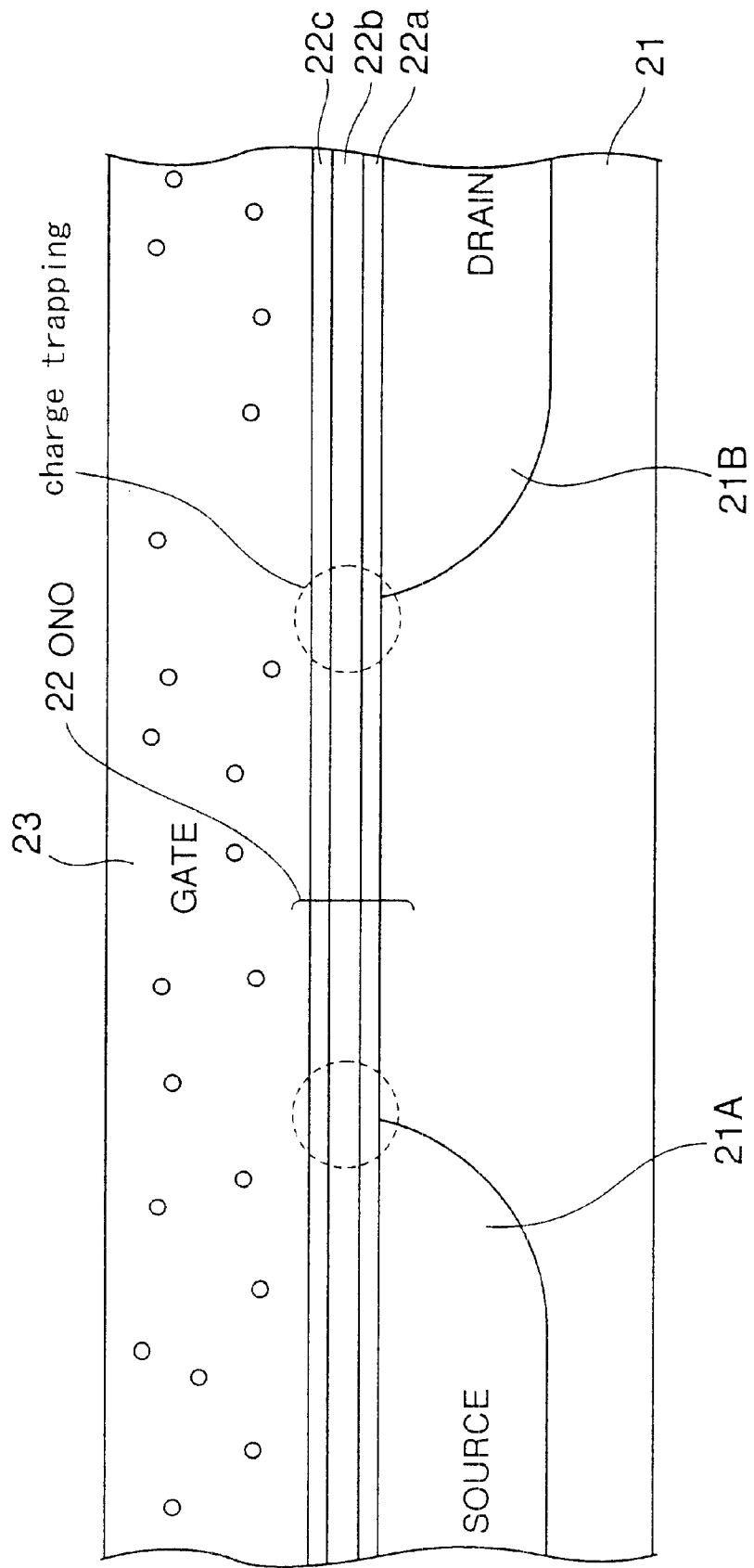
FIG. 2 is a diagram showing the fundamental construction of the non-volatile semiconductor memory of FIG. 1.
Figure 3A:
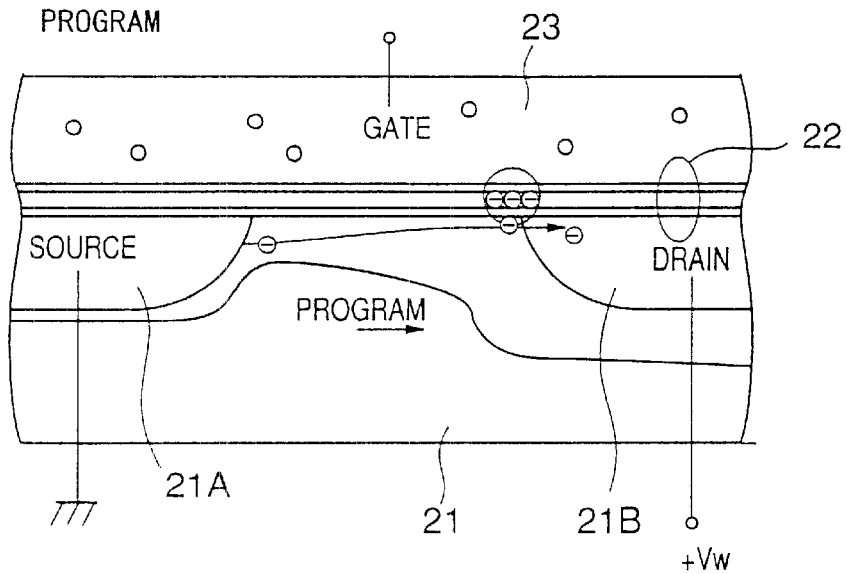
FIGS. 3A and 3B are diagrams showing the writing and erasing operation conducted in the non-volatile semiconductor memory of FIG. 1.
Figure 3B:
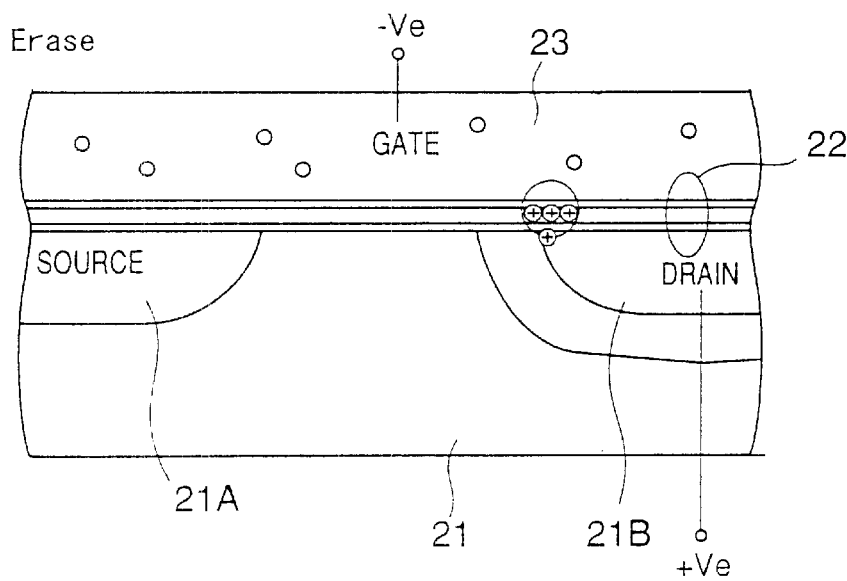
Figure 4A:
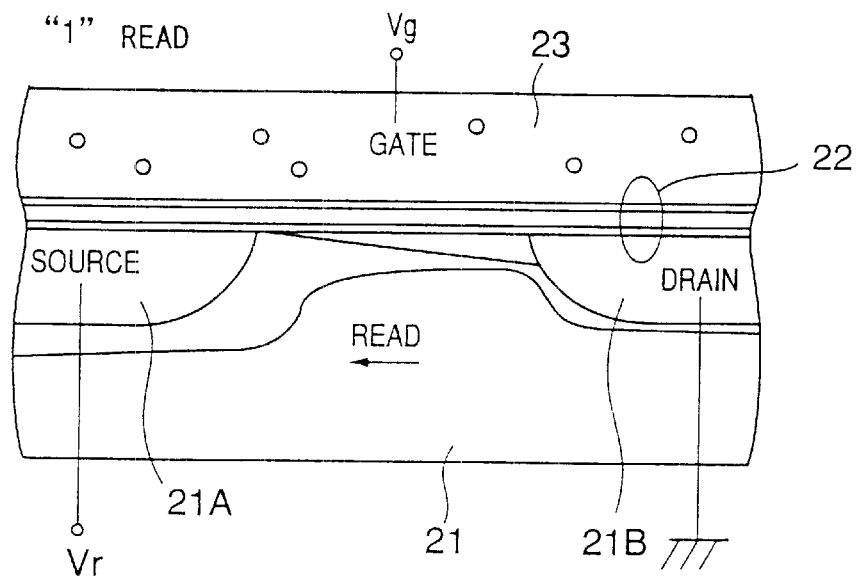
FIGS. 4A and 4B are diagrams showing the reading operation conducted in the non-volatile semiconductor memory of FIG. 1.
Figure 4B:
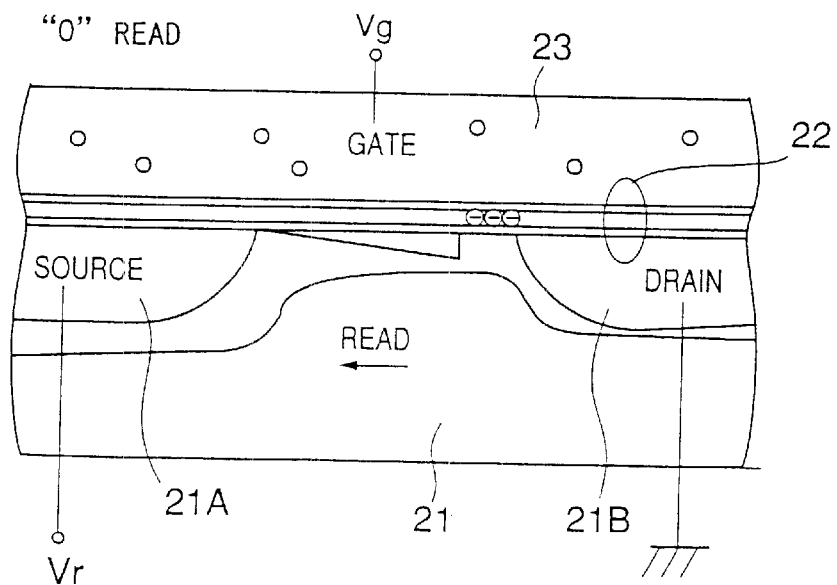
Figure 6A:
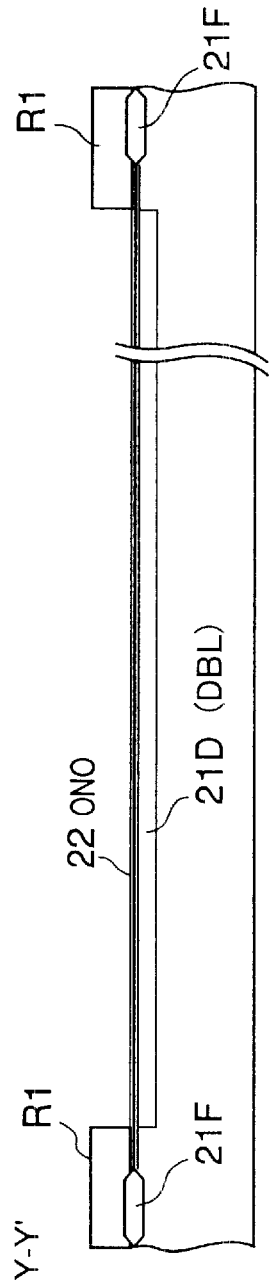
FIGS. 6A–6C are diagrams showing a second fabrication step of the conventional non-volatile semiconductor memory.
Figure 6C:
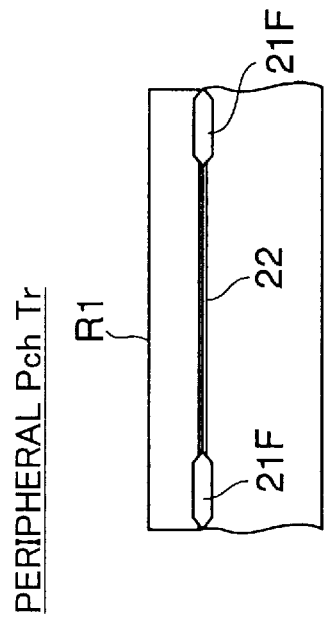
Figure 6B:
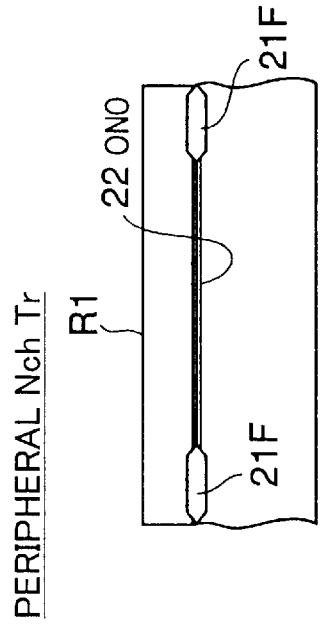
Figure 7A:
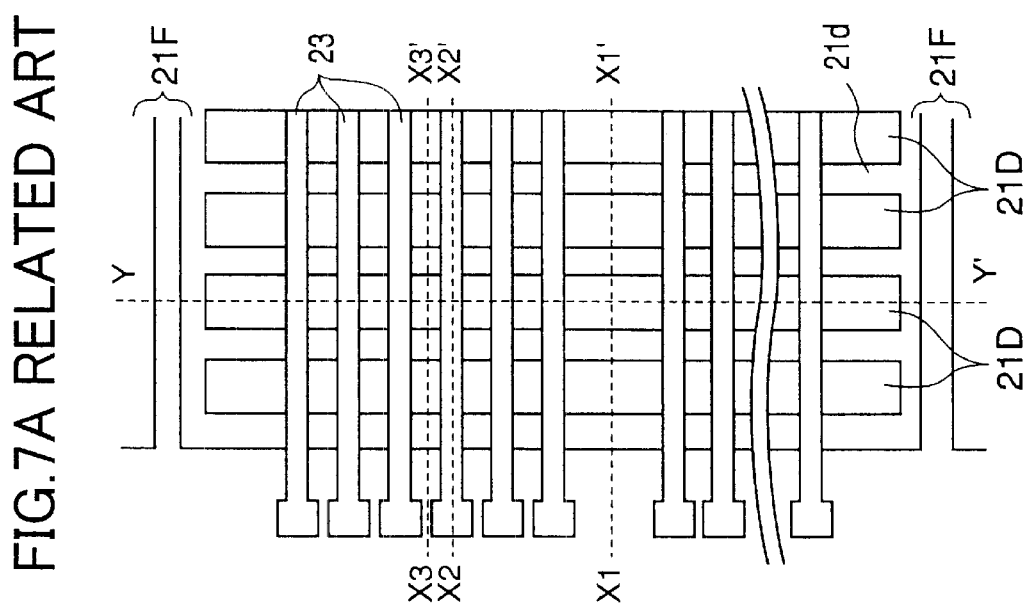
FIGS. 7A–7D are diagrams showing a third fabrication step of the conventional non-volatile semiconductor memory.
Figure 7B:
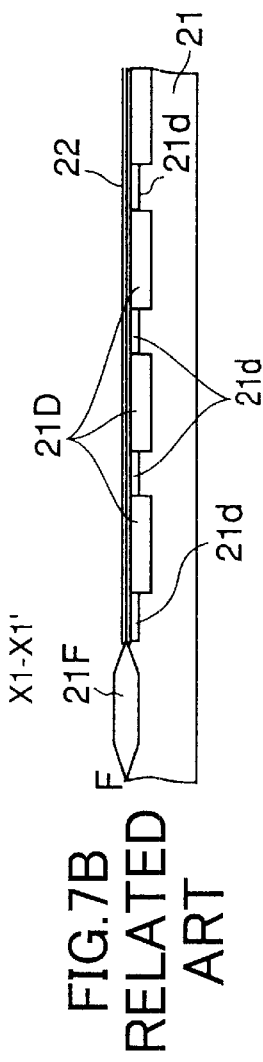
Figure 7C:
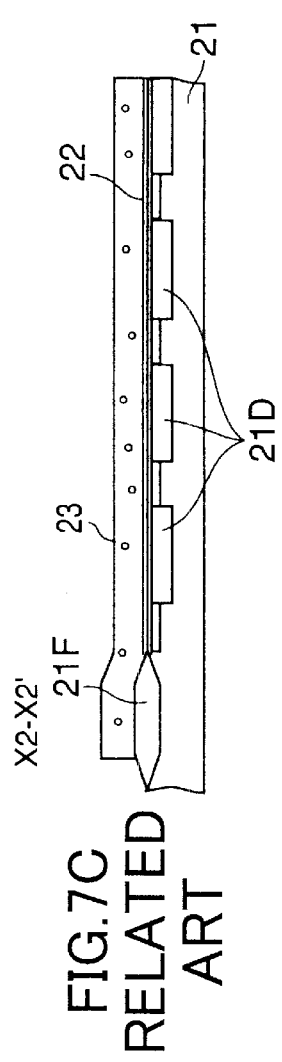
Figure 7D:
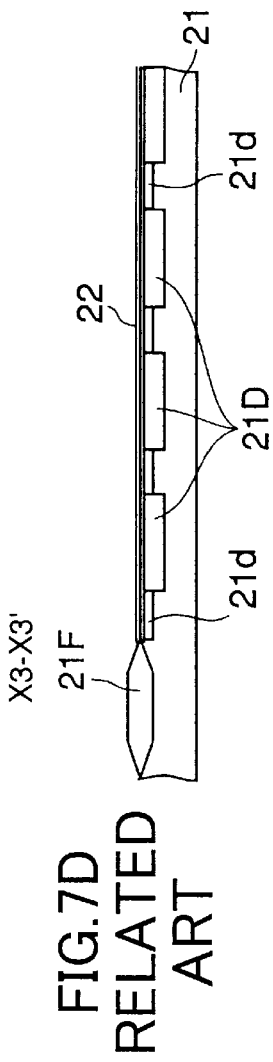
Figure 8A:
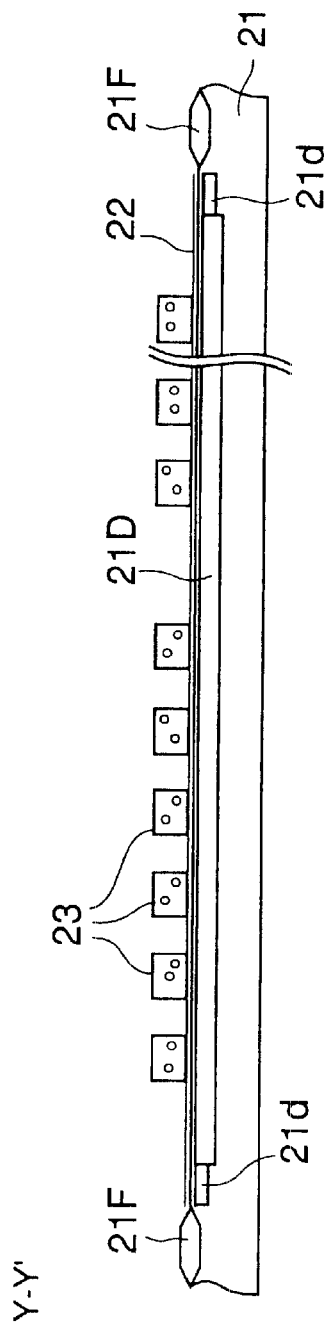
FIGS. 8A–8C are diagrams showing a fourth fabrication step of the conventional non-volatile semiconductor memory.
Figure 8C:
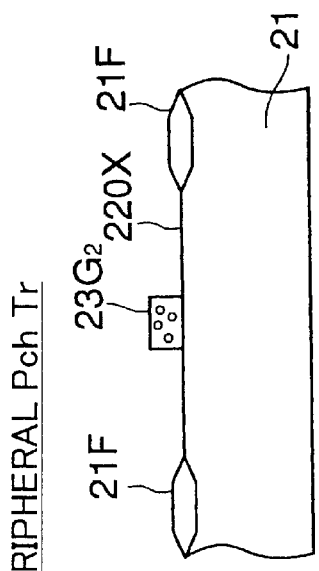
Figure 8B:
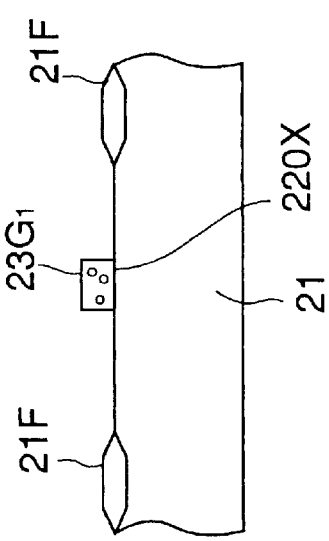
Figure 10A:
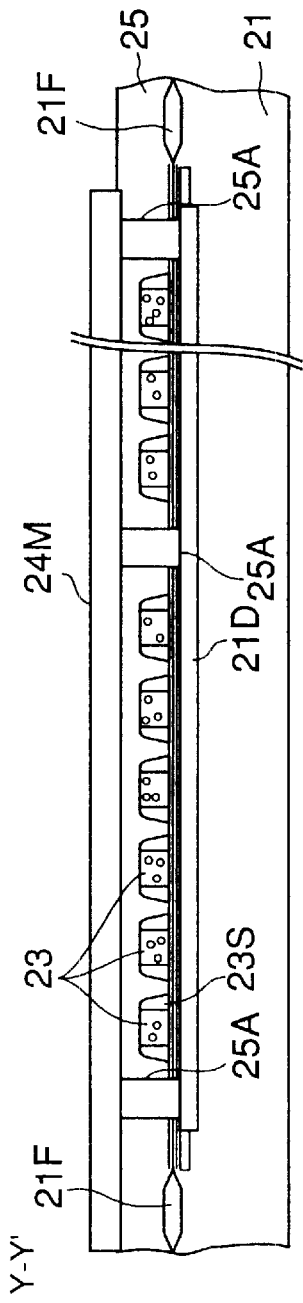
FIGS. 10A–10C are diagrams showing a sixth fabrication step of the conventional nonvolatile semiconductor memory.
Figure 10C:
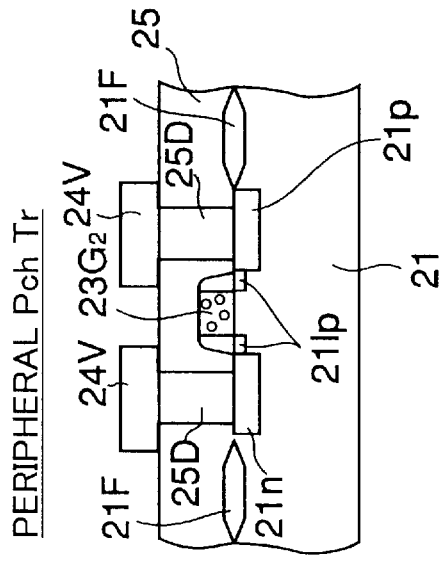
Figure 10B:
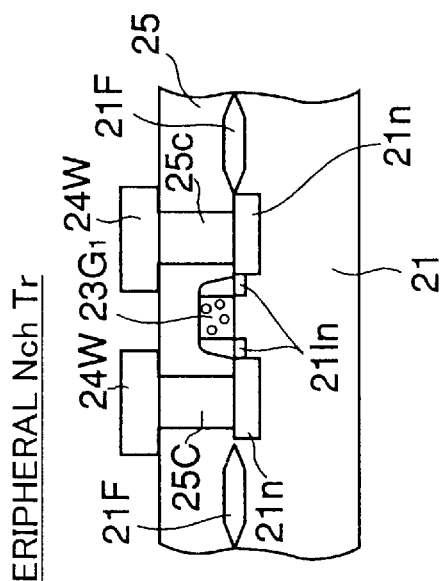
Figure 21A:
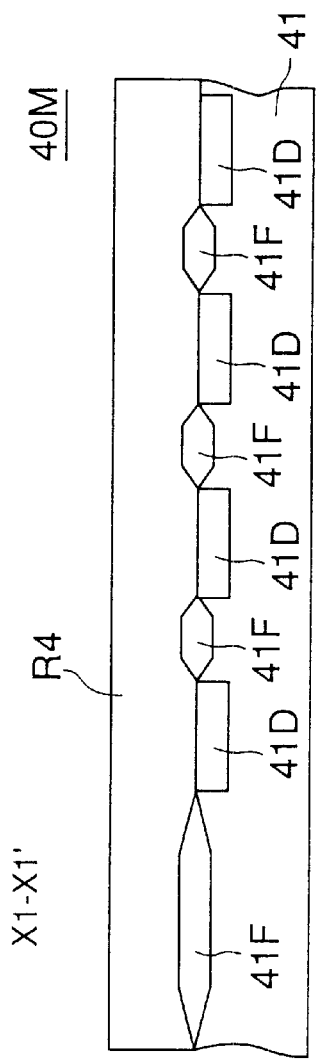
FIGS. 21A–21C are diagrams showing a seventh fabrication step of the non-volatile semiconductor memory by the first embodiment of this invention.
Figure 21B:
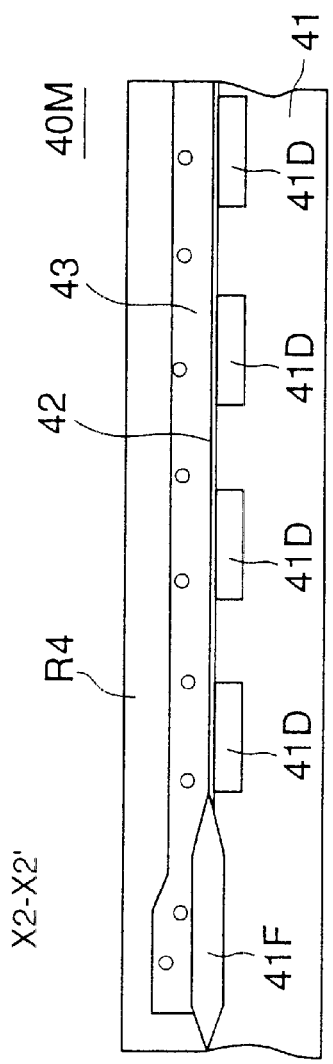
Figure 21C:
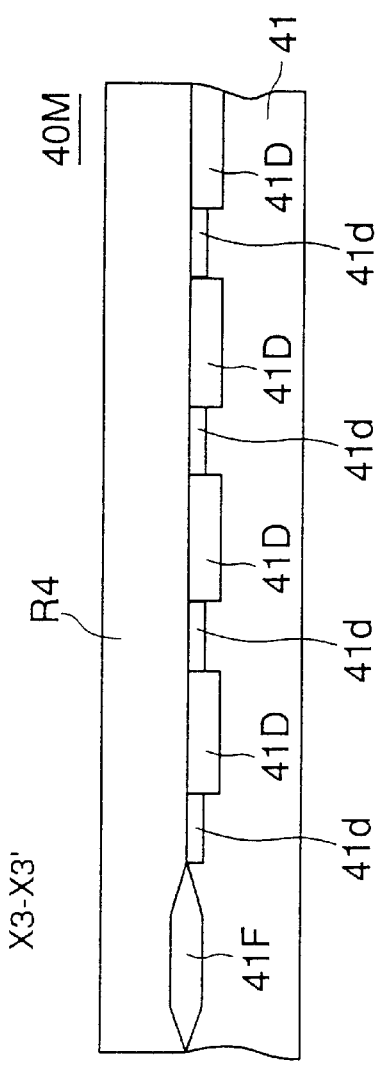

Hereinafter, description of a SONOS-type non-volatile semiconductor memory 40 according to a first embodiment of this invention will be made with reference to the drawings.

Reference is made to FIGS. 15A–15D, FIGS. 16A–16C, FIGS. 17A–17D, FIGS. 18A–18C, FIGS. 19A–19C, FIGS. 20A–20C, FIGS. 21A–21C, FIGS. 22A–22C, FIGS. 23A–23D, FIGS. 24A–24C, FIGS. 25A–25C, FIGS. 26A–26C, FIGS. 27A–27D, FIGS. 28A–28C, FIGS. 29A–29D, and FIGS. 30A–30C.

FIG. 15 (A) shows a memory cell region 40M formed in a non-volatile semiconductor memory 40 in a plan view, while FIG. 15B shows the memory cell region 40M in a cross-sectional diagram along a line $X_1$–$X_1'$ of in FIG. 15A. Further, FIG. 15C shows the memory cell region 40M in a cross-sectional view taken along a line $X_2$–$X_2'$ of FIG. 15A. Furthermore, FIG. 15D shows the memory cell region 40M in a cross-sectional view taken along a line $X_3$–$X_3'$ of FIG. 15A.

FIGS. 15A–15D are referred to.

A field oxide film 41F having a thickness of 200–500 nm is formed on a p-type Si substrate 41 so as to define an active region by a thermal oxidation processes conducted at 900–1000° C. Further, an ONO film 42 is formed on the active region.

More specifically, the surface of the Si substrate 41 exposed at the active region is subjected to a thermal oxidation process at 800–1100° C., and as a result, a first oxide film 5 is formed with a thickness of 5–10 nm. Furthermore, a CVD process is conducted on the first oxide film at 600–800° C., and a nitride film is deposited with a thickness of 12–16 nm, as a result. Further, a second oxide film is formed by applying a wet oxidation processes to the nitride film at 1000–1100° C. with a thickness of 5–10 nm.

In the process of FIG. 15A, a resist pattern $R_2$ having an opening corresponding to each of the data bit lines DBL is formed on the ONO film 42 thus formed. Furthermore As$^+$ ions are introduced into the Si substrate 41 through the foregoing resist opening by an ion implantation process conducted with a dose of $2 \times 10^{15}$–$5 \times 10^{15}$ cm$^{-2}$ under an accelerating voltage of 50–90 keV. As a result, a number of n-type bit-line diffusion regions 41D are formed in the Si substrate 41 parallel with each other in correspondence to data bit lines DBL.

FIG. 16A shows the cross-sectional diagram of the memory cell region 40M taken along a line Y—Y of FIG. 15A, while FIG. 16B shows the cross-sectional diagram of the n-channel peripheral transistor region formed in the peripheral circuit region 40P for the non-volatile semiconductor memory 40. Further FIG. 16C shows the cross-sectional diagram of the p-channel peripheral transistor region formed in the peripheral circuit region 40P of the non-volatile semiconductor memory 40.

FIG. 16A is referred to.

It can be seen that the bit-line diffusion region 41D extends in the active region, which is defined by a field insulation film 41F, in the extending direction of data bit line DBL continuously. On the other hand, as can be seen in FIGS. 16B and 16C, a p-channel transistor region of a peripheral circuit region 40P or an n-channel transistor region of the peripheral circuit region 40P are covered by a resist pattern $R_2$ in the state of FIG. 15A. Thus, no ion implantation occurs into substrate in the peripheral circuit region 40P.

As can be seen from the plan view of FIG. 15A, the bit-line diffusion region 41D extends in the direction parallel to the line Y–Y', and the tip end part of the bit-line diffusion region 41D reaches an opening formed in the field insulation film 41F in correspondence to each of the bit-line diffusion regions 41D. It should be noted that the opening forms a part of the active region defined in the memory cell region 40M.

As will be understood from the cross-sectional diagram of FIG. 15B, each field insulation film 41F extending in the memory cell region 40M divides two active regions from each other. In such a part, it can be seen that the field insulation film 41F is divided into plural parts by such an openings.

Next the resist pattern $R_2$ is removed in the process of FIGS. 17A–17D, and plural polysilicon word line electrodes 43 are formed on the Si substrate 41 in a direction generally perpendicular to the extending direction of the diffusion regions 41D. It should be noted that FIG. 17A shows the non-volatile semiconductor memory 40 in plan view. Further, FIGS. 17B–17D show a cross-sectional diagram of the non-volatile semiconductor memory 40 taken along the lines $X_1$–$X_1'$, $X_2$–$X_2'$, and $X_3$—$X_3$ of FIG. 17A, respectively. As shown in FIG. 17B, a SiN anti-reflection film 43R is formed on a word line electrode 43.

FIG. 18A shows the cross-sectional diagram along the line Y–Y' of FIG. 17A.

FIG. 18A is referred to.

It can be seen that the word line electrodes 43 are formed repeatedly at a regular interval on the ONO film 42.

In the process of FIG. 17A, the ONO film 42 is removed by a mask process in the region of the peripheral transistor after removal of the resist pattern $R_2$ but prior to the formation of word line electrode 43. Furthermore, a thermal oxidation processes of 800–1100° C. is conducted. Thus, a thermal oxide film 42ox shown in FIGS. 18B and 18C is formed typically with a thickness of 5–15 nm It should be noted that the ONO film 42 is already formed in the memory cell region M. Therefore, formation of new oxide film does not result substantially even if such a thermal oxidation process is applied. In the event more thickness is necessary for the thermal oxide film, it is possible to remove the oxide film only in the thin film region by an etching process while using a resist pattern. Thereafter, the thermal oxide film is grown once again.

Furthermore, as shown in FIGS. 18B and 18C, gate electrodes 43G1$_1$ and 43G$_2$ are formed on thermal oxide film 42ox thus formed in the peripheral circuit region of the non-volatile semiconductor memory 40, substantially simultaneously to the formation of the word line electrode 43.

Next, in the step of FIGS. 19A–19C, B$^+$ ions are introduced into the structure of FIG. 17A by an ion implantation process conducted with a dose of $3 \times 10^{12}$–$1 \times 10^{13}$ cm$^{-2}$ under accelerating voltage of 50–80 keV. As a result, a channel-stop diffusion region 41d is formed between a pair of bit-line diffusion regions 41D as shown in FIG. 19C. Such a channel-stop diffusion region 41d is formed also on the surface of bit-line diffusion region 41D as can be seen in the cross-sectional view of FIGS. 19A or 19C. Because the B concentration level in the channel-stop diffusion region 41d is very small, smaller by a factor of $10^2$ as compared with the As concentration level in the bit-line diffusion region 41D, illustration of the channel-stop diffusion region is omitted.

Associated with the ion implantation process of FIGS. 19A–19C, ion implantation of the B$^+$ mions is conducted also in the cross-section Y–Y' of FIG. 17A, as shown in FIG. 20A. As represented in FIGS. 20B and C, a resist pattern R$^3$ is formed on the peripheral circuit region 40P during the foregoing ion implantation of B$^+$. Thus, no ion implantation of B$^+$ takes place in the peripheral circuit region 40P.

Figure 22A:
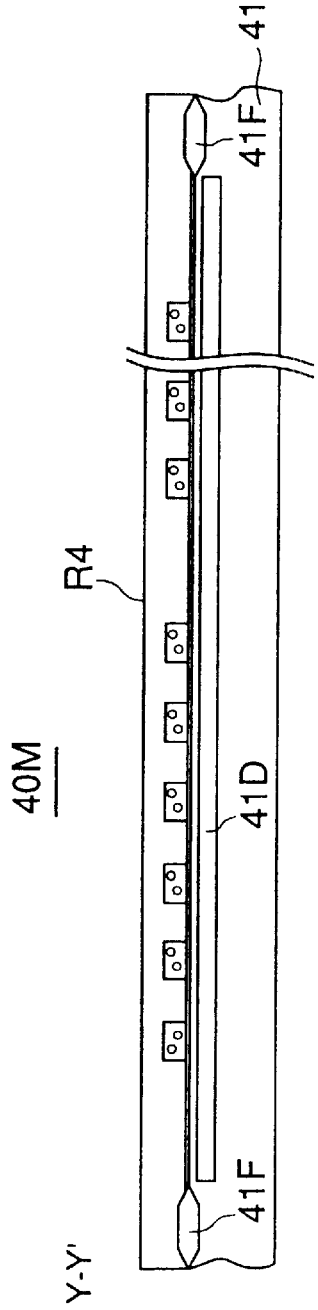
FIGS. 22A–22C are diagrams showing an eighth fabrication step of the non-volatile semiconductor memory of the first embodiment of this invention.
Figure 22C:
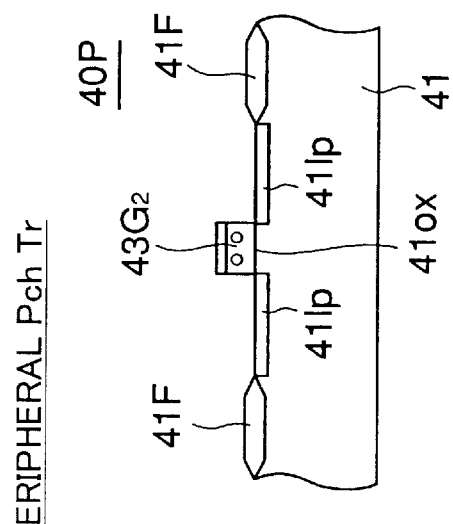
Figure 22B:
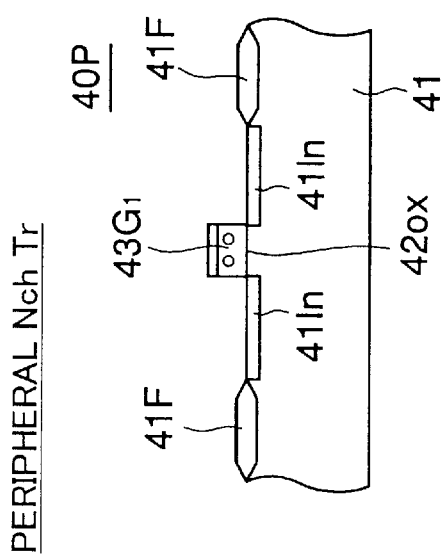
Figure 25A:
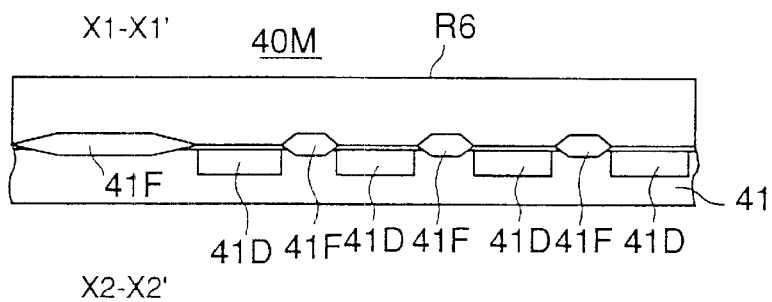
FIGS. 25A–25C are diagrams showing an eleventh fabrication step of the non-volatile semiconductor memory of the first embodiment of this invention.
Figure 25B:
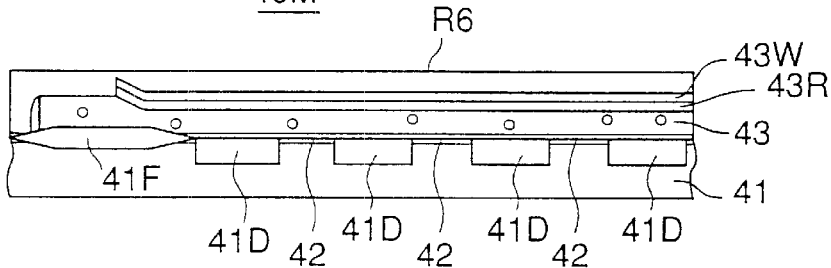
Figure 25C:
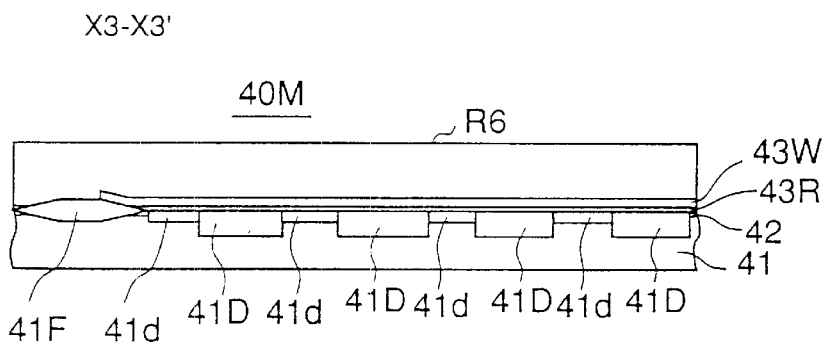
Figure 28A:
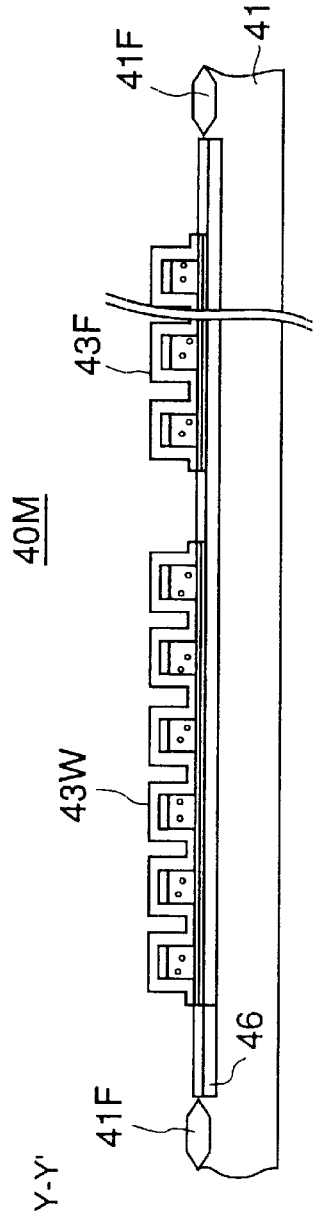
FIGS. 28A–28C are diagrams showing a fourteenth fabrication process of the non-volatile semiconductor memory of the first embodiment of this invention.
Figure 28C:
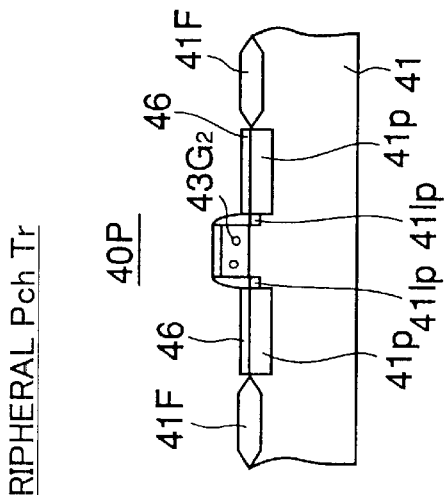
Figure 28B:
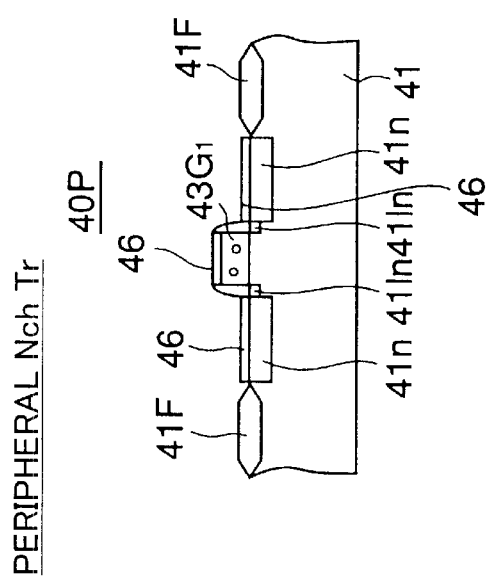
Figure 29B:
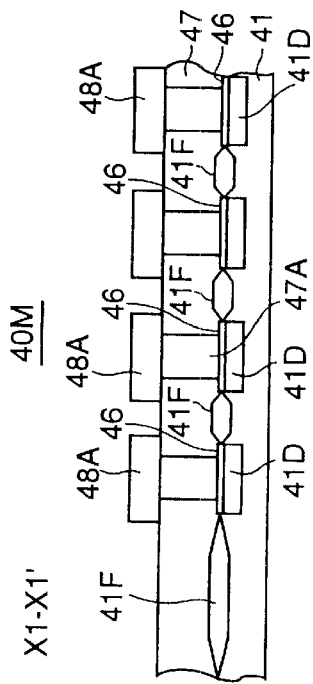
FIGS. 29A–29D are diagrams showing a fifteenth fabrication step of the non-volatile semiconductor memory of the first embodiment of this invention.
Figure 29C:
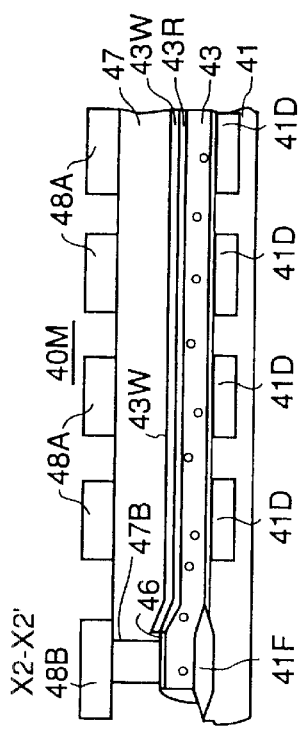
Figure 29D:
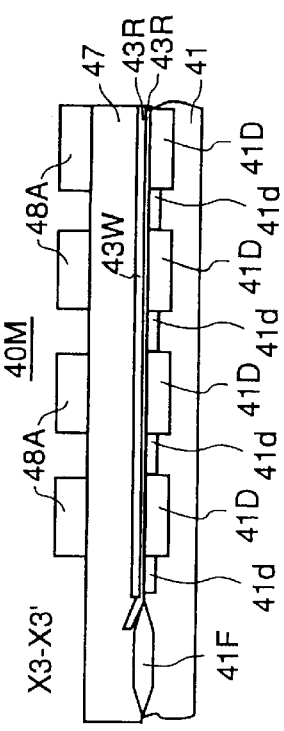
Figure 29A:
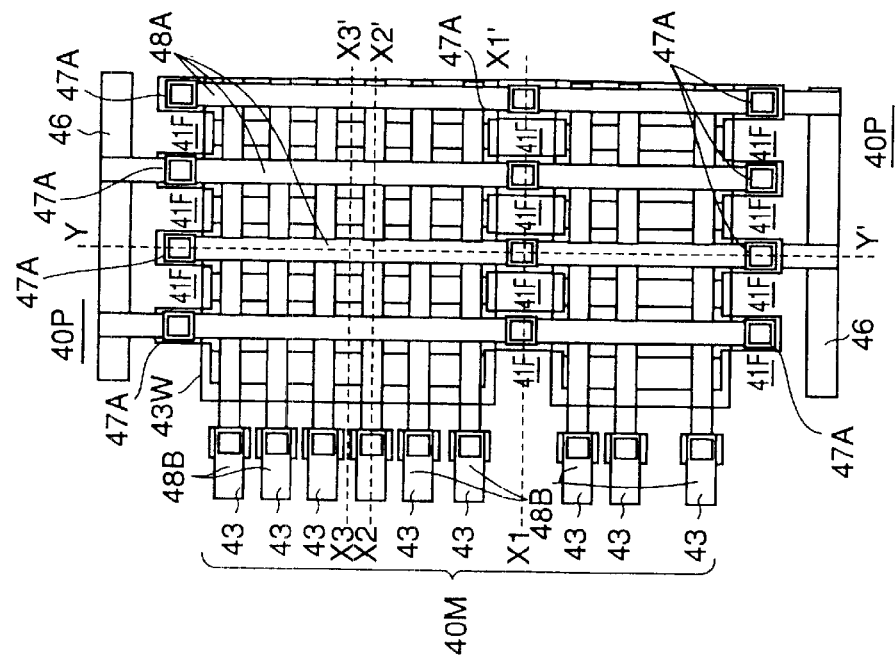

Next, a resist pattern $R_4$ is formed on the Si substrate 41 in the step of FIGS. 21A–21C and FIG. 22A, such that the resist pattern $R_4$ covers the memory cell region. By conducting an ion implantation process of an n-type impurity element or a p-type impurity element in this state, diffusion regions 41$_{In}$ or 41$_{Ip}$ are formed at both lateral sides of the gate electrode 43G$_1$ or 43G$_2$ in the peripheral circuit region, as shown in FIGS. 22B and 22C. It should be noted that, during the ion implantation process of the n-type impurity element, the p-type transistor region is covered with a resist pattern. Similarly, the n-type transistor region is covered by a resist pattern during the ion implantation process of the p-type impurity element.

Next, in the process of FIGS. 23A–23D and FIGS. 24A–24C, an oxide film 43W is deposited on the Si substrate 41 with a generally uniform thickness of 100–200 nm by a CVD process. Further, an anisotropic etching acting generally perpendicularly to the principal surface of the substrate 41is is applied while using a resist pattern $R_5$ that selectively covers the active region as a mask. As a result, the oxide film 43W is patterned. As shown in FIGS. 23B and 23C, sidewall insulation films $43W_1$ and $43W_2$ are formed also on both sidewall surfaces of the gate electrodes $43G_1$ $43G_2$, respectively.

A shown in FIG. 23B, the sidewall insulation film is formed also at the tip end part of the word line electrode 43 as a result of such anisotropic etching process. As will be understood from FIG. 23B, the resist pattern $R_5$ exposes the tip end part of word line electrode 43. Because of this, the oxide film 43W is removed in such a tip end part of word line electrode 23, and the SiN anti-reflection film 43R is exposed.

As can be seen in FIG. 24A, the oxide film 43W is covered by the resist pattern $R_5$ in the active region of memory cell region 40M during the anisotropic etching process. Therefore, the oxide film 43W is not etched by the anisotropic etching process. Thus, as shown in FIGS. 23C and 23D or in FIG. 24A, the oxide film 43W covers the active region continuously even at the stage in which the sidewall insulation films $43W_1$ and $43W_2$ are formed in the peripheral circuit region 40P. On the other hand, the oxide film 43W is not formed at the tip end part of the bit-line diffusion region 41D that invades into the opening of the field insulation film 41F that is located outside the active region, in the state of FIGS. 23A–23D, as shown in FIG. 23B. Thus, the ONO film 42 is exposed as a result of removal of the uppermost oxide film by the anisotropic etching process.

Next, the memory cell region 40M is covered by a resist pattern $R_6$ in the process of FIGS. 25A–25C or FIGS. 26A–26C and an ion implantation of an n-type impurity element or p-type impurity element is conducted into the peripheral circuit region 40P while using the gate electrodes $43G_1$ and $43G_2$ and the sidewall insulation films $43W_1$ and $43W_2$ as a mask. Thus, n-type diffusion regions 41n are formed outside the sidewall insulation films $43W_1$ and p-type diffusion regions 41p are formed outside the sidewall insulation films $43W_2$. It should be noted that, during the ion implantation process of the n-type impurity element, the p-type transistor region is covered with a resist pattern. During the ion implantation process of the p-type impurity element, the n-type transistor region is covered with a resist pattern.

Next, the resist pattern $R_6$ is removed in the process of FIGS. 27A–27D. Furthermore, the SiN anti-reflection film 43R on the exposed edge part of the word line electrode 43 (see FIG. 23C) and the SiN film 43R on the gate electrodes $43G_1$ and $43G_2$, and the SiN film that constitutes the ONO film exposed at the opening of the field insulation film 41F outside the active region, are removed by a high-temperature phosphoric acid treatment. Further, the $SiO_2$ film of the ONO film 42 exposed at the opening of the field insulation film outside the active region is removed by a HF treatment.

Further, on the Si substrate 41 thus processed, a Co film and a TiN film are formed by a sputtering process with respective thicknesses of 5–10 nm and 20–50 nm, followed by a rapid thermal annealing process conducted at 450–550° C. As a result, a CoSi layer 46 is formed in a self-aligned manner on the exposed part of the gate electrodes $43G_1$ and $43G_2$ and further on the exposed part of the diffusion regions 41n and 41p. Further, the CoSi layer 46 is formed on the bit-line diffusion region 41D of the word line electrode 43.

As shown in FIGS. 27A–27D and FIGS. 28A–28C, the surface of the Si substrate 41 is covered by the field insulation film 41F or by the oxide film 43W except for the region in which the silicide layer is to be formed. Therefore, it should be noted that the mask process for defining the silicide region is unnecessary in the present invention.

Figure 30A:
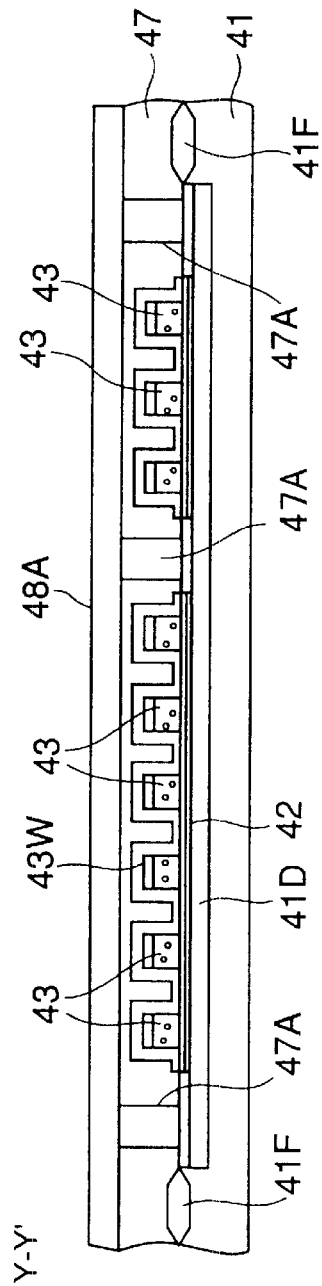
FIGS. 30A–30C are diagrams showing a sixteenth fabrication step of the non-volatile semiconductor memory of the first embodiment of this invention.
Figure 30C:
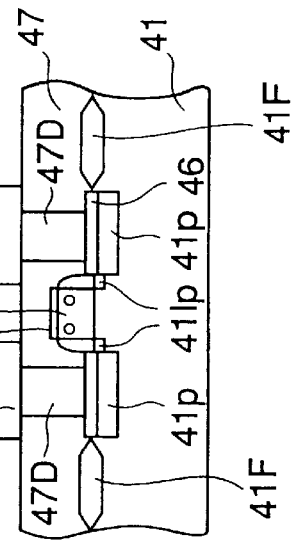
Figure 30B:
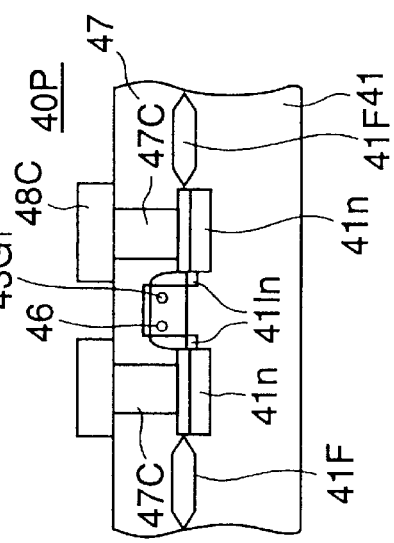

Next, in the step of FIGS. 29A–29D and FIGS. 30A–30C, an interlayer insulation film 47 is deposited on the construction of FIGS. 27A–27D. Furthermore, a contact hole 47A is formed in the interlayer insulation film in correspondence to the bit-line diffusion region 41D. Further, a contact hole 47B is formed in correspondence to the edge part of the word line electrode 43. Furthermore, a contact hole 47C is formed in correspondence to the diffusion region 41n in the peripheral circuit region 40P. Reference is made to FIGS. 30B and 30C. Further, a contact hole 47D is formed in correspondence to the diffusion region 41p. These contact holes expose the CoSi film 46 that covers the respective contact regions.

In this embodiment, the CoSi film 46 thus exposed is further subjected to an oxide removal process conducted by a dry etching process. Further, a metal film is deposited on the interlayer insulation film 47 so as to fill the contact holes 47A–47D. By patterning the metal film thus deposited, wiring patterns 48A–48D are formed in the bit-line diffusion region 41D. Further, the wiring pattern 48 is formed to at the edge part of the word line electrode 43. Furthermore, wiring pattern 48 is formed in the diffusion region 41n of the n-channel peripheral transistor. Also, the wiring pattern is formed in correspondence to the diffusion region 41p of the p channel MOS transistor.

The Si surface is covered with a silicide film 46 in the contact hole formation region in the non-volatile semiconductor memory 40 of this embodiment, in any of the memory cell region 40M and the peripheral circuit region 40P. Because of this, the Si surface is not etched or attacked even if the oxide removal process is applied by a dry etching process. Also, the present embodiment causes a decrease of contact resistance by forming the low-resistance silicide film 46 on the surface of the contact region. Thereby, the operational speed of the non-volatile semiconductor memory device is improved. It should be noted that it is not necessary to use a mask process during the step of formation of the silicide film 46, contrary to the example of FIGS. 13A–13D. Therefore, there occurs no problem of mask alignment error, and the integration density of the non-volatile semiconductor memory device can be improved.

[Second Embodiment]

Next, a SONOS-type non-volatile semiconductor memory 60 according to a second embodiment of this invention will be described along with the fabrication process thereof with reference to FIGS. 31A–31C, FIGS. 32A–32C, FIGS. 33A–33D, FIGS. 34A–34C, FIGS. 35A–35C, FIGS. 36A–36C, FIGS. 37A–37C, FIGS. 38A–38C, FIGS. 39A–39D, FIGS. 40A–40C, FIGS. 41A–41C, FIGS. 42A–42D, FIGS. 43A–43D, FIGS. 44A–44C, FIGS. 45A–45C, FIGS. 46A–46D and FIGS. 47A–47C.

FIGS. 31A–31D are referred to.

FIG. 31A shows a memory cell region 60M formed in the non-volatile semiconductor memory 60 in a plan view, while FIG. 31B shows the cross-sectional diagram of the memory cell region 60M taken along the line $X_1$–$X_1'$ of FIG. 31A. Further, FIG. 31C shows the memory cell region 60M in a cross-sectional diagram taken along the line $X_2$–$X_2'$ of FIG. 31A. Furthermore, FIG. 31D shows the cross-sectional diagram of the memory cell region 60M taken along the line $X_3$–$X_3'$ of FIG. 31A.

FIGS. 31A–31D is referred to.

A field oxide film 61F is formed on a p-type Si substrate 61 with a thickness of 200–500 nm by a thermal oxidation processes at 900~1000° C. so as to define an active region. Further, an ONO film 62 is formed on the active region thus defined.

More specifically, a thermal oxidization process is applied to the surface of the Si substrate 61 at the exposed part thereof in correspondence to the active region at the temperature of 800–1100° C. As a result, a first oxide film is formed with a thickness of 5–10 nm.

Next, a CVD process is conducted on the first oxide film at 600–800° C., and a nitride film having a thickness of 12–16 nm is deposited on the first oxide film. Furthermore, a second oxide film is formed by a wet oxidation processes at 1000–1100° C. with a thickness of 5–10 nm on the nitride film.

In the process of FIG. 31A, a resist pattern $R_{11}$ having an opening corresponding to each of the data-bit lines DBL is formed on the ONO film 62 thus formed. Furthermore, $As^+$ ions are introduced into the Si substrate 61 through a resist opening by an ion implantation process with a dose of $2\times10^{15}$–$5\times10^{15}$ cm$^{-2}$ under an acceleration voltage of 90 keV. In this way, a large number of n-type bit-line diffusion regions 61D are formed in the Si substrate 61 in correspondence to the data-bit lines DBL in a mutually parallel relationship.

Figure 32A:
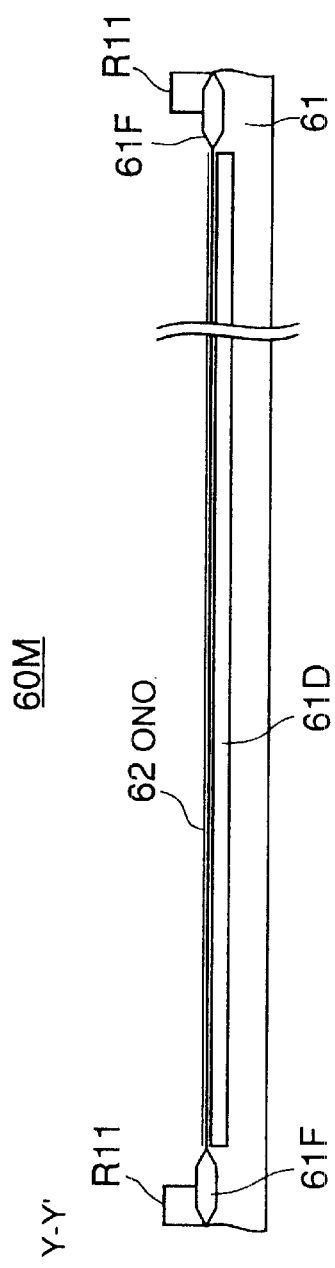
FIGS. 32A–32C are diagrams showing a second fabrication step of the non-volatile semiconductor memory of the second embodiment of this invention.
Figure 32C:
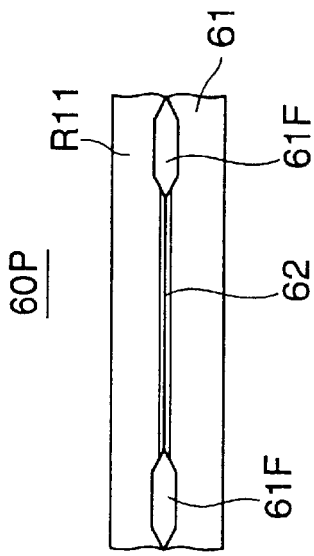
Figure 32B:
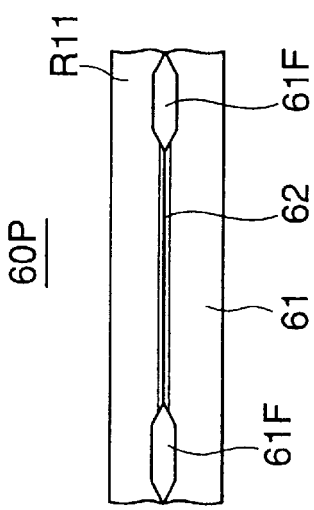

FIG. 32A shows the memory cell region 60M in a cross-sectional view taken along the line Y–Y' of FIG. 31A, while FIG. 32B shows the cross-sectional diagram of the n-channel peripheral transistor region formed in a peripheral circuit region 60P of the non-volatile semiconductor memory 60. Further, FIG. 32C shows the cross-sectional diagram of the p-channel peripheral transistor region in the peripheral circuit region 60P of the non-volatile semiconductor memory 60.

FIG. 32A is referred to.

From FIG. 32(A), it can be seen that the bit-line diffusion region 61D extends through the active region defined by the field insulation film 61F in the extending direction of data the bit lines DBL continuously. On the other hand, from FIGS. 32B and 32C, it can be seen that the p-channel transistor region or the n-channel transistor region is covered by a resist pattern $R_{11}$ in the state of FIG. 31A. Thus, there occurs no ion implantation into the substrate in the n-channel transistor region or in the p-channel transistor region.

The plan view of FIG. 31A is referred to.

It can be seen that each bit-line diffusion region 61D extends in the direction parallel to the line Y–Y', and the tip end part of the diffusion region 61D reaches a corresponding opening formed in the field insulation film 61F in correspondence to the bit-line diffusion regions 61D. It should be noted that field insulation film 61F defines the active region in the memory cell region 60M. Also, it can be seen from the cross-sectional diagram of FIG. 31B that the field insulation film 61F is divided into plural parts in the memory cell region 60M by such an opening. The field insulation film 61F formed as such divides the active region into two active regions.

Figure 33A:
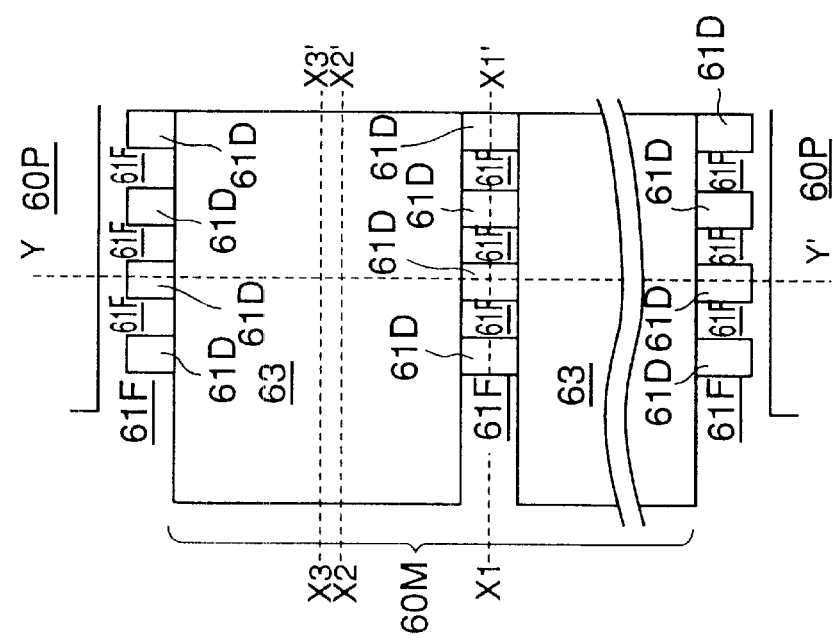
FIGS. 33A–33D are diagrams showing a third fabrication step of the non-volatile semiconductor memory of the second embodiment of this invention.
Figure 33B:
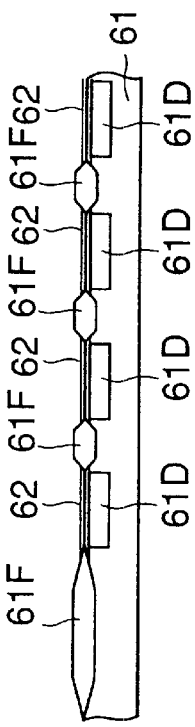
Figure 33C:
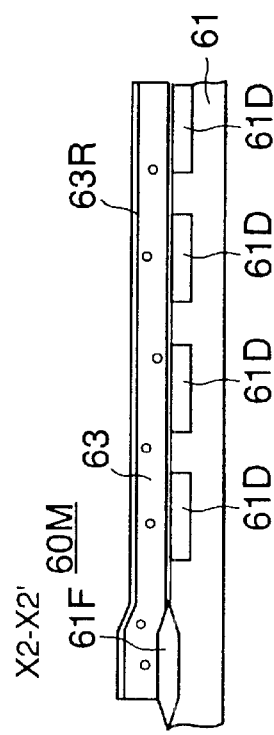
Figure 33D:
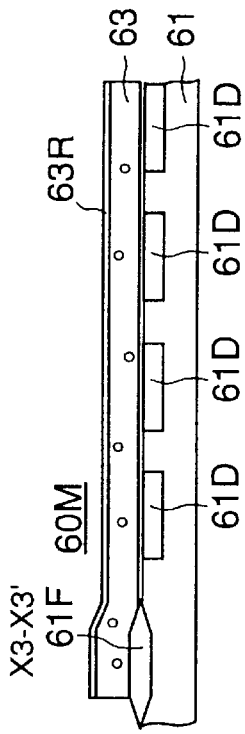
Figure 34A:
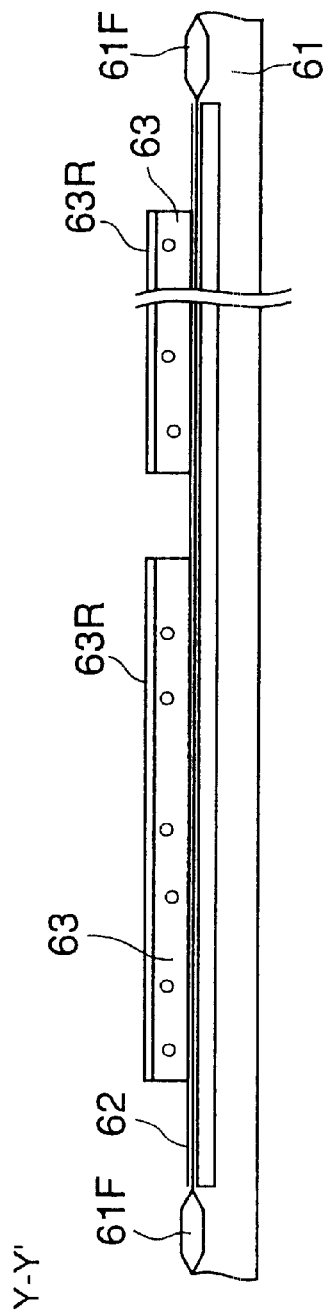
FIGS. 34A–34C are diagrams showing a fourth fabrication process of the non-volatile semiconductor memory of the second embodiment of this invention.
Figure 34C:
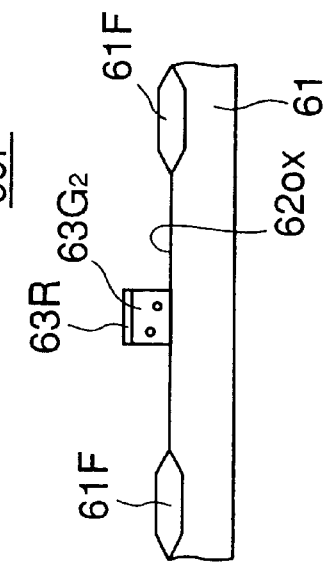
Figure 34B:
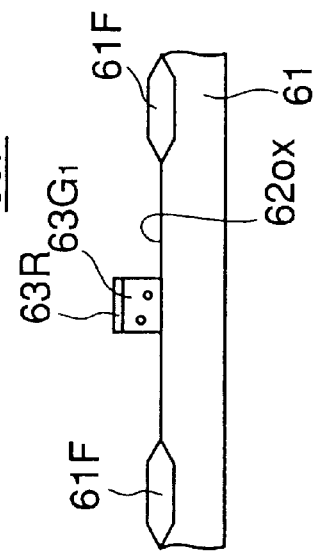
Figures 37A, 37B, 37C:
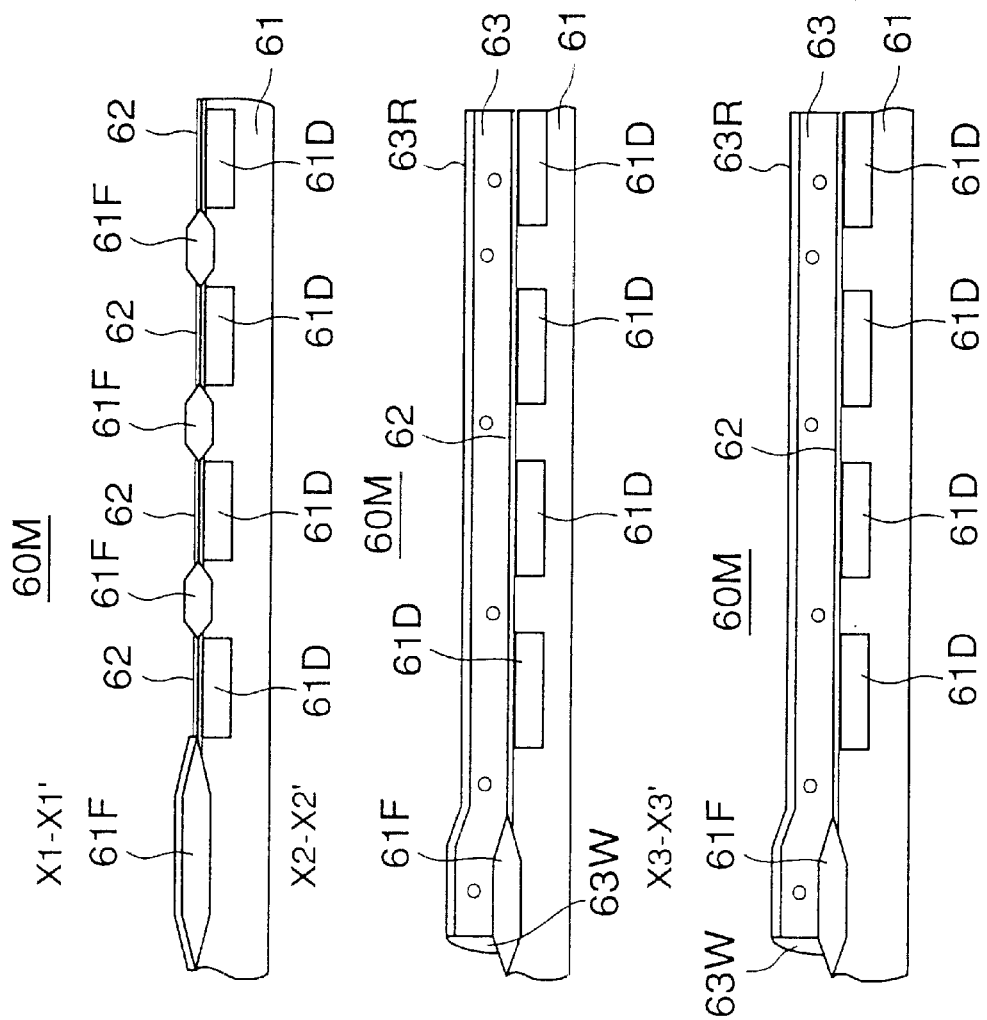
FIGS. 37A–37C are diagrams showing a seventh fabrication step of the non-volatile semiconductor memory of the second embodiment of this invention.
Figure 41A:
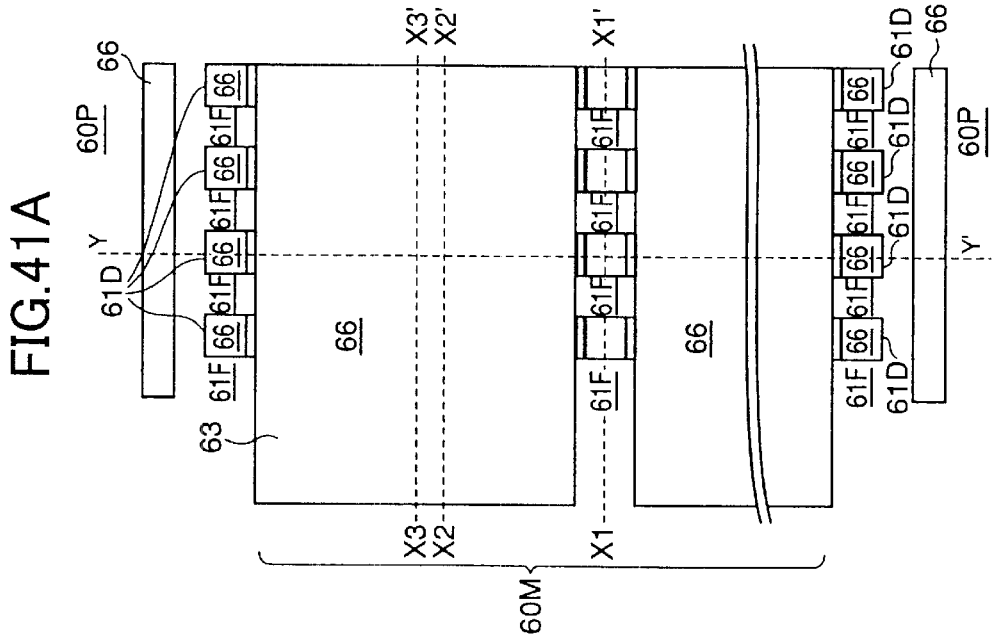
FIGS. 41A–41D are diagrams showing an eleventh fabrication step of the non-volatile semiconductor memory of the second embodiment of this invention.
Figure 41B:
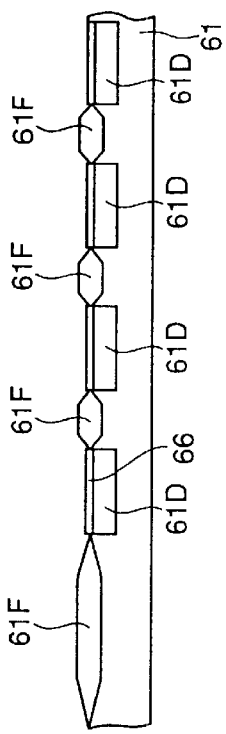
Figure 41C:
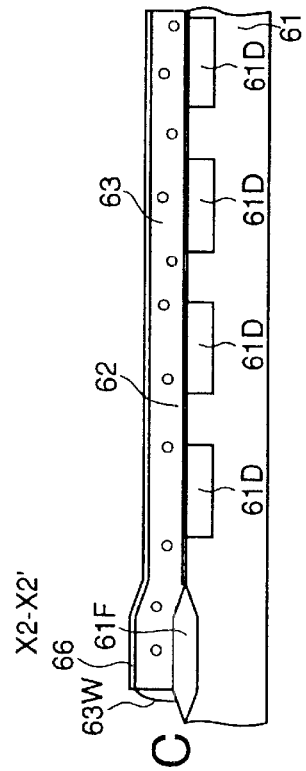
Figure 41D:
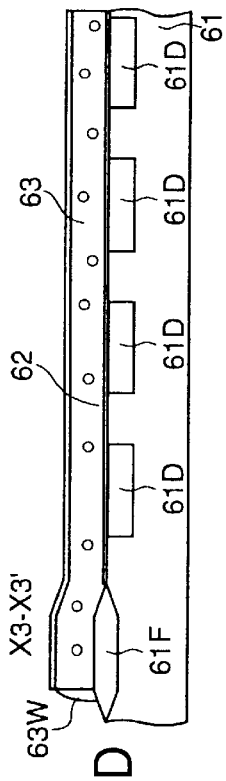
Figure 42A:
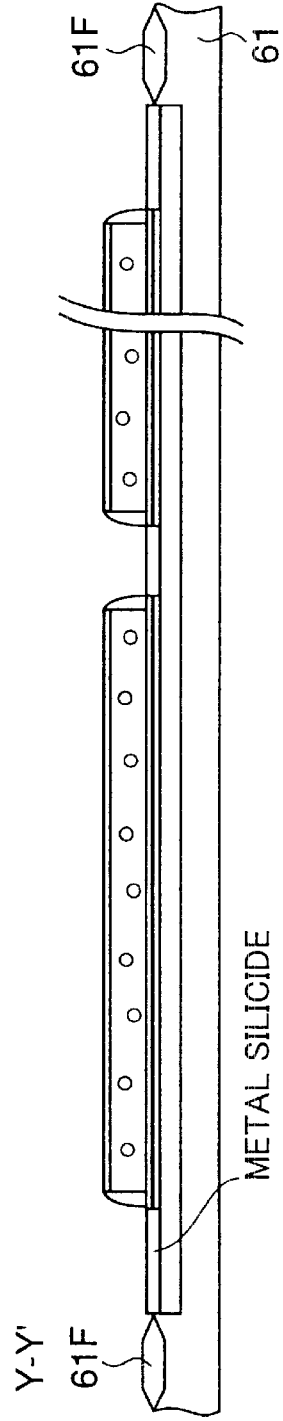
FIGS. 42A–42C are diagrams showing a twelfth fabrication step of the non-volatile semiconductor memory of the second embodiment of this invention.
Figure 42B:
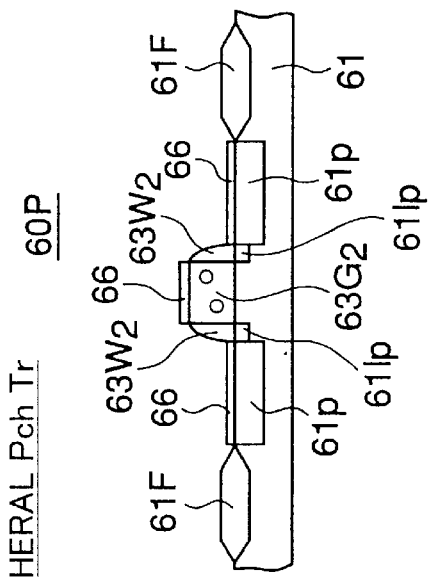
Figure 42C:
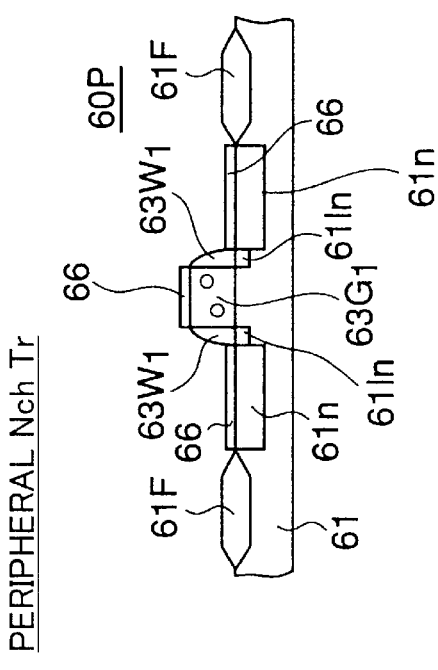

Next, the process of FIGS. 33A–33D and FIGS. 34A–34C is conducted in which the ONO film 62 in the peripheral circuit region 60P is removed at first. Further, a thermal oxidation process is conducted and a thermal oxide film 62ox is formed on the peripheral circuit region 60P as shown in FIGS. 34B and 34C. Next, an amorphous silicon layer 63 doped with P to a carrier density of $2\times10^{20}$–$3\times10^{21}$ cm$^{-3}$ is formed by a CVD process with a thickness of 100–500 nm such that the amorphous silicon layer 63 covers the active region of the memory cell region 60M continuously.

Simultaneously, amorphous silicon gate electrodes $63G_1$ and $63G_2$ of the same composition are formed on the peripheral circuit region 60P as shown in FIGS. 34B and 34C. In FIGS. 34B and 34C, it can be seen that an SiN anti-reflection film 63R is formed on the amorphous silicon gate electrodes $63G_1$ and $63G_2$. It should be noted that the anti-reflection film 63R has been used in the patterning process of the amorphous gate electrodes $63G_1$ and $63G_2$. The same anti-reflection film 63R is formed also on the amorphous silicon layer 63 in the memory cell region 60M.

FIGS. 33A and 33B and FIG. 34A are referred to.

The amorphous silicon layer 63 is not formed on the edge part region of the bit-line diffusion region 61D that invades into the opening of the field oxide film 61F. Thus, the ONO film 62 is exposed in the memory cell region 60M in the state of FIGS. 33A–33D and FIGS. 34A–34C at the edge part region of the bit-line diffusion region 61D formed adjacent to the amorphous silicon layer 63.

Next, the process of FIGS. 35A–35C and FIGS. 36A–36C are referred to.

In this step, the memory cell region 40M is covered by a resist pattern $R_{12}$ and an ion implantation process of an n-type impurity element and an ion implantation process of a p-type impurity element are carried out in the peripheral circuit region 40P. As a result, as shown in FIGS. 36B and 36C, n$^-$-type LDD region $61_{ln}$ is formed in the Si substrate 61 at both lateral sides of gate electrode $63G_1$. Further, a p$^-$-type LDD region $61_{pn}$ is formed at both lateral sides of gate electrode $63G_2$. It should be noted that, during the injection of the n-type impurity ions, the p-type transistor region is covered with a resist pattern. Also, during the injection of the p-type impurity ions, the n-type transistor region is covered with a resist pattern.

Next, the resist pattern $R_{13}$ is removed in the process of FIGS. 37A–37C and FIGS. 38A–38C. Furthermore, an SiN film or $SiO_2$ film is formed on the structure thus formed with a uniform thickness of 100–200 nm by a CVD process. Further, an etch-back process is applied by an anisotropic etching process that acts in the direction generally perpendicularly to the principal surface of the substrate 61, and a sidewall insulation film 63W is formed on the sidewall surface of the amorphous silicon layer 63 in the memory cell region 60M. Simultaneously, a sidewall insulation film 63W1 is formed on both sidewall surfaces of the gate electrode $63G_1$ the in peripheral circuit region 60P. Furthermore, a sidewall insulation film $63W_2$ is formed on both sidewall surfaces of the gate electrode $63G_2$.

Next, in the step of FIGS. 39A–39C and FIGS. 40A–40C, the memory cell region 60M is covered by a resist pattern $R_{13}$, and an ion implantation process of an n-type impurity element or p-type impurity element is carried out into the peripheral circuit region 60P of the Si substrate 61, while using the gate electrodes $63G_1$ and $63G_2$ and the sidewall insulation films $63W_1$ and $63W_2$ as mask as shown in FIGS. 40B and 40C. As a result, an n$^+$-type diffusion region 61n is formed outside the sidewall insulation film $63W_1$ in the peripheral circuit region 60P as shown in FIG. 40B. Further, a p$^+$-type diffusion region 61p is formed outside the sidewall insulation film $63W_2$ as shown in FIG. 40C. It should be noted that, during the ion implantation process of the n-type impurity element, the p-type transistor region is covered with a resist pattern. Further, during the ion implantation process of the p-type impurity element, the n-type transistor region is covered with a resist pattern.

Next, the resist pattern $R_{13}$ is removed in the process of the FIGS. 41A–41D and FIGS. 42A and 42B, and a high-temperature phosphoric acid treatment and an HF treatment is applied to the structure thus obtained. As a result, the SiN anti-reflection film is removed from the surface of the amorphous silicon film 63. Simultaneously, the exposed ONO film 62 is removed.

Next, in the step of FIGS. 41A–41D and FIGS. 42A and 42B, a Co layer and a TiN layer are formed consecutively on the structure thus obtained by way of a sputtering process with respective thicknesses of 5–10 nm and 20–50 nm. Thereafter, a rapid thermal annealing process is applied at 450–550° C. As a result, a CoSi layer 66 is formed uniformly on the amorphous silicon layer 63. It should be noted that the CoSi layer 66 is formed simultaneously on the exposed edge part of the bit-line diffusion region 61D, the gate electrodes 63G$_1$ and 63G$_2$ of the peripheral transistor, and further on the surface of the diffusion regions 61n and 61p.

Next, an SiN anti-reflection film 63R$_2$ is formed by a plasma CVD process in the step of FIGS. 43A–43D and FIGS. 44A and 44B with a thickness of 60–100 nm. Further, a patterning process is conducted by a photolithographic process, and a word line electrode 63 is formed on the memory cell region 60M so as to cross the bit-line diffusion region 61D. The word line electrode 63 thus formed carries thereon the CoSi layer 66.

In the photolithographic process of FIGS. 43A–43D and FIGS. 44A and 44B, it should be noted that the peripheral circuit region 60P is covered with the resist film. Thus, there occurs no patterning in the peripheral circuit region 60P.

Figure 44A:
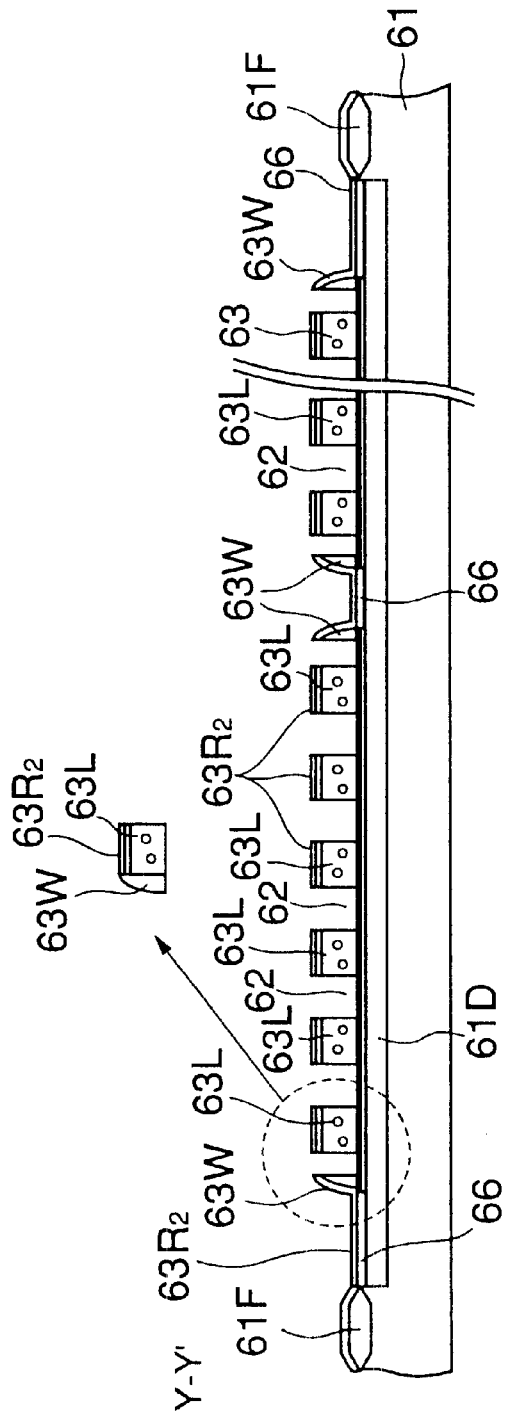
FIGS. 44A–44C are diagrams showing a fourteenth fabrication step of the non-volatile semiconductor memory of the second embodiment of this invention.
Figure 44C:
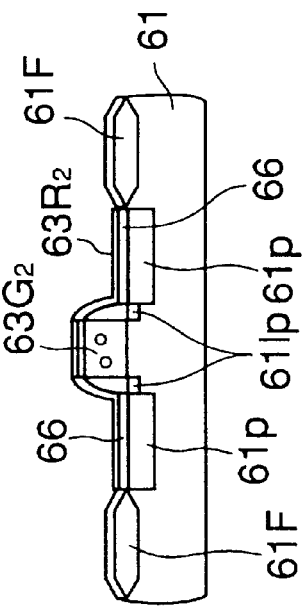
Figure 44B:
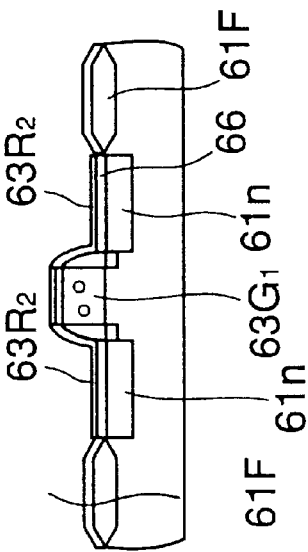

In the present embodiment, it should be noted that that sidewall insulation film 63W of the amorphous silicon layer 63 remains on the substrate 61 as a result of the patterning of the amorphous silicon layer 63, such that the sidewall insulation film 63W encloses the active region, as shown in FIG. 43D and FIG. 44A.

In the event it is not desirable to have such a sidewall insulation film 63W as residue, the word line electrode 63 may be formed as a unitary body to the sidewall insulation film 63W while using the outermost word line electrode 63L as a dummy electrode as shown it in FIG. 44 (D).

Furthermore, the process of FIGS. 45A–45C and FIGS. 46A–46C are referred to.

In this process, B$^+$ ions are injected into the structure explained previously with reference to FIGS. 43A–43D and FIGS. 44A–44C by conducting an ion implantation process with a dose of $3\times10^{12}$–$1\times10^{13}$ cm$^{-2}$ under an accelerating voltage of 80 keV. As a result, a channel-stop diffusion region 61d is formed between a pair of adjacent bit-line diffusion regions 61D as shown in FIG. 45C.

Figure 46A:
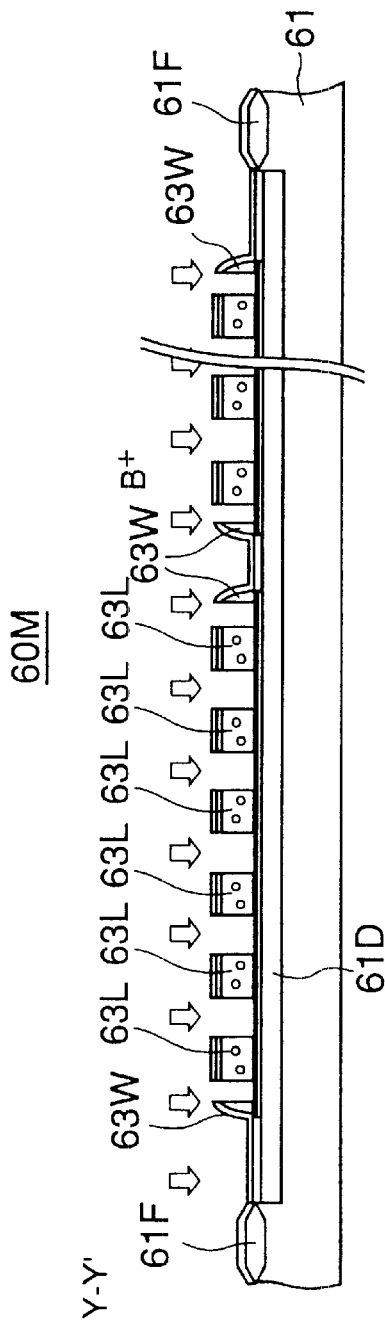
FIGS. 46A–46C are diagrams showing a sixteenth fabrication step of the non-volatile semiconductor memory of the second embodiment of this invention.
Figure 46C:
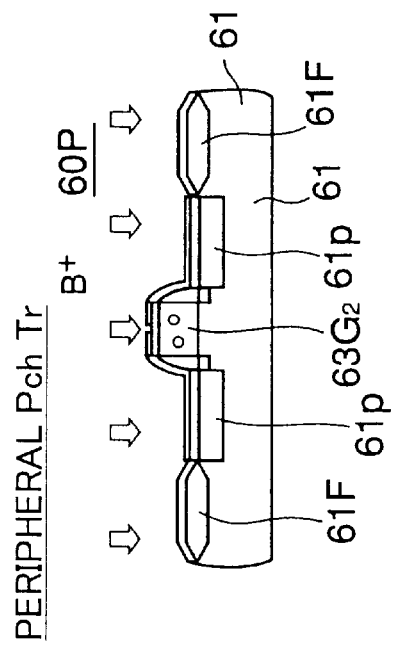
Figure 46B:
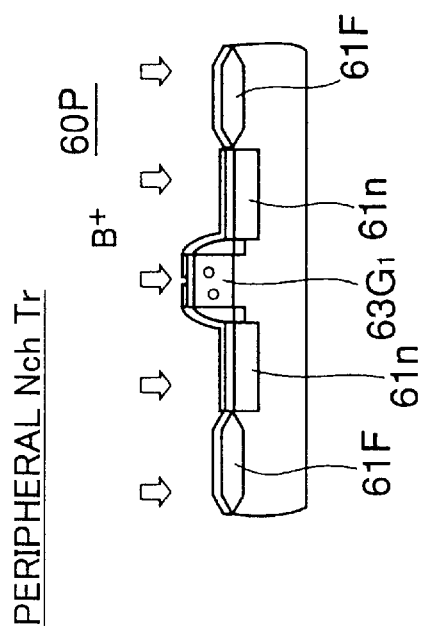
Figure 48A:
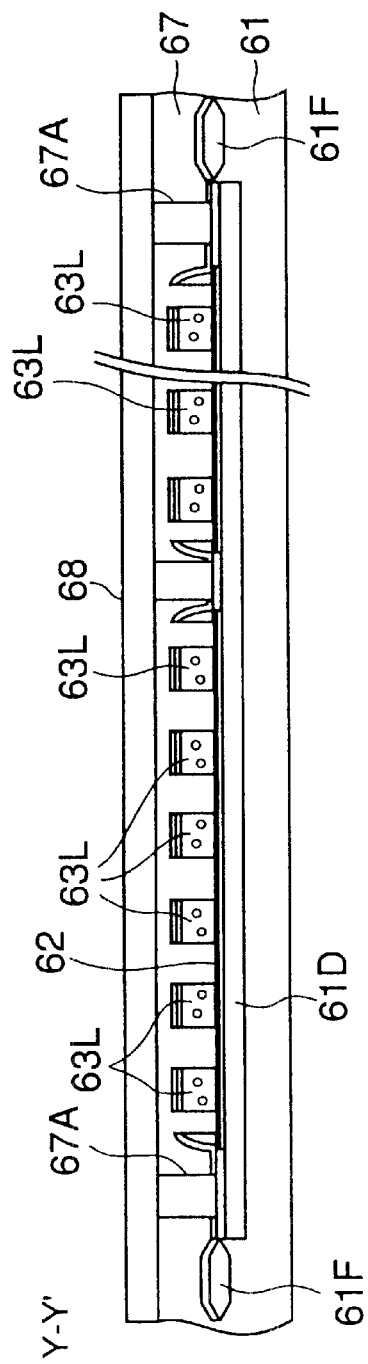
FIGS. 48A–48C are diagrams showing an eighteenth fabrication step of the non-volatile semiconductor memory of the second embodiment of this invention.
Figure 48C:
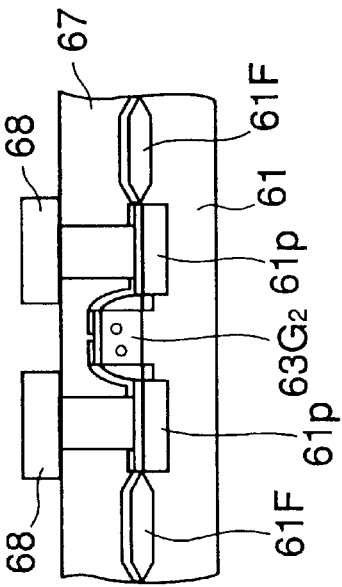
Figure 48B:
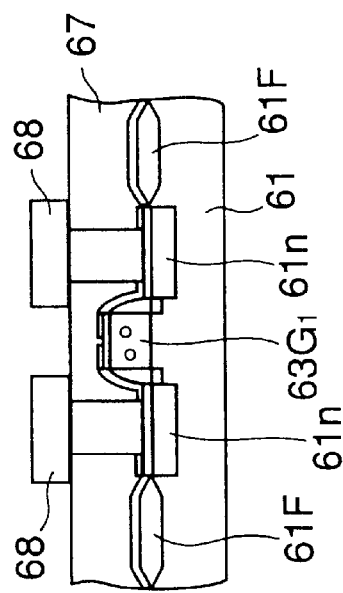

In this embodiment, it should be noted that the ion implantation of B$^+$ is conducted also in the peripheral circuit region 60P as shown in FIGS. 46B and 46C. Because very small dose of B$^+$, no substantial problem arises even when the ion implantation is conducted into such the peripheral circuit region 60P. Such a channel stop diffusion region 61d is formed also in the bit-line diffusion region 61D and also in the vicinity of the diffusion regions 61n and 61p. Because of the very small concentration level of B in these regions, smaller by the factor of 102, illustration thereof will be omitted.

Finally, the process of FIGS. 47A–47D and FIGS. 48A–48C are referred to.

In this process, an interlayer insulation film 67 is deposited on the structure explained already with reference to FIGS. 45A–45C and FIGS. 46A–46C. Furthermore, a contact hole 67A is formed in the interlayer insulation film in correspondence to the bit-line diffusion region 61D. Further, a contact hole 67B is formed in correspondence to the edge part of the word line electrode 63L. Furthermore, a contact hole 67C is formed in correspondence to the diffusion region 661n in the peripheral circuit region 60P. See FIGS. 48B and 48C. Further, a contact hole 67D is formed in correspondence to the diffusion region 61p. In such contact holes, it should be noted that the CoSi film 66 that covers the contact region is exposed.

Furthermore, in this embodiment, a dry etching process is applied to the CoSi film 66 thus exposed for native oxide removal. After this, a metal film is deposited on the interlayer insulation film 67 so as to fill the contact holes 67A–67D. By patterning the metal film thus formed, wiring patterns 68A–68D are formed respectively in correspondence to the bit-line diffusion regions 61D, the edge part of word line electrode 63, the diffusion region 61n of the n-channel peripheral transistor, and the diffusion region 61p of the p-channel MOS transistor.

In the non-volatile semiconductor memory 60 of this embodiment, too, the Si surface is covered with the silicide film 66 at the contact hole region in any of the memory cell region 60M and the peripheral circuit region 60P, similarly to the embodiment explained previously. Thus, the Si surface is not etched or attacked even when the native oxide removal process is applied by a dry etching process. Further, the contact resistance is decreased as a result of formation of the low-resistance silicide film 66 on the surface of the contact region, and the operational speed of the non-volatile semiconductor device is improved. Further, the need of providing a mask as in the example of FIGS. 13A–13D at the occasion of formation of the silicide film 66 is eliminated. Associated therewith, the problem of mask alignment error does not result, and it becomes possible to increase the integration density of the non-volatile semiconductor memory device.

Furthermore, it is also possible to replace the field insulation film 41F or 61F by an STI device isolation structure. Further, it is possible to use a metal electrode for the word line electrode 43 or 63L.

Further, the present invention is not limited to the embodiments described heretofore, but various variations and modifications may be made without departing from the scope of the invention.

What is claimed is:

1. A non-volatile semiconductor device, comprising:
   a semiconductor substrate carrying an active region defined by a device isolation structure thereon;
   a plurality of diffusion regions formed in said active region with a separation from each other, each of said plurality of diffusion regions extending in a first direction;
   a word line electrode extending over said active region in a second direction crossing said first direction; and
   a charge storable insulation film formed on said active region in correspondence to said word line electrode between a surface of said active region and said word line electrode, said charge storable insulation film having a stacked structure in which a nitride film and an oxide film are stacked consecutively on an oxide film,
   said device isolation structure having a plurality of openings each exposing said surface of said substrate in correspondence to an extension part of said plurality of diffusion regions,
   each of said plurality of diffusion regions having said extension part extending into corresponding one of said plurality of openings;
   each of said plurality of diffusion regions carrying a silicide film on a surface thereof.

2. A non-volatile semiconductor memory device as claimed in claim 1, further comprising a peripheral circuit region including another diffusion region and a gate electrode on said semiconductor substrate, said silicide film being formed on a surface of said another diffusion region and on said gate electrode.

3. A non-volatile semiconductor memory device as claimed in claim 1, wherein said charge storable insulation film covers said active layer entirely and continuously.

4. A non-volatile semiconductor memory device as claimed in claim 1, wherein an insulation film is provided in said active region so as to cover a top surface and sidewall surface of said word line electrode and an exposed part of said substrate surface continuously.

5. A non-volatile semiconductor memory device as claimed in claim 4, wherein said insulation film covers said word line electrode in conformity with a shape thereof with a generally uniform thickness.

6. A non-volatile semiconductor memory device as claimed in claim 4, wherein said insulation film coverers said active region entirely and continuously, and wherein an interlayer insulation film covers said insulation film.

7. A non-volatile semiconductor memory device as claimed in claim 6, wherein said word line electrode is provided with a silicide film in an extension part extending outward from said active region, and wherein said interlayer insulation film is formed with another contact hole exposing said extension part of said word line at a location outside said active region.

8. A non-volatile semiconductor memory device as claimed in claim 1, wherein said word line electrode carries thereon a silicide film over an entire length thereof.

9. A non-volatile semiconductor memory device as claimed in claim 8, wherein said extension part of said word line electrode extending outside said active region has a sidewall formed with a sidewall insulation film, said sidewall insulation film constituting a part of an insulation wall extending so as to surround said active region, said insulation wall having a cross-sectional shape towering from said substrate in a direction generally perpendicular to a surface of said substrate.

10. A non-volatile semiconductor memory device as claimed in claim 1, wherein said word line electrode is formed of a conductive semiconductor material.

11. A non-volatile semiconductor memory device as claimed in claim 1, further comprising an interlayer insulation film provided on said semiconductor substrate so as to cover said word line electrode, said interlayer insulation film having a contact hole corresponding to said opening, an interconnection pattern being formed further on said interlayer insulation film so as to make a contact with said diffusion region at said opening.

* * * * *